United States Patent [19]
Oberman et al.

[11] Patent Number: 6,085,208
[45] Date of Patent: Jul. 4, 2000

[54] LEADING ONE PREDICTION UNIT FOR NORMALIZING CLOSE PATH SUBTRACTION RESULTS WITHIN A FLOATING POINT ARITHMETIC UNIT

[75] Inventors: Stuart F. Oberman, Sunnyvale; Mark Roberts, San Jose, both of Calif.

[73] Assignee: Advanced Micro Devices, Inc., Sunnyvale, Calif.

[21] Appl. No.: 09/049,758

[22] Filed: Mar. 27, 1998

[51] Int. Cl.[7] .................................................. G06F 5/00
[52] U.S. Cl. .......................................... 708/205; 708/211
[58] Field of Search .................................... 708/205, 211

[56] References Cited

U.S. PATENT DOCUMENTS

| | | | |
|---|---|---|---|
| 4,922,446 | 5/1990 | Zurawski et al. | 708/205 |
| 5,369,607 | 11/1994 | Okamoto | 708/505 |
| 5,867,407 | 2/1999 | Wolrich et al. | 708/205 |
| 5,920,493 | 7/1999 | Lau | 708/205 |
| 5,957,997 | 9/1999 | Olson et al. | 708/205 |

OTHER PUBLICATIONS

E. Hokenek and R. K. Montoye, "Leading–zero anticipator in the IBM RS/6000 floating–point execution unit," IBM Journal of Research and Development, vol. 34, No. 1, pp. 71–77, Jan. 1990.

N. T. Quach and M. J. Flynn, "Leading one prediction—Implementation, generalization, and application," Technical Report No. CSL–TR–91–463, Computer Systems Laboratory, Stanford University, Mar. 1991.

*Primary Examiner*—David H. Malzahn
*Attorney, Agent, or Firm*—Conley, Rose & Tayon, PC; B. Noel Kivlin; Dan R. Christen

[57] ABSTRACT

An optimized multimedia execution unit configured to perform vectored floating point and integer instructions. In one embodiment, the execution unit includes an add/subtract pipeline having far and close data paths. The far data path is configured to handle effective addition operations, as well as effective subtraction operations for operands having an absolute exponent difference greater than one. The close data path, conversely, is configured to handle effective subtraction operations for operands having an absolute exponent difference less than or equal to one. The execution unit may also include a plurality of add/subtract pipelines, allowing vectored add, subtract, and integer/floating point conversion instructions to be performed. The execution unit may also be expanded to handle additional arithmetic instructions (such as reverse subtract and accumulate functions) by appropriate input multiplexing. The execution unit may also be configured with a leading one prediction unit that is configured to predict the position of a leading one value for certain results in order to improve normalization times.

41 Claims, 50 Drawing Sheets

Fig. 10F

```
550F        L | GS₁     performed in      L | GS₁
    1.11001 |           hardware as    1.11001 |           ←— 332A
   -0.00111 | 00        ========>     +1.11000 | 00        ←— 332B
    1.10010 | 00                       1.10001 | GS₁=00
                                          ↑
                                       342A
```

Fig. 10G

```
550G        L | GRS     performed in      L | GRS
    1.00010 | 000       hardware as    1.00010 | 000       ←— 332A
   -0.00111 | 110       ========>     +1.11000 | 110       ←— 332B
    0.11010 | 010                      0.11010 | GRS=110,
                                          ↑      (effectively
                                       342A      GRS=010)
```

Fig. 10H

```
550H        L | GRS     performed in      L | GRS
    1.00010 | 000       hardware as    1.00010 |           ←— 332A
   -0.00111 | 001       ========>     +1.11000 |           ←— 332B
    0.11010 | 111                      0.11010 | GRS=001,
                                          ↑      (effectively
                                       342A      GRS=111)
```

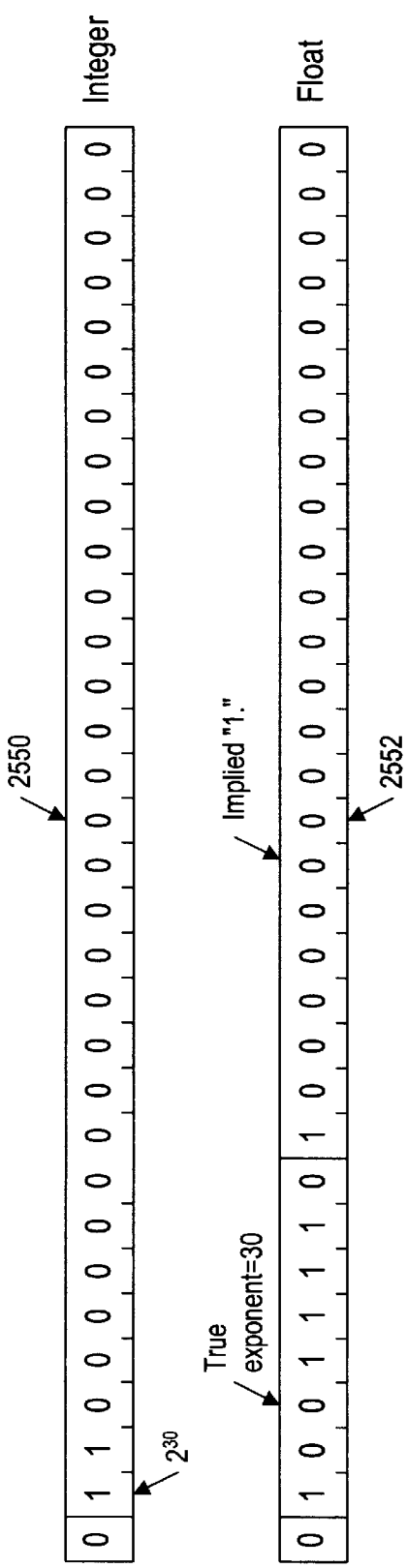
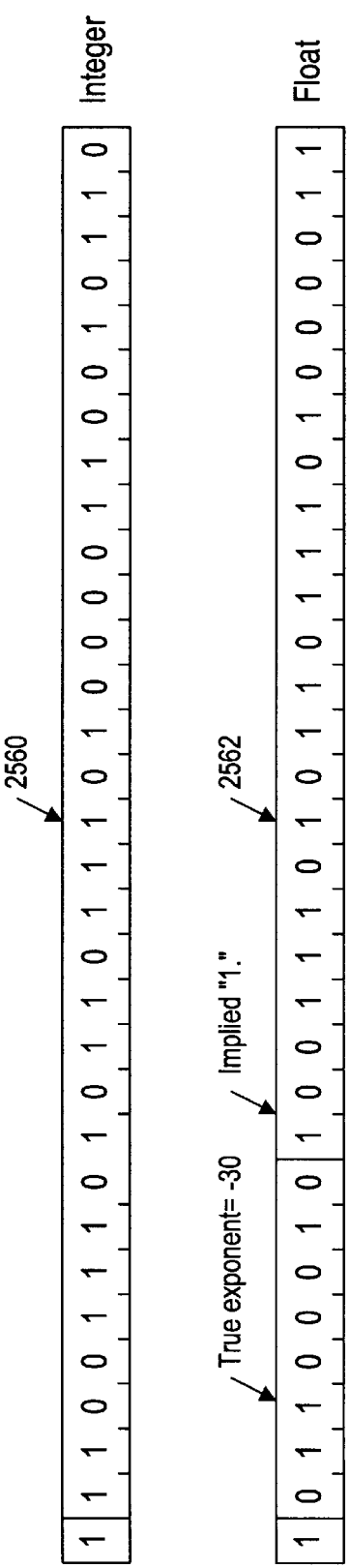
Fig. 31A
Fig. 31B

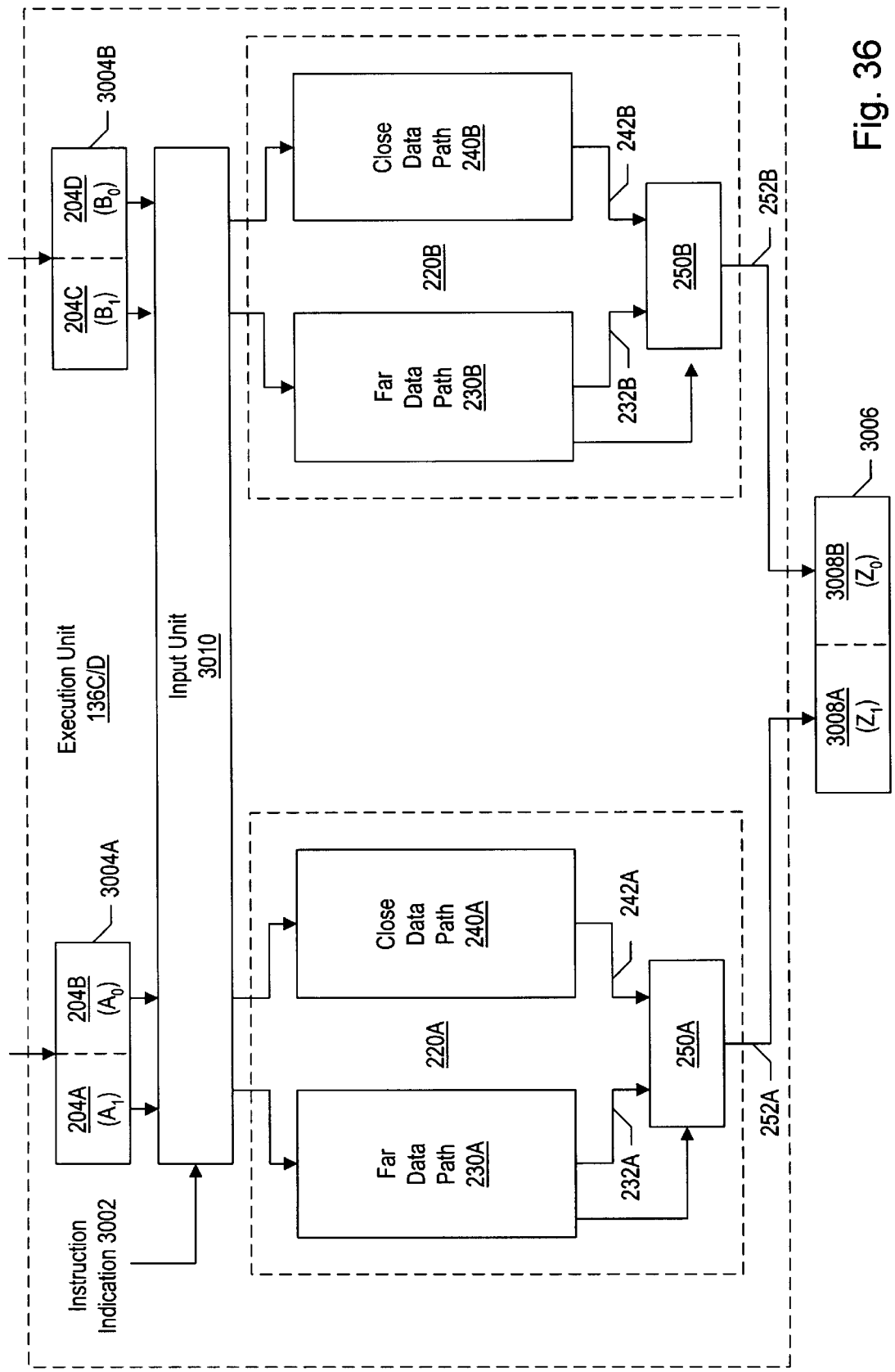

PFADD

| mnemonic | opcode/imm8 | description |
---
| PFADD mmreg1,mmreg2/mem64 | 0Fh 0Fh / 9Eh | Packed floating-point addition |

3100

3102A  3102B  3101

Fig. 37A mmreg1[31:0] = mmreg1[31:0] + mmreg2/mem64[31:0]
mmreg1[63:32] = mmreg1[63:32] + mmreg2/mem64[63:32]

PFSUB

| mnemonic | opcode/imm8 | description |
|---|---|---|
| PFSUB mmreg1,mmreg2/mem64 | 0Fh 0Fh / 9Ah | Packed floating-point subtraction |

3110 (table), 3112A (mmreg1), 3112B (mmreg2/mem64), 3111 (opcode)

Fig. 38A

```
mmreg1[31:0] = mmreg1[31:0] - mmreg2/mem64[31:0]
mmreg1[63:32] = mmreg1[63:32] - mmreg2/mem64[63:32]
```
3114

```
                              3120
mnemonic                  opcode/imm8   description
PF2ID mmreg1,mmreg2/mem64  0Fh 0Fh / 1Dh  Converts packed floating-point to
                                          packed 32-bit integer
  3122A    3122B                3121
```

Fig. 39A

```
IF (mmreg2/mem64[31:0] >=2³¹)
      THEN mmreg1[31:0] =7FFF_FFFFh
ELSEIF (mmreg2/mem64[31:0] <=-2³¹)
      THEN mmreg1[31:0] = 8000_0000h
ELSE mmreg1[31:0] = int(mmreg2/mem64[31:0])
IF (mmreg2/mem64[63:32] >=2³¹)
      THEN mmreg1[63:32] = 7FFF_FFFFh
ELSEIF (mmreg2/mem64[63:32] <=-2³¹)
      THEN mmreg1[63:32] = 8000_0000h
ELSE mmreg1[63:32] = int(mmreg2/mem64[63:32])
```
                                                    3124

Fig. 39B

| PF2ID | | |
|---|---|---|
| Source 1 & Destination | 0 | 0 |
| | Normal, abs(Source 1) <1 | 0 |
| | Normal, -4294967297 < Source 1 <=-1 | round to zero (Source 1) |
| | Normal, 1 <= Source 1< 4294967296 | round to zero (Source 1) |
| | Normal, Source 1 >= 4294967296 | 7FFF_FFFFh |
| | Normal, Source 1 <= -4294967297 | 8000_0000h |
| | Unsupported | Undefined |

| mnemonic | opcode/imm8 | description |
|---|---|---|
| PF2IW mmreg1,mmreg2/mem64 | 0Fh 0Fh / 1Ch | Converts packed floating-point to packed 16-bit integer |

```
IF (mmreg2/mem64[31:0] >=2^15)
    THEN mmreg1[15:0] =7FFFh
ELSEIF (mmreg2/mem64[31:0] <=-2^15)
    THEN mmreg1[15:0] = 8000h
ELSE mmreg1[15:0] = int(mmreg2/mem64[31:0])
IF (mmreg2/mem64[63:32] >=2^15)
    THEN mmreg1[47:32] = 7FFFh
ELSEIF (mmreg2/mem64[63:32] <=-2^15)
    THEN mmreg1[47:32] = 8000h
ELSE mmreg1[47:32] = int(mmreg2/mem64[63:32])
```

| PF2IW | | |
|---|---|---|
| Source 1 & Destination | 0 | 0 |
| | Normal, abs(Source 1) <1 | 0 |
| | Normal, -65537 < Source 1 <=-1 | round to zero (Source 1) |
| | Normal, 1 <= Source 1< 65536 | round to zero (Source 1) |
| | Normal, Source 1 >= 65536 | 0x7FFFh |
| | Normal, Source 1 <= -65537 | 0x8000h |
| | Unsupported | Undefined |

| mnemonic | opcode/imm8 | description |
|---|---|---|
| PI2FD mmreg1,mmreg2/mem64 | 0Fh 0Fh / 0Dh | Packed 32-bit integer to floating-point conversion |

```
mmreg1[31:0] = float(mmreg2/mem64[31:0]
mmreg1[63:32] = float(mmreg2/mem64[63:32])
```

| mnemonic | opcode/imm8 | description |
|---|---|---|
| PI2FW mmreg1,mmreg2/mem64 | 0Fh 0Fh / 0Ch | Packed 16-bit integer to floating-point conversion |

```
mmreg1[31:0] = float(mmreg2/mem64[15:0]
mmreg1[63:32] = float(mmreg2/mem64[47:32])
```

PFACC

| mnemonic | opcode/imm8 | description |
|---|---|---|
| PFACC mmreg1,mmreg2/mem64 | 0Fh 0Fh / AEh | Floating-point accumulate |

```
mmreg1[31:0] = mmreg1[31:0] + mmreg1[63:32]
mmreg1[63:32] = mmreg2/mem64[31:0] + mmreg2/mem64[63:32]
```

PFSUBR /3170

| mnemonic | opcode/imm8 | description |
|---|---|---|
| PFSUBR mmreg1,mmreg2/mem64 | 0Fh 0Fh / AAh | Packed floating-point reverse subtraction |

```
mmreg1[31:0] = mmreg2/mem64[31:0] - mmreg1[31:0]
mmreg1[63:32] = mmreg2/mem64[63:32] - mmreg1[63:32]
```
3174

Fig. 44B

PFMAX

| mnemonic | opcode/imm8 | description |
|---|---|---|
| PFMAX mmreg1,mmreg2/mem64 | 0Fh 0Fh / A4h | Packed floating-point maximum |

```
IF (mmreg1[31:0] > mmreg2/mem64[31:0])
    THEN mmreg1[31:0] = mmreg1[31:0]
ELSE mmreg1[31:0] = mmreg2/mem64[31:0]
IF (mmreg1[63:32] > mmreg2/mem64[63:32])
    THEN mmreg1[63:32] = mmreg1[63:32]
ELSE mmreg1[63:32] = mmreg2/mem64[63:32]
```

| PFMAX | Source 2 | | | |
|---|---|---|---|---|
| Source 1 & Destination | | 0 | Normal | Unsupported |
| | 0 | +0 | Source 2, +0 * | Undefined |
| | Normal | Source 1, +0** | Source 1/Source 2 *** | Undefined |
| | Unsupported | Undefined | Undefined | Undefined |

Notes:
* The result is source 2 if source 2 is positive otherwise the result is positive zero.
** The result is source 1 if source 1 is positive otherwise the result is positive zero.
*** The result is source 1 if source 1 is positive and source 2 is negative. The result is source 1 if both are positive and source 1 is greater in magnitude than source 2. The result is source 1 if both are negative and source 1 is lesser in magnitude than source 2. The result is source 2 in all other cases.

PFMIN

| mnemonic | opcode/imm8 | description |
|---|---|---|
| PFMIN mmreg1,mmreg2/mem64 | 0Fh 0Fh / 94h | Packed floating-point maximum |

```
IF (mmreg1[31:0] < mmreg2/mem64[31:0])
      THEN mmreg1[31:0] = mmreg1[31:0]
ELSE mmreg1[31:0] = mmreg2/mem64[31:0]
IF (mmreg1[63:32] < mmreg2/mem64[63:32])
      THEN mmreg1[63:32] = mmreg1[63:32]
ELSE mmreg1[63:32] = mmreg2/mem64[63:32]
```

| PFMIN | | Source 2 | | | |
|---|---|---|---|---|---|
| | | 0 | +0 | Normal | Unsupported |
| Source 1 & Destination | 0 | 0 | +0 | Source 2, +0 * | Undefined |
| | Normal | Source 1, +0** | Source 1/Source 2 *** | | Undefined |
| | Unsupported | Undefined | Undefined | Undefined | |

Notes:
\* The result is source 2 if source 2 is negative otherwise the result is positive zero.
\*\* The result is source 1 if source 1 is negative otherwise the result is positive zero.
\*\*\* The result is source 1 if source 1 is negative and source 2 is positive. The result is source 1 if both are negative and source 1 is greater in magnitude than source 2. The result is source 1 if both are positive and source 1 is lesser in magnitude than source 2. The result is source 2 in all other cases.

PFCMPEQ

| mnemonic | opcode/imm8 | description |
|---|---|---|
| PFCMPEQ mmreg1,mmreg2/mem64 | 0Fh 0Fh / B0h | Packed floating-point comparison, equal |

3200 → (arrow to mnemonic area)
3202A → mmreg1, 3202B → mmreg2/mem64
3201 → opcode

Fig. 47A

```
IF (mmreg1[31:0] = mmreg2/mem64[31:0])
     THEN mmreg1[31:0] = FFFF_FFFFh
ELSE mmreg1[31:0] = 0000_0000h
IF (mmreg1[63:32] = mmreg2/mem64[63:32])
     THEN mmreg1[63:32] = FFFF_FFFFh
ELSE mmreg1[63:32] = 0000_0000h
```

| PFCMPEQ | Source 2 | | |
|---|---|---|---|
| Source 1 & Destination | 0 | Normal | Unsupported |
| 0 | FFFF_FFFFh* | 0000_0000h | 0000_0000h |
| Normal | 0000_0000h | 0000_0000h, FFFF_FFFFh** | 0000_0000h |
| Unsupported | 0000_0000h | 0000_0000h | Undefined |

Notes:
* Positive zero is equal to negative zero.
** The result is FFFF_FFFFh if source 1 and source 2 have identical signs, exponents, and mantissas. It is 0000_0000h otherwise.

PFCMPGT

| mnemonic | opcode/imm8 | description |
|---|---|---|
| PFCMPGT mmreg1,mmreg2/mem64 | 0Fh 0Fh / A0h | Packed floating-point comparison, greater |

```
IF (mmreg1[31:0] > mmreg2/mem64[31:0])
    THEN mmreg1[31:0] = FFFF_FFFFh
ELSE mmreg1[31:0] = 0000_0000h
IF (mmreg1[63:32] > mmreg2/mem64[63:32])
    THEN mmreg1[63:32] = FFFF_FFFFh
ELSE mmreg1[63:32] = 0000_0000h
```

| PFCMPGT | | Source 2 | | |
|---|---|---|---|---|
| | | 0 | Normal | Unsupported |
| Source 1 & Destination | 0 | 0000_0000h | 0000_0000h, FFFF_FFFFh ** | Undefined |
| | Normal | 0000_0000h, FFFF_FFFF ** | 0000_0000h, FFFF_FFFFh *** | Undefined |
| | Unsupported | Undefined | Undefined | Undefined |

Notes:
* The result is FFFF_FFFFh if source 2 is negative, otherwise the result is 0000_0000h.
** The result is FFFF_FFFFh if source 1 is positive, otherwise the result is 0000_0000h.
*** The result is FFFF_FFFFh if source 1 is positive and source 2 is negative, or if they are both negative and source 1 is smaller in magnitude than source 2, or if source 1 and source 2 are positive and source 1 is greater in magnitude than source 2. The result is 0000_0000h in all other cases.

PFCMPGE

| mnemonic | opcode/imm8 | description |
|---|---|---|
| PCMPGE mmreg1,mmreg2/mem64 | 0Fh 0Fh / 90h | Packed floating-point comparison, greater or equal |

Fig. 49A

```
IF (mmreg1[31:0] >= mmreg2/mem64[31:0])
        THEN mmreg1[31:0] = FFFF_FFFFh
ELSE mmreg1[31:0] = 0000_0000h
IF (mmreg1[63:32] >= mmreg2/mem64[63:32])
        THEN mmreg1[63:32] = FFFF_FFFFh
ELSE mmreg1[63:32] = 0000_0000h
```

Fig. 49B

| PFCMPGE | Source 2 | | | |
|---|---|---|---|---|
| | | 0 | Normal | Unsupported |
| Source 1 & Destination | 0 | FFFF_FFFFh* | 0000_0000h, FFFF_FFFFh ** | Undefined |
| | Normal | 0000_0000h, FFFF_FFFF *** | 0000_0000h, FFFF_FFFFh **** | Undefined |
| | Unsupported | Undefined | Undefined | Undefined |

Notes:
* Positive zero is equal to negative zero.
** The result is FFFF_FFFFh if source 2 is negative, otherwise the result is 0000_0000h.
*** The result is FFFF_FFFFh if source 1 is positive, otherwise the result is 0000_0000h.
**** The result is FFFF_FFFFh if source 1 is positive and source 2 is negative, or if they are both negative and source 1 is smaller or equal in magnitude than source 2, or if source 1 and source 2 are both positive and source 1 is greater or equal in magnitude than source 2. The result is 0000_0000h in all other cases.

Fig. 49C

LEADING ONE PREDICTION UNIT FOR NORMALIZING CLOSE PATH SUBTRACTION RESULTS WITHIN A FLOATING POINT ARITHMETIC UNIT

BACKGROUND OF THE INVENTION

1. Field of the Invention

This invention relates to floating point arithmetic within microprocessors, and more particularly to an add/subtract pipeline within a floating point arithmetic unit.

2. Description of the Related Art

Numbers may be represented within computer systems in a variety of ways. In an integer format, for example, a 32-bit register may store numbers ranging from 0 to $2^{32}-1$. (The same size register may also store signal numbers by giving up one order of magnitude in range). This format is limiting, however, since it is incapable of representing numbers which are not integers (the binary point in integer format may be thought of as being to the right of the least significant bit in the register).

To accommodate non-integer numbers, a fixed point representation may be used. In this form of representation, the binary point is considered to be somewhere other than to the right of the least significant bit. For example, a 32-bit register may be used to store values from 0 (inclusive) to 2 (exclusive) by processing register values as though the binary point is located to the right of the most significant register bit. Such a representation allows (in this example) 31 register bits to represent fractional values. In another embodiment, one bit may be used as a sign bit so that a register can store values between −2 and +2.

Because the binary point is fixed within a register or storage location during fixed point arithmetic operations, numbers with differing orders of magnitude may not be represented with equal precision without scaling. For example, it is not possible to represent both 1101b (13 in decimal) and 0.1101 (0.8125 in decimal) using the same fixed point representation. While fixed point representation schemes are still quite useful, many applications require a larger dynamic range (the ratio of the largest number representation to the smallest, non-zero, number representation in a given format).

In order to solve this problem of dynamic range, floating point representation and arithmetic is widely used. Generally speaking, floating point numeric representations include three parts: a sign bit, an unsigned fractional number, and an exponent value. The most widespread floating point format in use today, IEEE standard 754 (single precision), is depicted in FIG. 1.

Turning now to FIG. 1, floating point format 2 is shown. Format 2 includes a sign bit 4 (denoted as S), an exponent portion 6 (E), and a mantissa portion 8 (F). Floating point values represented in this format have a value V, where V is given by:

$$V=(-1)^S \cdot 2^{E-bias} \cdot (1.F). \qquad (1)$$

Sign bit S represents the sign of the entire number, while mantissa portion F is a 23-bit number with an implied leading 1 bit (values with a leading one bit are said to be "normalized"). In other embodiments, the leading one bit may be explicit. Exponent portion E is an 8-bit value which represents the true exponent of the number V offset by a predetermined bias. A bias is used so that both positive and negative true exponents of floating point numbers may be easily compared. The number 127 is used as the bias in IEEE standard 754. Format 2 may thus accommodate numbers having exponents from 127 to +128. Floating point format 2 advantageously allows 24 bits of representation within each of these orders of magnitude.

Floating point addition is an extremely common operation in numericallyintensive applications. (Floating point subtraction is accomplished by inverting one of the inputs and performing addition). Although floating point addition is related to fixed point addition, two differences cause complications. First, an exponent value of the result must be determined from the input operands. Secondly, rounding must be performed. The IEEE standard specifies that the result of an operation should be the same as if the result were computed exactly, and then rounded (to a predetermined number of digits) using the current rounding mode. IEEE standard 754 specifies four rounding modes: round to nearest, round to zero, round to +∞, and round to −∞. The default mode, round to nearest, chooses the even number in the event of a tie.

Turning now to FIG. 2, a prior art floating point addition pipeline 10 is depicted. All steps in pipeline 10 are not performed for all possible additions. (That is, some steps are optional for various cases of inputs). The stages of pipeline 10 are described below with reference to input values A and B. Input value A has a sign bit $A_S$, an exponent value $A_E$, and a mantissa value $A_F$. Input value B, similarly, has a sign bit $B_S$, exponent value $B_E$, and mantissa value $B_F$.

Pipeline 10 first includes a stage 12, in which an exponent difference $E_{diff}$ is calculated between $A_E$ and $B_E$. In one embodiment, if $E_{diff}$ is calculated to be negative, operands A and B are swapped such that A is now the larger operand. In the embodiment shown in FIG. 2, the operands are swapped such that $E_{diff}$ is always positive.

In stage 14, operands A and B are aligned. This is accomplished by shifting operand B $E_{diff}$ bits to the right. In this manner, the mantissa portions of both operands are scaled to the same order of magnitude. If $A_E=B_E$, no shifting is performed; consequently, no rounding is needed. If $E_{diff}>0$, however, information must be maintained with respect to the bits which are shifted rightward (and are thus no longer representable within the predetermined number of bits). In order to perform IEEE rounding, information is maintained relative to 3 bits: the guard bit (G), the round bit (R), and the sticky bit (S). The guard bit is one bit less significant than the least significant bit (L) of the shifted value, while the round bit is one bit less significant the guard bit. The sticky bit is the logical-OR of all bits less significant than R. For certain cases of addition, only the G and S bits are needed.

In stage 16, the shifted version of operand B is inverted, if needed, to perform subtraction. In some embodiments, the signs of the input operands and the desired operation (either add or subtract) are examined in order to determine whether effective addition or effective subtraction is occurring. In one embodiment, effective addition is given by the equation:

$$EA=A_S \oplus B_S \oplus op, \qquad (2)$$

where op is 0 for addition and 1 for subtraction. For example, the operation A minus B, where B is negative, is equivalent to A plus B (ignoring the sign bit of B). Therefore, effective addition is performed. The inversion in stage 16 may be either of the one's complement or two's complement variety.

In stage 18, the addition of operand A and operand B is performed. As described above, operand B may be shifted and may be inverted as needed. Next, in stage 20, the result of stage 18 may be recomplemented, meaning that the value is returned to sign-magnitude form (as opposed to one's or two's complement form).

Subsequently, in stage 22, the result of stage 20 is normnalized. This includes left-shifting the result of stage 20 until the most significant bit is a 1. The bits which are shifted in are calculated according to the values of G, R, and S. In stage 24, the normalized value is rounded according to nearest rounding mode. If S includes the R bit OR'in, round to nearest (even) is given by the equation:

$$RTN = G(L+S). \quad (3)$$

If the rounding performed in stage 24 produces an overflow, the result is post-normalized (right-shifted) in stage 26.

As can be seen from the description of pipeline 10, floating point addition is quite complicated. This operation is quite time-consuming, also, if performed as shown in FIG. 2: stage 14 (alignment) requires a shift, stage 18 requires a full add, stage 20 (recomplementation) requires a fuill add, stage 22 requires a shift, and stage 24 (rounding) requires a full add. Consequently, performing floating point addition using pipeline 10 would cause add/subtract operations to have a similar latency to floating point multiplication. Because of the frequency of floating point addition, higher performance is typically desired. Accordingly, most actual floating point add pipeline include optimizations to pipeline 10.

Turning now to FIG. 3, a prior art floating point pipeline 30 is depicted which is optimized with respect to pipeline 10. Broadly speaking, pipeline 30 includes two paths which operate concurrently, far path 31A and close path 31B. Far path 31A is configured to perform all effective additions. Far path 31A is additionally configured to perform effective subtractions for which $E_{diff}>1$. Close path 31B, conversely is configured to perform effective subtractions for which $E_{diff}<1$. As with FIG. 2, the operation of pipeline 30 is described with respect to input values A and B.

Pipeline 30 first includes stage 32, in which operands A and B are received. The operands are conveyed to both far path 31A and close path 31B. Results are then computed for both paths, with the final result selected in accordance with the actual exponent difference. The operation of far path 31A is described first.

In stage 34 of far path 31A, exponent difference $E_{diff}$ is computed for operands A and B. In one embodiment, the operands are swapped if $A_E>B_E$. If $E_{diff}$ is computed to be 0 or 1, execution in far path 31A is cancelled, since this case is handled by close path 31B as will be described below. Next, in stage 36, the input values are aligned by right shifting operand B as needed. In stage 38, operand B is conditionally inverted in the case of effective subtraction (operand B is not inverted in the case of effective addition). Subsequently, in stage 40, the actual addition is performed. Because of the restrictions placed on far path ($E_{diff}>1$), the result of stage 40 is always positive. Thus, no recomplementation step is needed. The result of stage 40 is instead rounded and postnormalized in stages 42 and 44, respectively. The result of far path 31A is then conveyed to stage 58.

In stage 46 of close path 31B, exponent difference $E_{diff}$ is calculated in stage 46. If $E_{diff}$ is computed to less than equal to 1, execution continues in close path 31B with stage 48. In one embodiment, operands A and B are swapped (as in one embodiment of far path 31A) so that $A_E>B_E$. In stage 48, operand B is inverted to set up the subtraction which is performed in stage 50. In one embodiment, the smaller operand is also shifted by at most one bit. Since the possible shift amount is low, however, this operation may be accomplished with greatly reduced hardware.

The output of stage 50 is then recomplemented if needed in stage 52, and then normalized in stage 54. This result is rounded in stage 56, with the rounded result conveyed to stage 58. In stage 58, either the far path or close path result is selected according to the value of $E_{diff}$.

It is noted that in close path 31B, stage 52 (recomplementation) and stage 56 (rounding) are mutually exclusive. A negative result may only be obtained in close path 31B in the case where $A_E=B_E$ and $A_F<B_F$. In such a case, however, no bits of precision are lost, and hence no rounding is performed. Conversely, when shifting occurs (giving rise to the possibility of rounding), the result of stage 50 is always positive, eliminating the need for recomplementation in stage 52.

The configuration of pipeline 30 allows each path 31 to exclude unneeded hardware. For example, far path 31A does not require an additional adder for recomplementation as described above. Close path 31B eliminates the need for a full shift operation before stage 50, and also reduces the number of add operations required (due to the exclusivity of rounding and recomplementation described above).

Pipeline 30 offers improved performance over pipeline 10. Because of the frequency of floating point add/subtract operations, however, a floating point addition pipeline is desired which exhibits improved performance over pipeline 30. Improved performance is particularly desired with respect to close path 31B.

SUMMARY OF THE INVENTION

The problems outlined above are in large part solved by an execution unit in accordance with the present invention. In one embodiment, an execution unit is provided which is usable to perform effective addition or subtraction upon a given pair of floating point input values. The execution unit includes an add/subtract pipeline having a far data path and a close data path each coupled to receive the given pair of floating point input values. The far data path is configured to perform effective addition as well as effective subtraction upon operands having an absolute exponent difference greater than one. The close data path, on the other hand, is configured to perform effective subtraction upon operands having an absolute exponent difference less than or equal to one. The add/subtract pipeline further includes a result multiplexer unit coupled to receive a result from both the far data path and the close data path. A final output of the result multiplexer unit is selected from the far path result and the close path result according to the actual calculated absolute exponent difference value.

In one embodiment, the far data path includes a pair of right shift units coupled to receive mantissa portions of each of the given pair of floating point input values. The right shift units each receive a shift amount from a corresponding exponent difference unit. The first right shift unit conveys a shift amount equal to the second exponent value minus the first exponent value, while the second right shift unit conveys a shift amount equal to the first exponent value minus the second exponent value. The outputs of the right shift units are then conveyed to a multiplexer-inverter unit, which also receives unshifted versions of the mantissa portions of each of the given pair of floating point input values. The multiplexer-inverter unit is configured to select one of the unshifted mantissa portions and one of the shifted mantissa portions to be conveyed as inputs to an adder unit. The adder inputs conveyed by the multiplexer-inverter unit are aligned in order to facilitate the addition operation. The multiplexer-inverter unit is further configured to invert the second adder input if the effective operation to be performed is subtraction.

The adder unit is configured to add the first and second adder inputs, thereby generating first and second adder outputs. The first adder output is equal to the sum of the two inputs, while the second adder output is equal to the first adder output plus one. One of the two adder outputs is selected according to a far path selection signal generated by a far path selection unit. The far path selection unit is configured to generate a plurality of preliminary far path selection signals. Each of these preliminary far path selection signals corresponds to a different possible normalization of the first adder output. For example, one of the preliminary far path selection signals corresponds to a prediction that the first adder output is properly normalized. Another preliminary far path selection signal corresponds to a prediction that the first adder output is not normalized, while still another select signal indicates that said first adder output has an overflow bit set. One of these preliminary far path selection signals is selected to be conveyed as the final far path selection signal based on which of these predictions actually occurs.

The far data path further includes a multiplexer-shift unit configured to receive the first and second adder outputs as well as the final far path selection signal. The appropriate adder output is selected, and a one-bit left or right shift may also be performed to properly normalize the result. In the case of a left shift, a guard bit previously shifted out of one of the mantissa values by a right shift unit may be shifted back into the final result. The selected value is conveyed as a mantissa portion of the far data path result value. The exponent portion of the far path result is calculated by a exponent adjustment unit. The exponent adjustment unit is configured to receive the original larger exponent value along with the amount of shifting required for proper normalization (which may be no shift, a one-bit left shift, or a one-bit right shift).

In contrast to a generic floating point addition/subtraction pipeline, the far data path is optimized to perform effective additions. The far data path is additionally optimized to perform effective subtractions on operands having an absolute exponent difference greater than one. This configuration allows the recomplementation step to be avoided, since all operations produce positive results. Furthermore, since adder outputs require at most a one-bit shift, only one full-size shifter is needed in the far data path. This results in improved floating point addition and subtraction performance for the far data path.

In one embodiment, the close data path is coupled to receive mantissa portions of the given pair of floating point input values, as well as two least significant bits of each of the exponent values. The mantissa values are conveyed to a shift-swap unit, which also receives an exponent difference prediction from an exponent prediction unit. The exponent difference prediction is indicative of whether the absolute exponent difference is 0 or 1. It is used to align and swap (if needed) the input mantissa values for conveyance to a close path adder unit. The mantissa values are swapped such that the exponent value associated with the first adder input is greater than or equal to the exponent value associated with the second adder input. The first adder input is not guaranteed to be greater than the second adder input if the exponent values are equal, however. The shift-swap unit is also configured to invert the second adder input since the adder unit within the close data path performs subtraction.

It is further noted that the exponent difference value generated by the exponent prediction unit may be incorrect. This is true since the exponent prediction is based only on a subset of the total number of bits. The result produced by the close data path is thus speculative. The actual exponent difference calculated in the far data path is used to determine whether the result produced by the close data path is valid.

The adder unit within the close data path produces a first and second output value. The first output value is equal to the first adder input plus the second adder input, which is effectively equivalent to the first mantissa portion minus the second mantissa portion. The second output value, on the other hand, is equal to the first output value plus one. Both values are conveyed to a multiplexer-inverter unit. A close path selection signal provided by a close path selection unit is usable to select either the first adder output or the second adder output as a preliminary close path result.

The selection unit includes a plurality of logic sub-blocks, each of which is configured to generate a preliminary close path selection signal indicative of either the first adder output value or the second adder output value. Each of the preliminary close path selection signals corresponds to a different predictions scenario. For example, a first logic sub-block generates a preliminary close path select signal for the case in which the exponent values are equal and the first mantissa value is greater than the second lo mantissa value. A second logic sub-block generates a select signal for the case in which the exponent values are equal and the first mantissa value is less than the second mantissa value. A third logic sub-block corresponds to the case in which the first exponent value is greater than the second exponent value and the first adder output is not normalized. The last sub-block corresponds to the case in which the first exponent value is greater than the second exponent value and the first adder output is normalized. Each of the preliminary selection signals is conveyed to a close path selection multiplexer, the output of which is used to select either the first or second adder output as the preliminary close path subtraction result.

The output for the close path selection multiplexer is determined by which of the various predicted cases actually occurs. Accordingly, the close path selection multiplexer receives as control signals the exponent prediction value (indicating whether the exponents are equal or not), the sign value of the first adder output (indicating whether a negative result is present), and the MSB of the first adder output (indicating whether the result is properly normalized or not). The sign value and the MSB value are generated concurrently within both the adder unit and the selection unit. This is accomplished using a carry chain driven by $C_{MSB}$, the carry in signal to the most significant bit position of the adder unit. This concurrent generation allows faster selection of either the first or second adder outputs. The selection of one of these values effectuates rounding the close path result to the nearest number (an even number is chosen in the event of a tie). This configuration advantageously eliminates the need for a separate adder unit to perform rounding.

If the first adder output is negative, the multiplexer-inverter unit inverts the first adder output to produce the correct result. This occurs for the case in which the exponents are equal and the second mantissa value is greater than the first mantissa value. In any event, the selected close path preliminary subtraction result is then conveyed to a left shift unit for normalization.

The close path preliminary subtraction result conveyed to the left shift unit is shifted according to a predicted shift amount generated by a shift prediction unit. The shift prediction unit includes three leading 0/1 detection units. The first unit, a leading 1 detection unit, generates a first prediction string for the case in which the first exponent value is greater than the second exponent value. The second unit, which performs both leading 0 and 1 detection, generates a second prediction string for the case in which the first and second exponent values are equal. Leading 0 and 1 detection is performed because the result may be positive (leading 1) or negative (leading 0). Finally, the third unit, a leading 1 detection unit, generates a third prediction string for the case in which the second exponent value is greater than the first exponent value. The most significant asserted bits within each of the strings indicates the position of a leading 0 or 1 value.

Each of the three prediction strings are generated concurrently and conveyed to a shift prediction multiplexer. The exponent prediction value generated by the exponent prediction unit within the close data path selects which of the prediction strings is conveyed by the shift prediction multiplexer to a priority encoder. The priority encoder then converts the selected prediction string to a shift amount which is conveyed to the left shift unit within the close data path. The predicted shift amount may in some instances be incorrect by one bit position. For such cases, the close path result is left shifted one place during final selection. The calculated results of both the far data path and close data path are conveyed to a final result multiplexer, which selects the correct result based upon the calculated actual exponent difference value.

Within the shift prediction unit, the second leading 0/1 detection unit may not be optimized further, since no assumptions may be made regarding its inputs. The first and third prediction units, however, may be optimized, since it is known that the second mantissa to each unit is inverted and shifted one bit rightward with respect to the first mantissa. This means that the results predicted by the first and third detection units are both positive. Hence, only leading 1 detection is desired. Further optimizations may also be made since it is known that subtraction is being performed.

Prediction strings may be formed by assigning a value to each output bit based on the corresponding inputs for that bit position. In standard T-G-Z notation, a T output value represents input values 10 or 01, a G output value represents input values 11, and a Z output value represents output values 00. A leading 1 may thus be detected whenever the pattern T*GZ* stops matching in the generated prediction string.

The two leading 1 detection units within the shift prediction unit of the close data path may optimized over prior art designs by recognizing that the MSB of both input operands is 1. (The MSB of the first operand is a 1 since it is normalized, and the MSB of the second operand is also a 1 since the second adder operand is right shifted one place then inverted). This corresponds to an output value of G in the MSB of the prediction string. With a G in the initial position of the prediction string, it may be recognized that the string stops matching whenever Z' (the complement of Z) is found. This condition is realized whenever at least one of the inputs in a given bit position is set.

The optimized leading 1 detection unit includes a pair of input registers and an output register for storing the generated prediction string. The first input register is coupled to receive the first (greater) mantissa value, while the second input register is coupled to receive an inverted version of the second (lesser) mantissa value. The leading 1 detection unit further includes a plurality of logic gates coupled to receive bits from each of the input registers. Each logic gate generates a bit for the final prediction string based on whether one of the inputs is set. The most significant asserted bit in the output prediction string indicates the position of the leading 1 bit.

The add/subtract pipeline may also be configured to perform floating point-to-integer and integer-to-floating point conversions. In one embodiment, the far data path may be used to perform floating point-to-integer conversions, while the close data path performs integer-to-floating point conversions. Both data paths are configured to be as wide as the width of the larger format.

In order to perform floating point-to-integer conversions within the far data path, a shift amount is generated from the maximum integer exponent value and the exponent value of the floating point number to be converted. The floating point mantissa to be converted is then right shifted by the calculated shift amount and conveyed to the multiplexer-inverter unit. The multiplexer-inverter unit conveys the converted mantissa value to the adder unit as the second adder input. The first adder input is set to zero.

As with standard far path operation, the adder unit produces two output values, sum and sum+1. These values are conveyed to the multiplexer-shift unit, where the first adder output (sum) is selected by the far path selection signal. The far path selection unit is configured to select the sum output of the adder unit in response to receiving an indication that a floating point-to-integer conversion is being performed.

The floating point number being converted may be greater than the maximum representable integer (or less than the minimum representable integer). Accordingly, comparisons are performed to determine whether overflow or underflow has occurred. If either condition is present, the integer result is clamped at the maximum or minimum value.

In order to perform integer-to-floating point conversions within the close data path, a zero value is utilized as the first operand, while the second operand is the integer value to be converted. The second operand is inverted (since close path performs subtraction) and conveyed along with the zero value to the adder unit. The adder unit, as in standard close path operations, produces two outputs, sum and sum+1.

If the input integer value is positive, the output of the adder unit is negative. Accordingly, the sum output is chosen by the selection unit as the preliminary close path result. This output is then inverted in the multiplexer-inverter unit to produce the correct result. If, on the other hand, the input integer value is negative, the output of the adder unit is positive. The sum+1 output is thus chosen as the preliminary close path result, and the sign of the resulting floating point number is denoted as being negative.

The preliminary close path result is then conveyed to the left shift unit for normalization, which is performed in accordance with a predicted shift amount conveyed from the shift prediction unit. For integer-to-floating point conversion, the prediction string of the second prediction unit (equal exponents) is used. The zero operand and an inverted version of the integer value are conveyed as inputs to the second prediction unit.

The shift amount generated by the shift prediction unit is usable to left align the preliminary close path result (with a possible one-bit correction needed). With alignment performed, the number bits in the floating point mantissa may thus be routed from the output of the left shift unit to form the mantissa portion of the close path result. The exponent portion of the close path result is generated by an exponent adjustment unit.

The exponent adjustment unit is configured to subtract the predicted shift amount from the maximum exponent possible in the integer format. The result (which may also be off by 1) becomes the exponent portion of the close path result. If the dynamic range of the floating point format is greater than the maximum representable integer value, overflows do not occur.

The execution unit may also be configured to include a plurality of add/subtract pipelines each having a far and close data path. In this manner, vectored instructions may be performed which execute the same operations on multiple sets of operands. This is particularly useful for applications such as graphics in which similar operations are performed repeatedly on large sets of data.

In addition to performing vectored add and subtract operations, the execution unit may also be configured to perform vectored floating point-to-integer and integer-to-floating point instructions as described above. The execution unit may still further be configured to perform additional vectored arithmetic operations such as reverse subtract and accumulate functions by appropriate multiplexing of input values to the far and close data paths. Other vectored operations such as extreme value functions and comparison operations may be implemented through appropriate multiplexing of output values.

BRIEF DESCRIPTION OF THE DRAWINGS

Other objects and advantages of the invention will become apparent upon reading the following detailed description and upon reference to the accompanying drawings in which:

FIGS. 10A–H are examples of addition and subtraction performed within the far data path of FIG. 6;

FIG. 36 is a block diagram of one embodiment of an execution unit within microprocessor 100 which includes a plurality of add/subtract pipelines, FIG. 37A depicts the format of a vectored floating point addition instruction according to one embodiment of the invention;

FIG. 37B depicts pseudocode for the vectored floating point addition instruction of FIG. 37A;

FIG. 38A depicts the format of a vectored floating point subtraction instruction according to one embodiment of the invention;

FIG. 38B depicts pseudocode for the vectored floating point subtraction instruction of FIG. 38A;

FIG. 39A depicts the format of a vectored floating point-to-integer conversion instruction according to one embodiment of the invention;

FIG. 39B depicts pseudocode for the vectored floating point-to-integer conversion instruction of FIG. 39A;

FIG. 39C is a table listing output values for various inputs to the vectored floating point-to-integer conversion instruction of FIG. 39A;

FIG. 40A depicts the format of a vectored floating point-to-integer conversion instruction according to an alternate embodiment of the invention;

FIG. 40B depicts pseudocode for the vectored floating point-to-integer conversion instruction of FIG. 40A;

FIG. 40C is a table listing output values for various inputs to the vectored floating point-to-integer conversion instruction of FIG. 40A;

FIG. 41A depicts the format of a vectored integer-to-floating point conversion instruction according to one embodiment of the invention;

FIG. 41B depicts pseudocode for the vectored integer-to-floating point conversion instruction of FIG. 41A;

FIG. 42A depicts the format of a vectored integer-to-floating point conversion instruction according to an alternate embodiment of the invention;

FIG. 42B depicts pseudocode for the vectored integer-to-floating point conversion instruction of FIG. 42A;

FIG. 43A depicts the format of a vectored floating point accumulate instruction according to one embodiment of the invention;

FIG. 43B depicts pseudocode for the vectored floating point accumulate instruction of FIG. 43A;

FIG. 44A depicts the format of a vectored floating point reverse subtract instruction according to one embodiment of the invention;

FIG. 44B depicts pseudocode for the vectored floating point reverse subtract instruction of FIG. 44A;

FIG. 45A depicts the format of a vectored floating point maximum value instruction according to one embodiment of the invention;

FIG. 45B depicts pseudocode for the vectored floating point maximum value instruction of FIG. 45A;

FIG. 45C is a table listing output values for various inputs to the vectored floating point maximum value instruction of FIG. 45A;

FIG. 46A depicts the format of a vectored floating point minimum value instruction according to one embodiment of the invention;

FIG. 46B depicts pseudocode for the vectored floating point minimum value instruction of FIG. 46A;

FIG. 46C is a table listing output values for various inputs to the vectored floating point minimum value instruction of FIG. 46A;

FIG. 47A depicts the format of a vectored floating point equality comparison instruction according to one embodiment of the invention;

FIG. 47B depicts pseudocode for the vectored floating point equality comparison instruction of FIG. 47A;

FIG. 47C is a table listing output values for various inputs to the vectored floating point equality comparison instruction of FIG. 47A;

FIG. 48A depicts the format of a vectored floating point greater than comparison instruction according to one embodiment of the invention;

FIG. 48B depicts pseudocode for the vectored floating point greater than comparison instruction of FIG. 48A;

FIG. 48C is a table listing output values for various inputs to the vectored floating point greater than comparison instruction of FIG. 48A;

FIG. 49A depicts the format of a vectored floating point greater than or equal to comparison instruction according to one embodiment of the invention;

FIG. 49B depicts pseudocode for the vectored floating point greater than or equal to comparison instruction of FIG. 49A;

FIG. 49C is a table listing output values for various inputs to the vectored floating point greater than or equal to comparison instruction of FIG. 49A;

Figure 1:
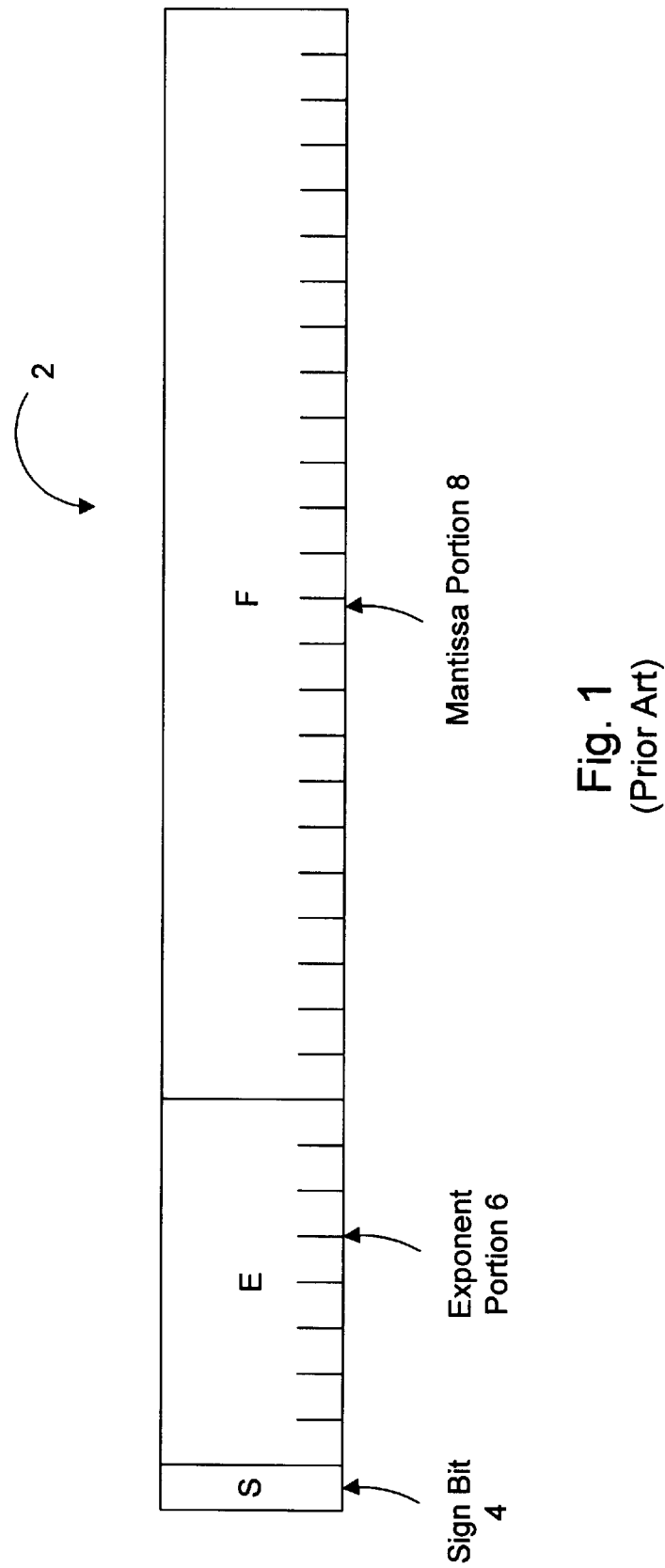
FIG. 1 depicts the format of a single precision floating point number according to IEEE standard 754.
Figure 2:
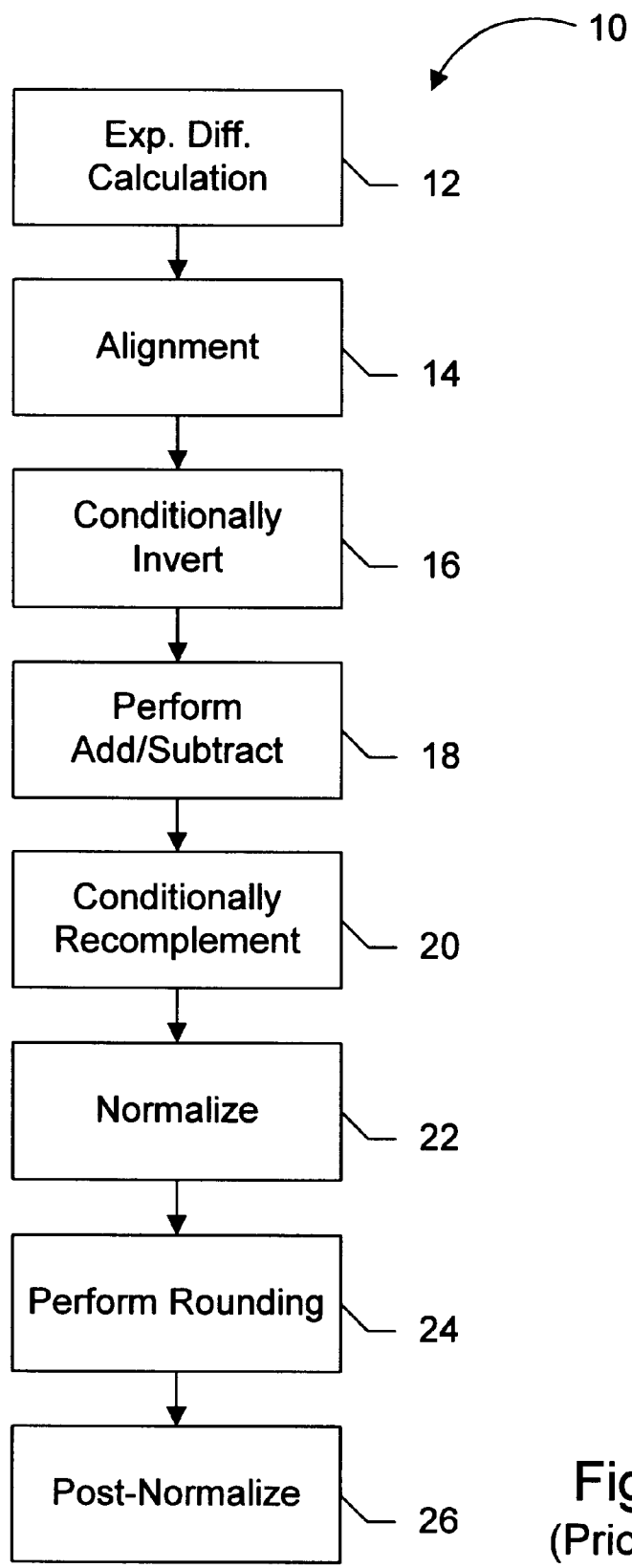
FIG. 2 depicts a prior art floating point addition pipeline.
Figure 3:
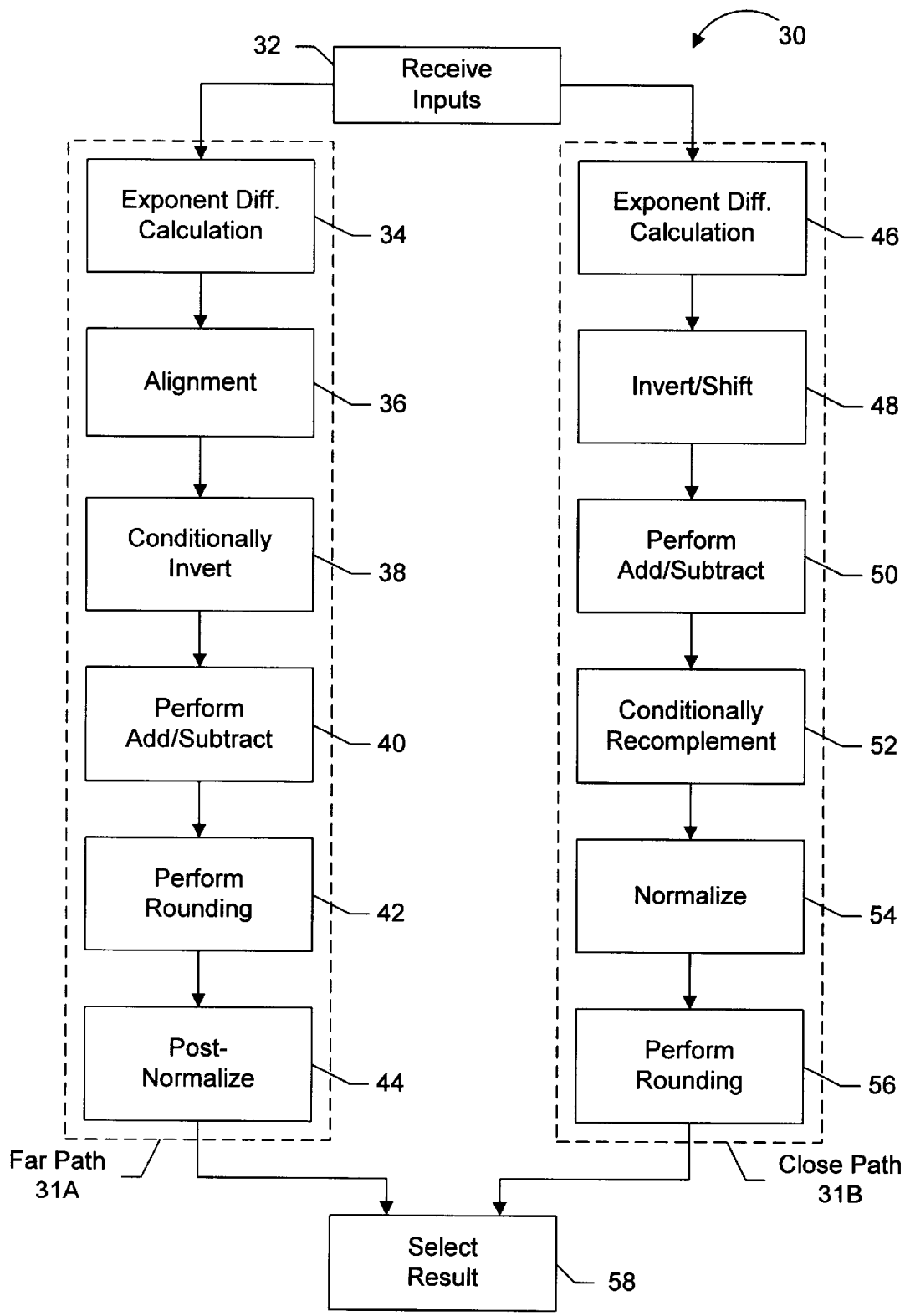
FIG. 3 depicts a prior art floating point addition pipeline having far and close data paths.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 4:
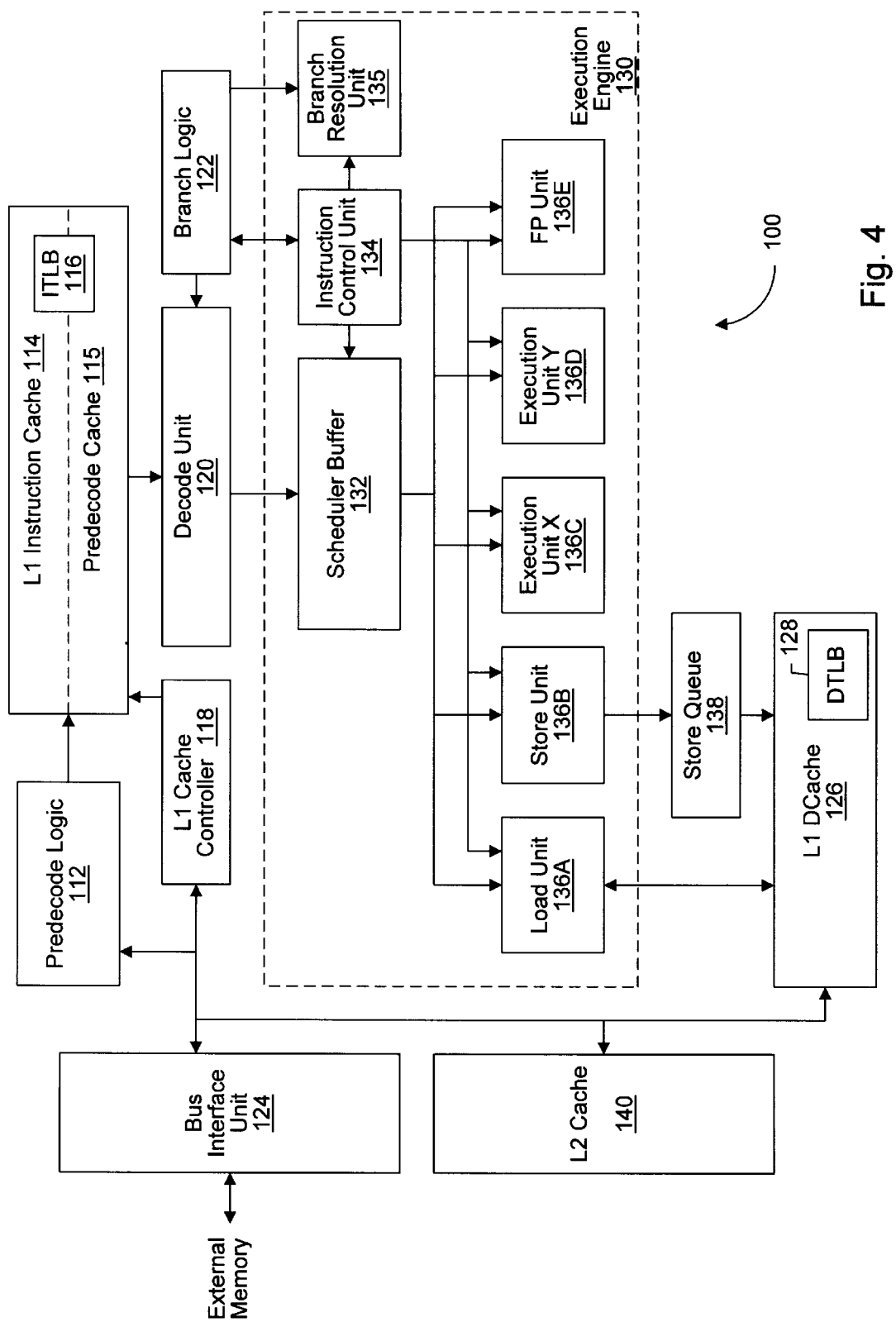
FIG. 4 is a block diagram of a microprocessor according to one embodiment of the present invention.

Turning now to FIG. 4, a block diagram of one embodiment of a microprocessor 100 is shown. As depicted, microprocessor 100 includes a predecode logic block 112 coupled to an instruction cache 114 and a predecode cache 115. Caches 114 and 115 also include an instruction TLB 116. A cache controller 118 is coupled to predecode block 112, instruction cache 114, and predecode cache 115. Controller 118 is additionally coupled to a bus interface unit 124, a level-one data cache 126 (which includes a data TLB 128), and an L2 cache 140. Microprocessor 100 further includes a decode unit 120, which receives instructions from instruction cache 114 and predecode data from cache 115. This information is forwarded to execution engine 130 in accordance with input received from a branch logic unit 122.

Execution engine 130 includes a scheduler buffer 132 coupled to receive input from decode unit 120. Scheduler buffer 132 is coupled to convey decoded instructions to a plurality of execution units 136A–E in accordance with input received from an instruction control unit 134. Execution units 136A–E include a load unit 136A, a store unit 136B, an integer/multimedia X unit 136C, an integer/multimedia Y unit 136D, and a floating point unit 136E. Load unit 136A receives input from data cache 126, while store unit 136B interfaces with data cache 126 via a store queue 138. Blocks referred to herein with a reference number followed by a letter will be collectively referred to by the reference number alone. For example, execution units 136A–E will be collectively referred to as execution units 136.

In one embodiment, instruction cache 114 is organized as sectors, with each sector including two 32-byte cache lines. The two cache lines of a sector share a common tag but have separate state bits that track the status of the line. Accordingly, two forms of cache misses (and associated cache fills) may take place: sector replacement and cache line replacement. In the case of sector replacement, the miss is due to a tag mismatch in instruction cache 114, with the required cache line being supplied by external memory via bus interface unit 124. The cache line within the sector that is not needed is then marked invalid. In the case of a cache line replacement, the tag matches the requested address, but the line is marked as invalid. The required cache line is supplied by external memory, but, unlike the sector replacement case, the cache line within the sector that was not requested remains in the same state. In alternate embodiments, other organizations for instruction cache 114 may be utilized, as well as various replacement policies.

Microprocessor 100 performs prefetching only in the case of sector replacements lo in one embodiment. During sector replacement, the required cache line is filled. If this required cache line is in the first half of the sector, the other cache line in the sector is prefetched. If this required cache line is in the second half of the sector, no prefetching is performed. It is noted that other prefetching methodologies may be employed in different embodiments of microprocessor 100.

When cache lines of instruction data are retrieved from external memory by bus interface unit 124, this data is conveyed to predecode logic block 112. In one embodiment, the instructions processed by microprocessor 100 and stored in cache 114 are variable-length (e.g., the x86 instruction set). Because decode of variable-length instructions is particularly complex, predecode logic 112 is configured to provide additional information to be stored in predecode cache 115 to aid during decode. In one embodiment, predecode logic 112 generates predecode bits for each byte in instruction cache 114 which indicate the number of bytes to the start of the next variable-length instruction. These predecode bits are stored in predecode cache 115 and are passed to decode unit 120 when instruction bytes are requested from cache 114.

Instruction cache 114 is implemented as a 32 Kbyte, two-way set associative, writeback cache in one embodiment of microprocessor 100. The cache line size is 32 bytes in this embodiment. Cache 114 also includes a TLB 116, which includes 64 entries used to translate linear addresses to physical addresses. Many other variations of instruction cache 114 and TLB 116 are possible in other embodiments.

Instruction fetch addresses are supplied by cache controller 118 to instruction cache 114. In one embodiment, up to 16 bytes per clock cycle may be fetched from cache 114. The fetched information is placed into an instruction buffer that feeds into decode unit 120. In one embodiment of microprocessor 100, fetching may occur along a single execution stream with seven outstanding branches taken.

In one embodiment, the instruction fetch logic within cache controller 118 is capable of retrieving any 16 contiguous instruction bytes within a 32-byte boundary of cache 114. There is no additional penalty when the 16 bytes cross a cache line boundary. Instructions are loaded into the instruction buffer as the current instructions are consumed by decode unit 120. (Predecode data from cache 115 is also loaded into the instruction buffer as well). Other configurations of cache controller 118 are possible in other embodiments.

Decode logic 120 is configured to decode multiple instructions per processor clock cycle. In one embodiment, decode unit 120 accepts instruction and predecode bytes from the instruction buffer (in x86 format), locates actual instruction boundaries, and generates corresponding "RISC ops". RISC ops are fixed-format internal instructions, most of which are executable by microprocessor 100 in a single clock cycle. RISC ops are combined to form every function of the x86 instruction set in one embodiment of microprocessor 100.

Microprocessor 100 uses a combination of decoders to convert x86 instructions into RISC ops. The hardware includes three sets of decoders: two parallel short decoders, one long decoder, and one vectoring decoder. The parallel short decoders translate the most commonly-used x86 instructions (moves, shifts, branches, etc.) into zero, one, or two RISC ops each. The short decoders only operate on x86 instructions that are up to seven bytes long. In addition, they are configured to decode up to two x86 instructions per clock cycle. The commonly-used x86 instructions which are greater than seven bytes long, as well as those semi-commonly-used instructions are up to seven bytes long, are handled by the long decoder.

The long decoder in decode unit 120 only performs one decode per clock cycle, and generates up to four RISC ops. All other translations (complex instructions, interrupts, etc.) are handled by a combination of the vector decoder and RISC op sequences fetched from an on-chip ROM. For complex operations, the vector decoder logic provides the first set of RISC ops and an initial address to a sequence of further RISC ops. The RISC ops fetched from the on-chip ROM are of the same type that are generated by the hardware decoders.

In one embodiment, decode unit 120 generates a group of four RISC ops each clock cycle. For clock cycles in which four RISC ops cannot be generated, decode unit 120 places RISC NOP operations in the remaining slots of the grouping. These groupings of RISC ops (and possible NOPs) are then conveyed to scheduler buffer 132.

It is noted that in another embodiment, an instruction format other than x86 may be stored in instruction cache 114 and subsequently decoded by decode unit 120.

Instruction control unit 134 contains the logic necessary to manage out-of-order execution of instructions stored in scheduler buffer 132. Instruction control unit 134 also manages data forwarding, register renaming, simultaneous issue and retirement of RISC ops, and speculative execution. In one embodiment, scheduler buffer 132 holds up to 24 RISC ops at one time, equating to a maximum of 12 x86 instructions. When possible, instruction control unit 134 may simultaneously issue (from buffer 132) a RISC op to any available one of execution units 136. In total, control unit 134 may issue up to six and retire up to four RISC ops per clock cycle in one embodiment.

In one embodiment, microprocessor 10 includes five execution units (136A–E). Load unit 136A and store unit 136B are two-staged pipelined designs. Store unit 136B performs data memory and register writes which are available for loading after one clock cycle. Load unit 136A performs memory reads. The data from these reads is available after two clock cycles. Load and store units are possible in other embodiments with varying latencies.

Execution unit 136C is configured, in one embodiment, to perform all fixed point ALU operations, as well as multiplies, divides (both signed and unsigned), shifts, and rotates. Execution unit 136D, in contrast, is configured to perform basic word and double word ALU operations (ADD, AND, CMP, etc.). Additionally, units 136C–D are configured to accelerate performance of software written using multimedia instructions. Applications that can take advantage of multimedia instructions include graphics, video and audio compression and decompression, speech recognition, and telephony. Accordingly, units 136C–D are configured to execute multimedia instructions in a single clock cycle in one embodiment. Many of these instructions are designed to perform the same operation of multiple sets of data at once (vector processing). In one embodiment, these multimedia instructions include both vectored fixed point and vectored floating point instructions.

Execution unit 136E contains an IEEE 754-compatible floating point unit designed to accelerate the performance of software which utilizes the x86 instruction set. Floating point software is typically written to manipulate numbers that are either very large or small, require a great deal of precision, or result from complex mathematical operations such as transcendentals. Floating point unit includes an adder unit, a multiplier unit, and a divide/square root unit. In one embodiment, these low-latency units are configured to execute floating point instructions in as few as two clock cycles.

Branch resolution unit 135 is separate from branch prediction logic 122 in that it resolves conditional branches such as JCC and LOOP after the branch condition has been evaluated. Branch resolution unit 135 allows efficient speculative execution, enabling microprocessor 100 to execute instructions beyond conditional branches before knowing whether the branch prediction was correct. As described above, microprocessor 100 is configured to handle up to seven outstanding branches in one embodiment.

Branch prediction logic 122, coupled to decode unit 120, is configured to increase the accuracy with which conditional branches are predicted in microprocessor 100. Ten to twenty percent of the instructions in typical applications include conditional branches. Branch prediction logic 122 is configured to handle this type of program behavior and its negative effects on instruction execution, such as stalls due to delayed instruction fetching. In one embodiment, branch prediction logic 122 includes an 8192-entry branch history table, a 16-entry by 16 byte branch target cache, and a 16-entry return address stack.

Branch prediction logic 122 implements a two-level adaptive history algorithm using the branch history table. This table stores executed branch information, predicts individual branches, and predicts behavior of groups of branches. In one embodiment, the branch history table does not store predicted target addresses in order to save space. These addresses are instead calculated on-the-fly during the decode stage.

To avoid a clock cycle penalty for a cache fetch when a branch is predicted taken, a branch target cache within branch logic 122 supplies the first 16 bytes at that address directly to the instruction buffer (if a hit occurs in the branch target cache). In one embodiment, this branch prediction logic achieves branch prediction rates of over 95%.

Branch logic 122 also includes special circuitry designed to optimize the CALL and RET instructions. This circuitry allows the address of the next instruction following the CALL instruction in memory to be pushed onto a return address stack. When microprocessor 100 encounters a RET instruction, branch logic 22 pops this address from the return stack and begins fetching.

Like instruction cache 114, L1 data cache 126 is also organized as two-way set associative 32 Kbyte storage. In one embodiment, data TLB 128 includes 128 entries used to translate linear to physical addresses. Like instruction cache 114, L1 data cache 126 is also sectored. Data cache 126 implements a MESI (modified-exclusive-sharedinvalid) protocol to track cache line status, although other variations are also possible. In order to maximize cache hit rates, microprocessor 100 also includes on-chip L2 cache 140 within the memory sub-system.

Figure 5:
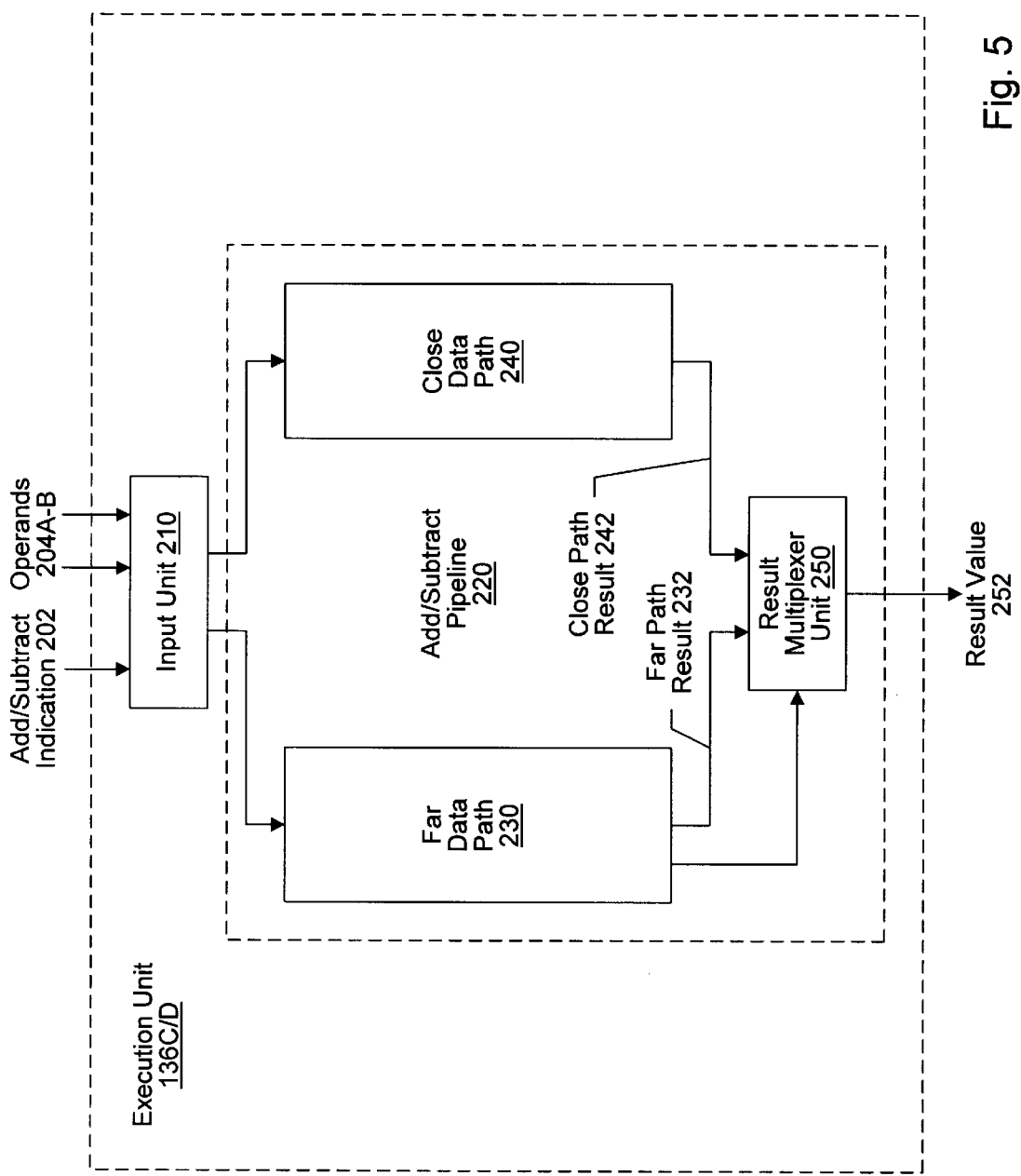
FIG. 5 is a block diagram of an execution unit having an add/subtract pipeline according to one embodiment of the present invention.

Turning now to FIG. 5, a block diagram of a portion of an execution unit 136C/D is depicted. The "C/D" denotes that the execution unit shown in FIG. 5 is representative of both execution units 136C and 136D. This means of reference is also used below to describe other embodiments execution units 136C–D. As shown, execution unit 136C/D includes an input unit 210 which receives an add/subtract indication 202 and operands 204A–B. Input unit 210 is coupled an add/subtract pipeline 220, which includes a far data path 230 and a close data path 240. Far data path 230 and close data path 240 receive inputs from input unit 210 and generate far path result 232 and close path result 242, respectively, which are conveyed to a result multiplexer unit 250. Far data path 230 also conveys a select signal to multiplexer unit 250 in one embodiment. In this embodiment, the select signal is usable to select either far path result 232 or close path result 242 to be conveyed as result value 252, which is the output of add/subtract pipeline 220.

Input unit 210 receives the operand data, and conveys sufficient information to far data path 230 and close data path 240 to perform the add or subtract operation. In one embodiment, add/subtract indication 202 is indicative of the operation specified by the opcode of a particular floating point arithmetic instruction. That is, add/subtract indication 202 corresponds to the opcode of an instruction being processed by unit 136C/D (a logic 0 may indicate an add opcode and a logic 1 a subtract opcode in one embodiment). Operands 204 are floating point numbers having sign, exponent, and mantissa portions according to a predetermined floating point format (such as IEEE standard 754). If add/subtract indication 202 corresponds to an opcode add/subtract value, input unit 210 may be configured to make a determination whether effective addition or subtraction is occurring. (As described above, an subtract opcode value may effectively be an addition operand depending on the signs of operands 204). In one embodiment, input unit 210 determines whether inputs 202 and 204 represent effective addition or subtraction, and conveys outputs to far data path 230 and close data path 240. In an alternate embodiment, the determination of effective addition or subtraction is made prior to conveyance to unit 136C/D. Add/subtract indication 202 is thus reflective of either effective addition or subtraction, and sign bits of incoming operands 204 are adjusted accordingly. In yet another embodiment, the effective addition/subtraction determination may be made separately within far data path 230 and close data path 240.

The format of the outputs of input unit 210 depends upon the format of unit 210 inputs and also the configuration of far data path 230 and close data path 240. In one embodiment, unit 210 conveys the full sign, exponent, and mantissa values ($S_A$, $S_B$, $E_A$, $E_B$, $M_A$, and $M_B$) of operands 204 to far data path 230, while conveying $S_A$, $S_B$, $M_A$, $M_B$, and two least significant bits of both $E_A$ and $E_B$ to close data path 240. As will be described the two least significant exponents bits are used for speculative determination of exponent difference (instead of a full subtract). In other embodiments of add/subtract pipeline 220, far data path 230 and close data path 240 may receive input data of varying formats.

Far data path 230 is configured to perform addition operations, as well as subtraction operations for operands having absolute exponent difference $E_{diff}$ which is greater than 1. Close data path 240, on the other hand, is configured to perform subtraction operations on operands for which $E_{diff} \leq 1$. As will be described below, close data path 240 includes a selection unit which is configured to provide improved performance over prior art pipelines such as pipelines 10 and 30 described above.

Far data path 230 and close data path 240 generate far path result 232 and close path result 242, respectively, which are both conveyed to result multiplexer unit 250. As shown, far data path also generates a select signal for unit 250, which is usable to select either input 232 or 242 as result value 252. In alternate embodiments of add/subtract pipeline 220, the select for multiplexer unit 250 may generated differently.

Figure 6:
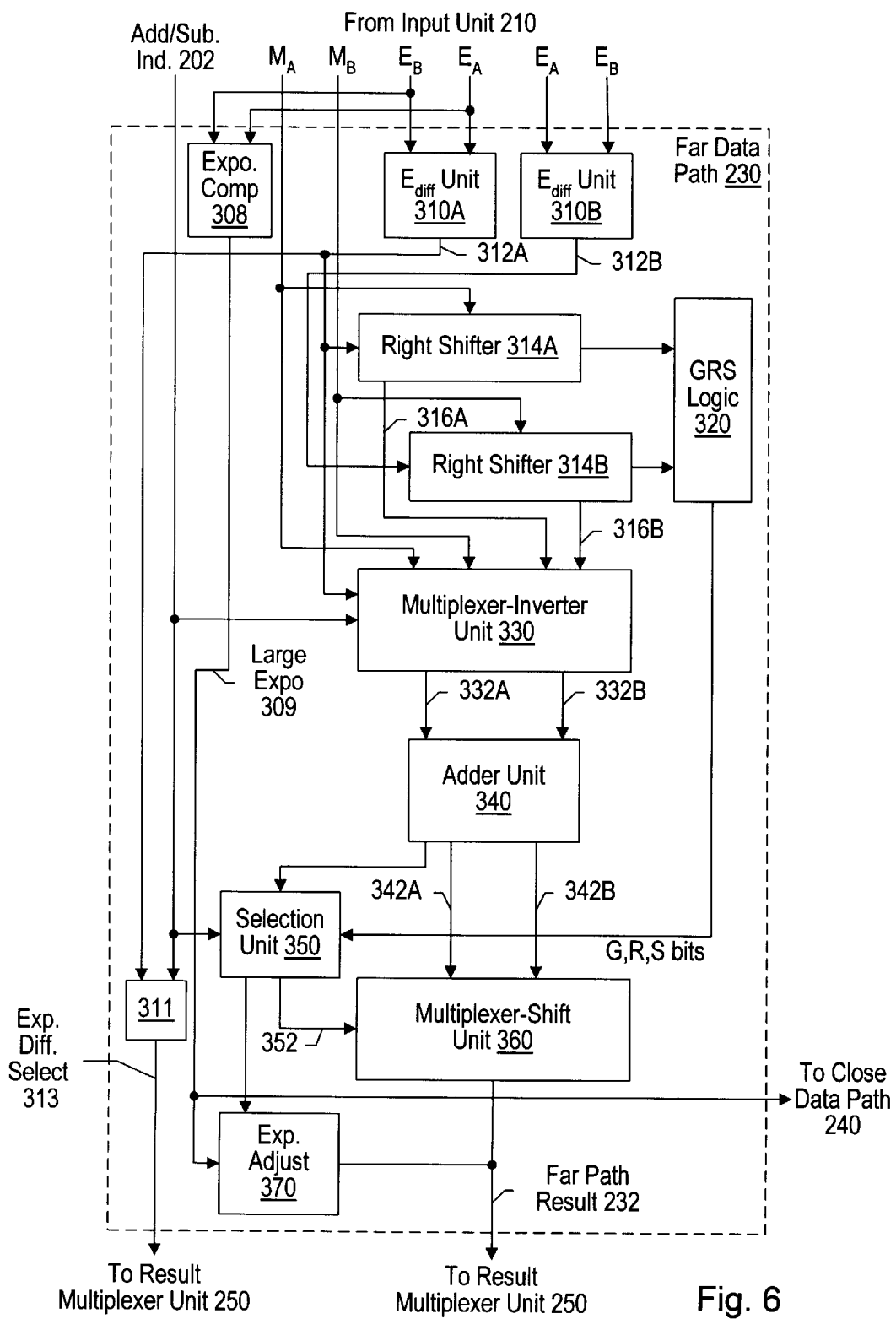
FIG. 6 is a block diagram of one embodiment of a far data path within the add/subtract pipeline of FIG. 5.

Turning now to FIG. 6, a block diagram of far data path 230 is depicted. As shown, far data path 230 receives an add/subtract indication, full exponent values ($E_A$ and $E_B$), and full mantissa values ($M_A$ and $M_B$) from input unit 210 in one embodiment. In the embodiment shown, data path 230 also receives sign bits $S_A$ and $S_B$, although they are not depicted in FIG. 6 for simplicity and clarity.

Far data path 230 includes exponent difference calculation units 310A–B, which receive input exponent values $E_A$ and $E_B$. Units 310 are coupled to right shift units 314A–B, which receive mantissa values $M_A$ and $M_B$, respectively. Shift units 314 are also coupled to multiplexer-inverter unit 330 and logic unit 320 (referred to as "GRS" logic because unit 320 stores the guard (G), round (R), and sticky (S) bits shifted out in units 314). Multiplexer-inverter unit 330, in response to receiving shifted (316A–B) and unshifted versions of $M_A$ and $M_B$, conveys a pair of operands (332A–B) to an adder unit 340. Adder unit 340, in turn, generates a pair of outputs 342A and 342B, which are conveyed to multiplexer-shift unit 360. Adder unit 340 is additionally coupled to a selection unit 350, which generates a select signal for multiplexer-shift unit 360. Selection unit 350 also receives inputs from exponent unit 310 and GRS logic unit 320 in addition to values from adder unit 340. In response to select signal 352 conveyed from selection unit 350, multiplexer shift unit 360 conveys a mantissa value which, when coupled with an adjusted exponent value conveyed from an exponent adjust unit 370, is conveyed as far path result 232 to result multiplexer unit 250. Exponent adjust unit 370 receives the largest input exponent 309 (which is equal to $\max(E_A, E_B)$) from an exponent comparator unit 308 coupled to receive $E_A$ and $E_B$. Exponent 309 is additionally conveyed to close data path 240 for exponent calculations as is described below.

As shown in FIG. 6, exponent difference unit 310A is coupled to receive full exponent values $E_A$ and $E_B$. Unit 310A is configured to compute the difference $E_B-E_A$ and convey the resulting shift amount, 312A, to right shift unit 314A. Exponent difference unit 310B also receives full exponent values $E_A$ and $E_B$, but is configured to compute the difference $E_A-E_B$, which is conveyed as shift amount 312B to right shift unit 314B. In this embodiment, unless $E_A=E_B$, one of result 312 is negative (and therefore ultimately discarded by pipeline 220). An embodiment is also contemplated in which only one right shift unit 314 is provided; however, additional multiplexer logic may be needed to convey the proper mantissa value to the single shift unit. By providing two shift units 314, the performance of far data path 230 is increased.

Shift amount 312A, in one embodiment, is conveyed to a final select generation unit 311, along with add/subtract indication 202. Unit 311, in turn, generates an exponent difference select signal 313 to be conveyed to result multiplexer unit 250. The signal 313 generated by unit 310 is indicative of either far path result 232 or close path result 242. Signal 313 may be used by result multiplexer unit 250 to select either result 232 or result 242 as result value 252. If add/subtract indication 202 specifies an add operation, signal 313 is generated to be indicative of far path result 232. Similarly, if add/subtract indication 202 specifies a subtract operation and $E_{diff}$ (corresponding to the absolute value of shift amount 312A) is greater than one, signal 313 is also generated to be indicative of far path result 232. Conversely, if add/subtract indication 202 specifies a subtract operation and $E_{diff}$ is 0 or 1, signal 313 is generated to be indicative of close path result 242. In one embodiment, signal 313 may be used to cancel the far path result if $E_{diff}$ indicates result 242. $E_{diff}$ is also conveyed to selection unit 350 in one embodiment, as will be described below.

Right shift units 314A–B generate shift outputs 316A–B, respectively, according to shift amounts 312A–B. These shift outputs are then conveyed to multiplexer-inverter unit 330. Unit 330 is also coupled to receive add/subtract indication from input unit 210 and the sign bit of shift amount 312A. In one embodiment, multiplexer-inverter unit 330 is configured to swap operands 316A and 316B if operand 316B is determined to be greater than operand 316A. This determination may be made in one embodiment from the sign bit of shift amount 312A (or 312B). Additionally, unit 330 is configured to invert the smaller operand if subtraction is indicated by input unit 210. The outputs of unit 330 are conveyed to adder unit 340 as adder inputs 332A–B.

GRS logic unit 320 receives values which are right-shifted out of units 314A–B. After shift amounts 312 are applied to values in shift units 314, GRS logic unit 320 generates guard, round, and sticky bits corresponding to the smaller mantissa value. As shown, these bit values are forwarded to selection unit 350 for the rounding computation.

Adder unit 340 receives adder inputs 332A–B and generates a pair of output values 342A–B. Output 342A corresponds to the sum of input values 332 (sum), while output 342B corresponds to output 342A plus one (sum+1). Adder unit 340 also conveys a plurality of signals to selection unit 350, which generates and conveys select signal 352 to multiplexer-shift unit 360. Select signal 352 is usable to select either adder output 342A–B to be conveyed as the mantissa portion of far path result 232. By selecting either sum or sum+1 as the output of multiplexer-shift unit 360, the addition result may effectively be rounded according to the IEEE round-to-nearest mode.

In one embodiment, the exponent portion of far path result 232 is generated by exponent adjustment unit 370. Unit 370 generates the adjusted exponent from the original larger exponent value (either $E_A$ or $E_B$) and an indication of whether the adder output is normalized. The output of unit 370 is conveyed along with the output of unit 360 as far path result 232.

Figure 7:
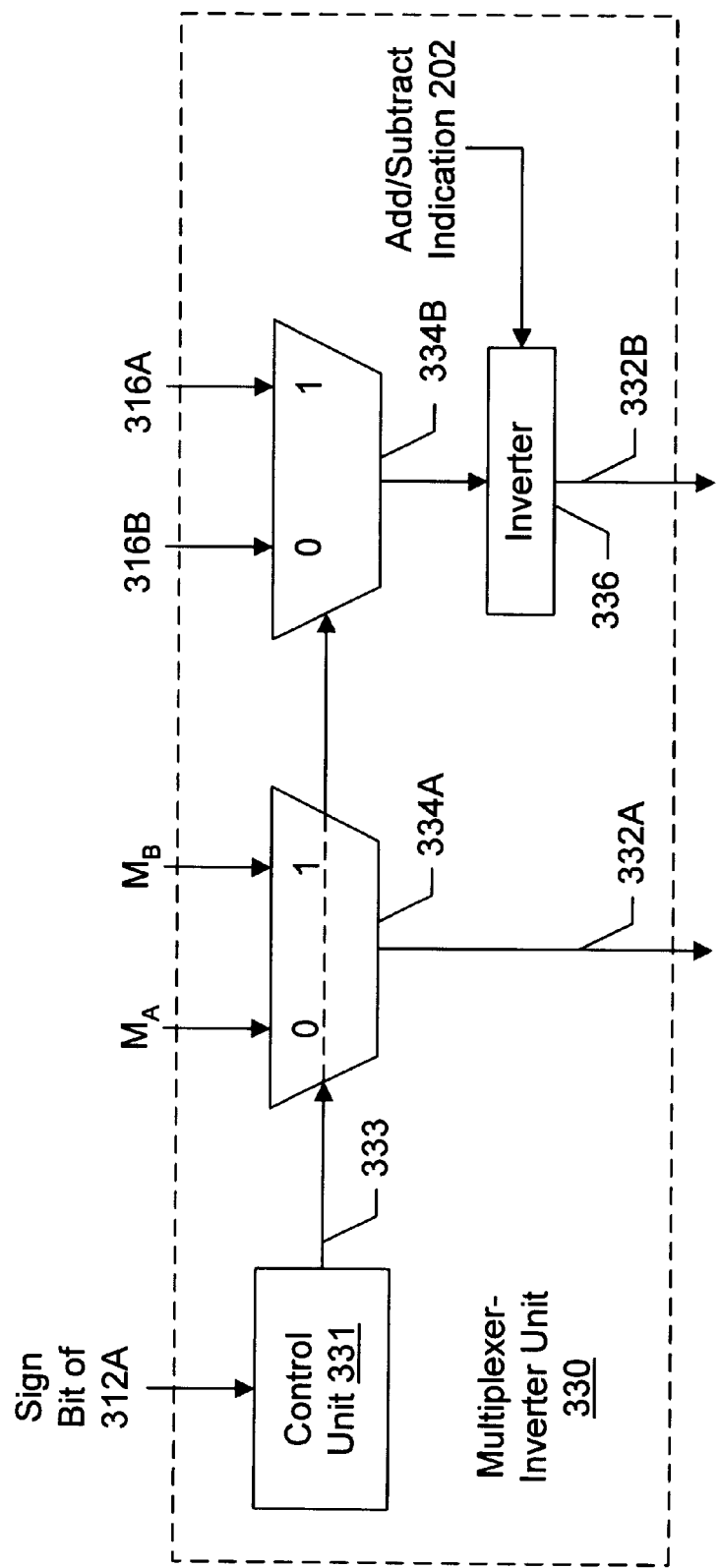
FIG. 7 is a block diagram of one embodiment of a multiplexer-inverter unit within the far data path of FIG. 6.

Turning now to FIG. 7, a block diagram of multiplexer-inverter unit 330 is depicted. Unit 330 includes a control unit 331 which receives shift amount 312A from exponent difference calculation unit 310A. Multiplexer-inverter unit 330 also includes a pair of input multiplexers 334A–B. Input multiplexer 334A receives unshifted mantissa values $M_A$ and $M_B$, while multiplexer 334B receives shifted outputs 316A–B. In one embodiment, the inputs to multiplexers 334 are configured such that control unit 331 may route a single control signal 333 to both multiplexer 334A and 334B. Additionally, the output of multiplexer 334B is inverted by an inverter 336 if a subtract operation is indicated by signal 202. If a subtract is indicated, a bit-inverted (one's complement) version of the output of multiplexer 334B is conveyed to adder 340 as adder input 342B. If an add operation is indicated by signal 202, inverter 336 is not enabled, and the output of multiplexer 334B is conveyed to adder unit 340 in non-inverted form.

Figure 8:
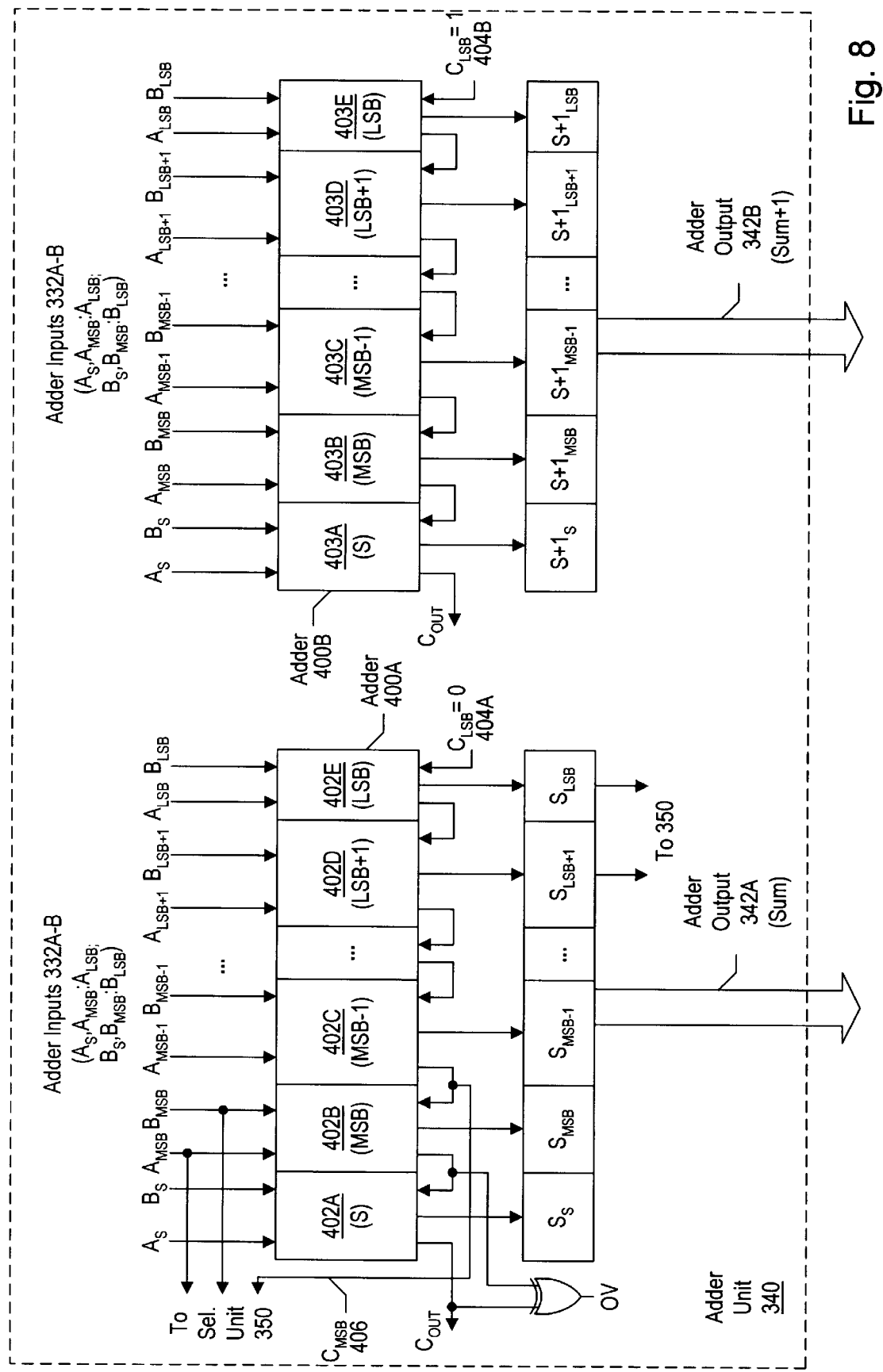
FIG. 8 is a block diagram of one embodiment of an adder unit within the far data path of FIG. 6.

Turning now to FIG. 8, a block diagram of one embodiment of adder unit 340 is depicted. Adder unit 340 includes adders 400A and 400B, each coupled to receive adder inputs 332A–B. Adder 400A is configured to generate adder output 342A (sum), while adder 400B is configured to generate adder output 342B (sum+1).

As shown, adders 400A and 400B are each coupled to receive the sign and mantissa bits of operands 204A–B. In one embodiment, adders 400A and 400B are identical except that adder 400B has a carry in (CLSB) value of 1, while, for adder 400A, $C_{LSB}=0$. It is contemplated that adders 400 may be implemented using a variety of known adder types. For example, adders 400 may be implemented as ripple-carry adders, carry lookahead adders, carry-select adders, etc. Furthermore, adders 400 may combine features of different adder types. In one embodiment, adders 400 compute the upper n/2 bits of their respective results in two different ways: that the carry in from the lower n/2 bits is 0, and that the carry in from the lower n/2 bits is 1. The use of Ling-style pseudo-carry may also be utilized in the lower n/2 bits to further reduce fan-in and gate delay. In yet another embodiment, adder unit 340 may be implemented with just a single adder. This may be accomplished by recognizing that many of the terms computed in adders 400A–B are shared. Accordingly, both sum and sum+1 may be produced by a single adder. Although such an adder is larger (in terms of chip real estate) than either of adders 400, the single adder represents a significant space savings vis-a-vis the two adder configuration of FIG. 8.

As will be described below, the most significant bit of the output of adder 400A ($S_{MSB}$) is used by selection unit 350 to generate select signal 352. The faster select signal 352 is generated, then, the faster result value 252 can be computed. Accordingly, in the embodiment shown in FIG. 8, $S_{MSB}$ is generated in selection unit 350 concurrently with the MSB computation performed in adder 400A. To facilitate this operation, $A_{MSB}$, $B_{MSB}$ and $C_{MSB}$ (the carry in to adder block 402B which generates $S_{MSB}$) are all conveyed to selection unit 350. By conveying the inputs to adder block 402B to selection unit 350 in parallel, the output of selection unit 350 may be generated more quickly, enhancing the performance of far data path 230. The two least significant bits of adder output 342A ($S_{LSB+1}$ and $S_{LSB}$) are also conveyed to selection unit 350. In one embodiment, these values are not generated in parallel in unit 350 (in the manner of $S_{MSB}$) since the least significant bits are available relatively early in the addition operation (in contrast to more significant bits such as $S_{MSB}$).

As noted above, adder 400B operates similarly to adder 400A, except that carry in value 404B is a logical one. Since the carry in value (404A) for adder 400A is a logical zero, adder 400B generates a result equal to the output of adder 400A plus one. As will be described below, by generating the values (sum) and (sum+1) for a given pair of operands, the WEEE round to nearest mode may be effectuated by selecting one of the two values.

Figure 9:
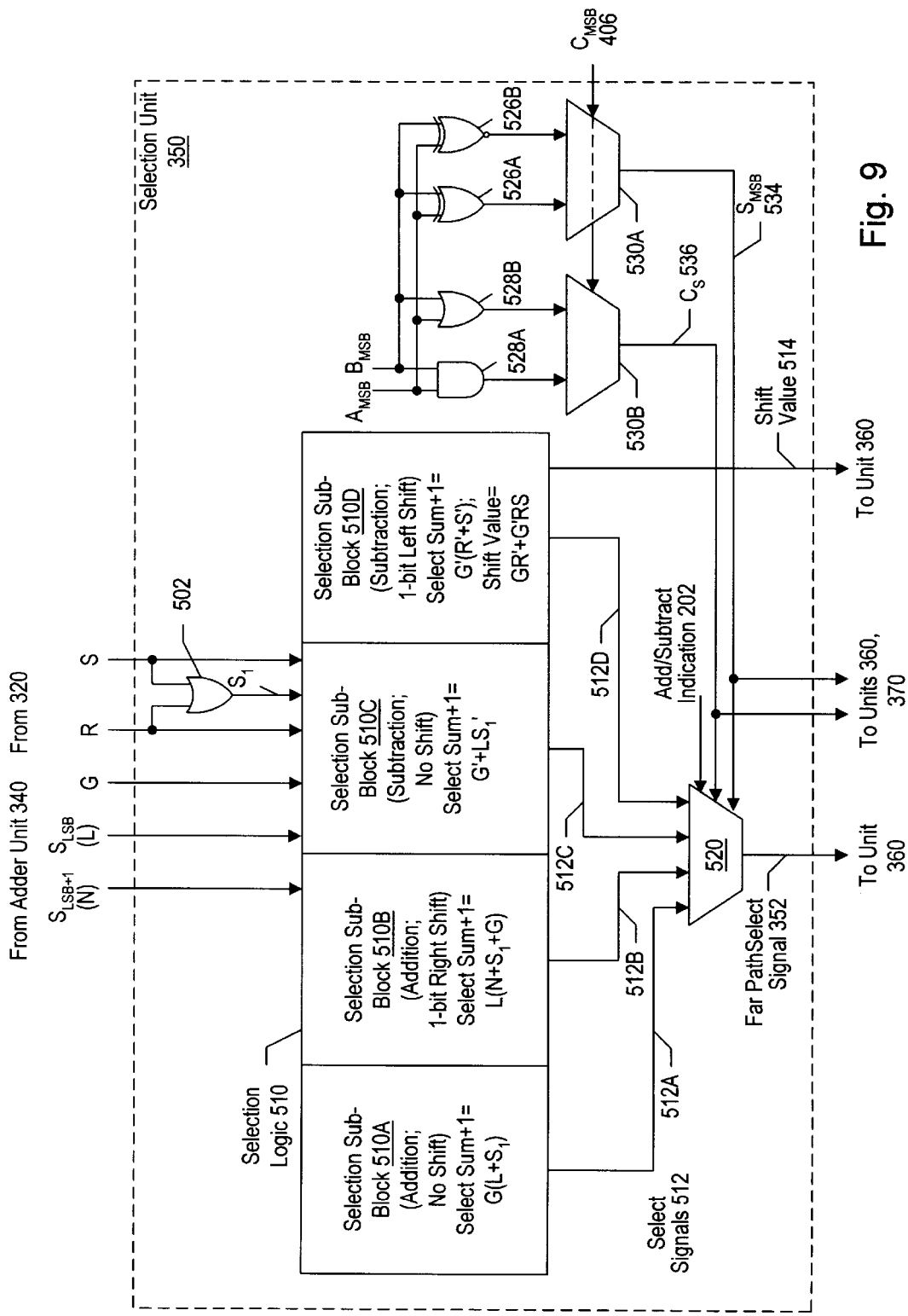
FIG. 9 is a block diagram of one embodiment of a selection unit within the far data path of FIG. 6.

Turning now to FIG. 9, a block diagram of selection unit 350 is shown in one embodiment of far data path 230. The general operation of selection unit 350 is described first, followed by examples of far path computations.

As shown, selection unit 350 receives a plurality of inputs from adder unit 340. These inputs include, in one embodiment, the inputs to adder 400A block 402B ($A_{MSB}$, $B_{MSB}$, and $C_{MSB}$), the next-to-least significant bit (N) of adder output 342A, the least significant bit (L) of adder output 342B, and the guard (G), round (R), and sticky (S) bits from GRS logic unit 320. A logical-OR of the round and sticky bits, $S_1$, is produced by logic gate 502. Bit $S_1$ is used for calculations in which R is not explicitly needed. Selection unit 350 also includes a selection logic block 510 which includes selection sub-blocks 510A–D. In response to the inputs received from units 320 and 340, sub-blocks 510A–D generate respective select signals 512A–D. Select signals 512 are conveyed to a far path multiplexer 520, which also receives control signals including add/subtract indication 202, $S_{MSB}$ signal 534, and $C_S$ signal 536. $S_{MSB}$ signal 534 is conveyed from a multiplexer 530A, while $C_S$ is conveyed from a multiplexer 530B. In response to these control signals, multiplexer 520 conveys one of select signals 512 as far path select signal 352 to multiplexer-shift unit 360.

As described above, adder unit 340 is configured to generate sum and sum+1 for operands 204A and 240B. Selection unit 350 is configured to generate far path select signal 352 such that the sum/sum+1 is a) corrected for one's complement subtraction and b) rounded correctly according to the BEEE round-to-nearest mode. In general, a number generated by one's complement subtraction must have 1 added in at the LSB to produce a correct result. Depending on the state of the G, R, and S bits, however, such correction may or may not be needed. With respect to rounding, sum+1 is selected in some instances to provide a result which is rounded to the next highest number. Depending on various factors (type of operation, normalization of output 342A), sum or sum+1 is selected using different selection equations. Accordingly, selection sub-blocks 510A–D speculatively calculate selection values for all possible scenarios. These selection values are conveyed to multiplexer 520 as select signals 512A–D. Control signals 302, 534, and 536 indicate which of the predicted select signals 512 is valid, conveying one of signals 512 as far path select signal 352.

Figure 10A:
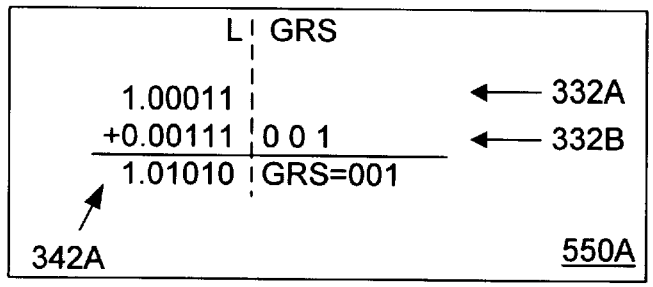
Figure 10B:
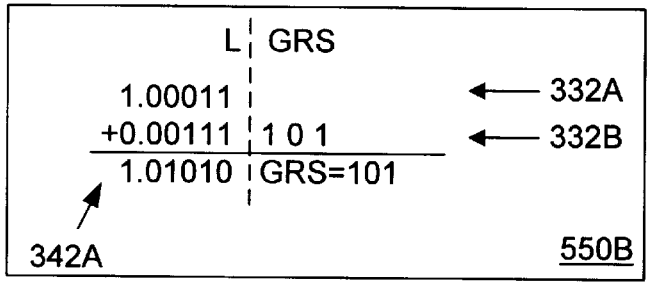

Turning now to FIGS. 10A–B, examples of addition accurately predicted by selection sub-block 510A are shown. Since sub-block 510A only predicts for addition, selection of sum+1 is used for rounding purposes only. FIG. 10A depicts an addition example 550A in which sum is selected. Rounding is not performed since $G(L+S_1)$ is not true. Conversely, FIG. 10B depicts an addition example 550B in which sum+1 is selected. Because G and $S_1$ are set, the result is closer to 1.01011 than to 1.01010. Accordingly, sum+1 (1.01011) is selected.

Figure 10C:
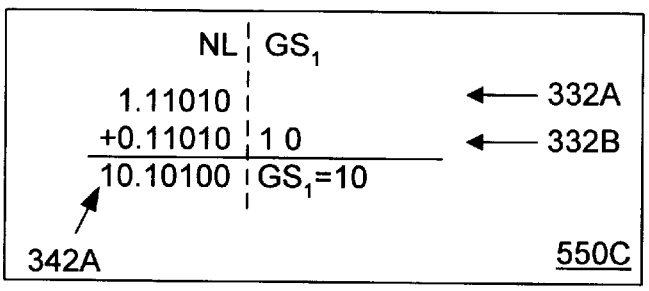
Figure 10D:
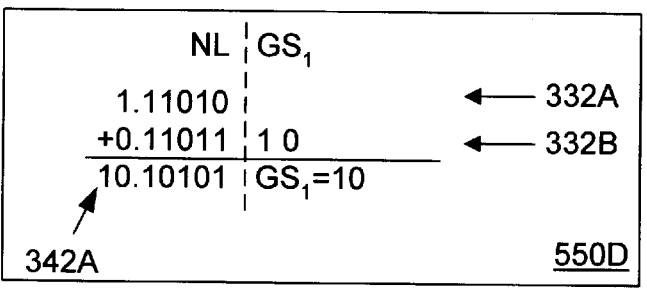

Turning now to FIGS. 10C–10D, examples of addition accurately predicted by selection sub-block 510B are shown. Since sub-block 510B only predicts for addition, selection of sum+1 is used for rounding purposes only. The examples shown in FIGS. 10C–D are similar to those shown in FIGS. 10A–B except that overflow conditions are present in examples 550C–D shown in FIGS. 10C–D. Accordingly, the equation for selecting sum+1 is slightly different than for selection sub-block 510A. FIG. 10C depicts an addition example 550C in which sum is selected. Conversely, FIG. 10D depicts an addition example 550D in which sum+1 is selected, effectively rounding up the result (after a 1-bit right shift to correct for overflow). Selection sub-block 510B selects sum+1 according to the equation $L(N+G+S_1)$.

Figure 10E:
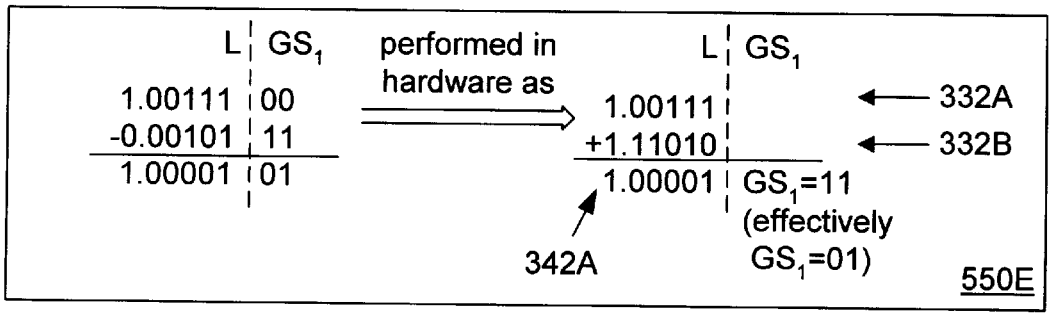

Turning now to FIGS. 10E–F, examples of addition accurately predicted by selection sub-block 510C are shown. Since sub-block 510C is used to predict selection for subtraction operations which have properly normalized results, selection of sum+1 is performed to correct for one's complement subtraction and for rounding purposes. As shown in example 550E, sum is indicated by select signal 512C since the guard and sticky bits are set before the subtract (ensuring that the result of the subtraction is closer to sum than sum+1). Conversely, in example 550F, the guard and sticky bits are both zero. Accordingly, a one-bit addition to the LSB is needed; therefore, sum+1 is selected. Generally speaking, selection sub-block 510C selects sum+1 according to the equation G'+LS$_1$', where G' and S$_1$' represent the complements of the G and S$_1$ bits.

Turning now to FIGS. 10G–H, examples of addition accurately predicted by selection sub-block 510D are shown. Since sub-block 510D is used to predict selection for subtract operations which require a 1-bit left shift of the result, selection of sum+1 is performed for both one's complement correction and rounding. In example 550G, sum is chosen as the result since both the guard and round bits are set before the subtract (ensuring that the result of the subtraction is closer to sum than sum+1). For this particular example, a zero is shifted into the LSB when the result is normalized. (In other examples, a one may be shifted in). In example 550H, both the guard and round bits are zero, which causes the result of the subtraction to be closer to sum+1 than sum. Accordingly, sum+1 is selected. A zero is shifted in at the LSB. Generally speaking, selection sub-block 510D selects sum+1 according to the equation G'(R'+S'), while the shift value is generated according to the equation GR'+G'RS.

It is noted that other embodiments of selection unit 350 are also possible. For example, in selection sub-blocks 510C and 510D, the guard and round bit inputs may be inverted if the sticky bit is set, resulting in different rounding equations. Various other modifications to the selection logic are possible as well.

Figure 11:
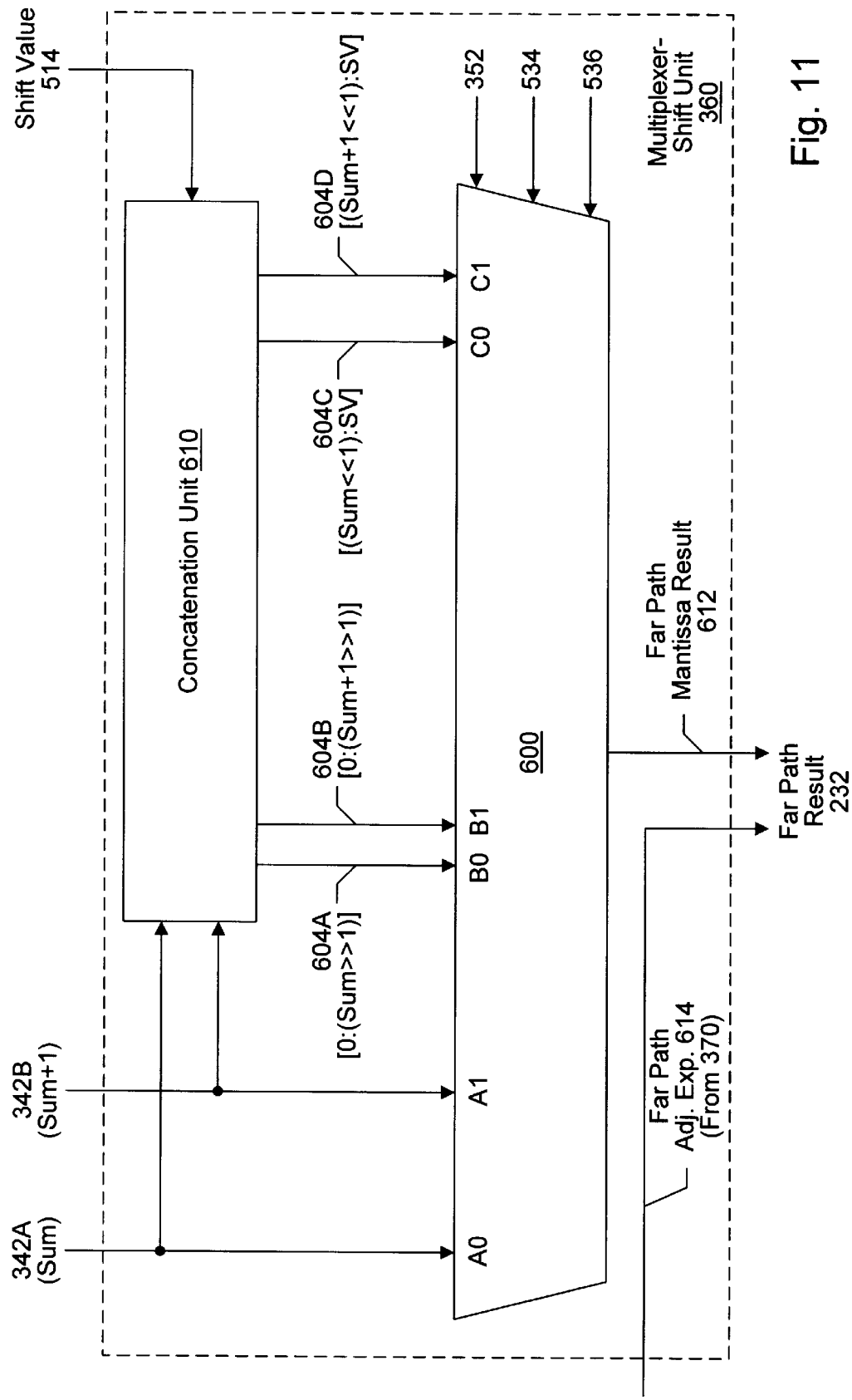
FIG. 11 is a block diagram of one embodiment of a multiplexer-shift unit within the c data path of FIG. 6.

Turning now to FIG. 11, a block diagram of multiplexer-shift unit 360 is depicted in one embodiment of far data path 230. As shown, multiplexer-shift unit 360 is coupled to receive adder outputs 342A–B and shift value 514. A concatenation unit 610 receives outputs 342 and shift value 514, and conveys shifted multiplexer outputs 604A–D to multiplexer 600. Multiplexer 600 receives signals 352 (far path select signal), 534 (S$_{MSB}$), and 536 (C$_{MSB}$) as control inputs. In response to these control signals, multiplexer 600 selects one of signals 342 or 604 as far path mantissa result 612. The exponent portion of far path result 232 is conveyed by exponent adjustment unit 370, which adjusts the original larger exponent value, in one embodiment, by the amount of normalization (or correction for overflow) required by the result.

As shown, multiplexer 600 includes three groups of inputs, denoted as A, B, and C. Inputs A0 and A1 are adder outputs 342, representing sum and sum+1. Inputs B0 and B1 (signals 604A–B), on the other hand, represent adder outputs 342 adjusted for overflow (a '0' is routed as the MSB by concatenation unit 610). Finally, inputs C0 and C1 represent adder outputs 342 after a one-bit left shift. Concatenation unit 610 utilizes the shift value conveyed from selection sub-block 510D to append as the LSB of the conveyed outputs 604C–D.

In one embodiment, signals 534 and 536 are usable to determine whether adder output 342A is normalized properly (input group A), has an overflow condition (input group B), or requires a one-bit left shift (input group C). Far path select signal 352 is then usable to determine which input within the selected input group is to be conveyed as far path mantissa result 612.

Figure 12:
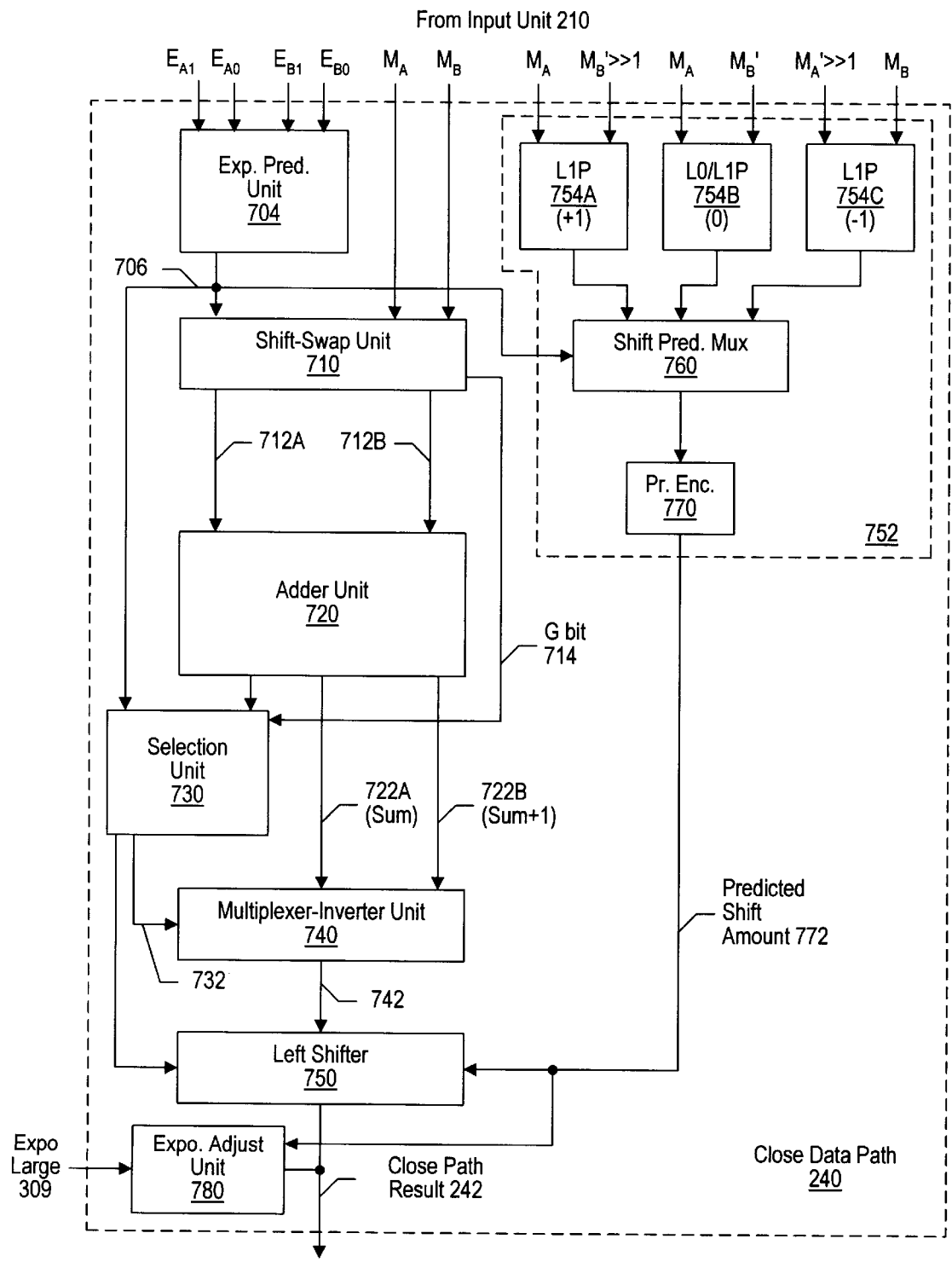
FIG. 12 is a block diagram of one embodiment of a close data path within the add/subtract pipeline of FIG. 5.

Turning now to FIG. 12, a block diagram of one embodiment of close data path 240 is depicted. As described above, close data path 240 is configured to perform effective subtraction operations for operands having an absolute exponent difference of 0 or 1. Subtraction operations with operands having other absolute exponent difference values (and all addition operations) are handled as described above in far data path 230.

As shown, close data path 240 receives a variety of inputs from input unit 210. Close data path 240 includes an exponent prediction unit 704, which receives the two least significant exponent bits of exponents E$_A$ and E$_B$. In one embodiment, exponent prediction unit 704 generates a prediction 706 regarding the relationship of the full values of E$_A$ and E$_B$ As shown in Table 1, prediction 706 may be one of four values: 0 (predicting E$_A$=E$_B$), +1 (predicting E$_A$=E$_B$+1), −1 (predicting E$_B$=E$_A$+1), and X (predicting d≧1, meaning the result of close path 240 is invalid). It is noted that in other embodiments, different values for prediction 706 are possible.

TABLE 1

| E$_{A1}$ | E$_{A0}$ | E$_{B1}$ | E$_{B0}$ | Pred. |
|---|---|---|---|---|
| 0 | 0 | 0 | 0 | 0 |
| 0 | 0 | 0 | 1 | −1 |
| 0 | 0 | 1 | 0 | X |
| 0 | 0 | 1 | 1 | +1 |
| 0 | 1 | 0 | 0 | +1 |
| 0 | 1 | 0 | 1 | 0 |
| 0 | 1 | 1 | 0 | −1 |
| 0 | 1 | 1 | 1 | X |
| 1 | 0 | 0 | 0 | X |
| 1 | 0 | 0 | 1 | +1 |
| 1 | 0 | 1 | 0 | 0 |
| 1 | 0 | 1 | 1 | −1 |
| 1 | 1 | 0 | 0 | −1 |
| 1 | 1 | 0 | 1 | X |
| 1 | 1 | 1 | 0 | +1 |
| 1 | 1 | 1 | 1 | 0 |

Because exponent prediction unit 704 only operates on the two least significant bits, the prediction may often be correct, due to differences in the upper order bits not considered by unit 704. For this reason, in one embodiment, the actual exponent difference is computed in far data path 230 and utilized as a final select signal to determine whether far path 230 or close path 240 includes the correct result value.

Data path 240 further includes a shift-swap unit 710, which is coupled to receive an exponent prediction from unit 704, as well as mantissa values M$_A$ and M$_B$ from input unit 210. Shift-swap unit 710, in response to receiving the input mantissa values, generates shifted mantissa values 712A–B, which are conveyed to an adder unit 720. Unit 710 additionally generates a guard bit 714 which is conveyed to selection unit 730. Adder unit 720 is configured to generate a plurality of outputs (722A–B), representing sum and sum+1, respectively. Adder unit 720 also conveys a plurality of signals to selection unit 730 as will be described below. Selection unit 730, in response to receiving an exponent prediction from unit 704 and a plurality of control signals from adder unit 720 and shift-swap unit 710, generates a close path select signal 732, conveyed to a multiplexer-inverter unit 740. Signal 732 is usable to select either adder output 722A or 722B to be conveyed as close path preliminary result 742. Result 742 is conveyed to a left shift unit 750, which also receives a shift value from selection unit 730 and a predicted shift amount 772. Left shift unit 750 is configured to shift close path preliminary result 742 left by a number of bits indicated by shift amount 772. In one embodiment, the shift value conveyed by selection unit 730 is shifted in at the LSB.

The output of left shift unit 750 is the mantissa portion of close path result 242. The exponent portion of close path result 242 is generated by an exponent adjustment unit 780, which receives the largest input exponent value 309 from far data path 230. Unit 780 is configured to adjust exponent 309 by predicted shift amount 772 to produce the final close path exponent. As will be described below, the value of this exponent portion may be off by one in some cases due to the nature of the prediction mechanism. In one embodiment, this possible error is checked and corrected if needed in the final multiplexer stage.

Predicted shift amount 772 is the output of a shift prediction unit 752. Unit 752, in one embodiment, is coupled to receive three sets of inputs at prediction units 754A–C. Prediction unit 754A is coupled to receive an unshifted version of mantissa value $M_A$, and a negated version of $M_B$ which is right-shifted by one bit (this represents a prediction that operand 204A has an exponent value one greater than the exponent value of operand 204B). Prediction unit 754B is coupled to receive unshifted, non-negated versions of $M_A$ and $M_B$, representing a prediction that the exponent values of both operands are equal. Finally, prediction unit 754C is coupled to receive an unshifted version of mantissa value $M_B$ and a negated version of $M_A$ which is right-shifted by one bit (representing a prediction that operand 204B has an exponent value one greater than the exponent value of operand 204A). The predictions of units 754A–C are concurrently conveyed to a shift prediction multiplexer 760, which receives an exponent prediction from unit 704 as a control signal. The output of shift prediction multiplexer 760 is conveyed to a priority encoder 770, which generates predicted shift amount 772.

Figure 13:
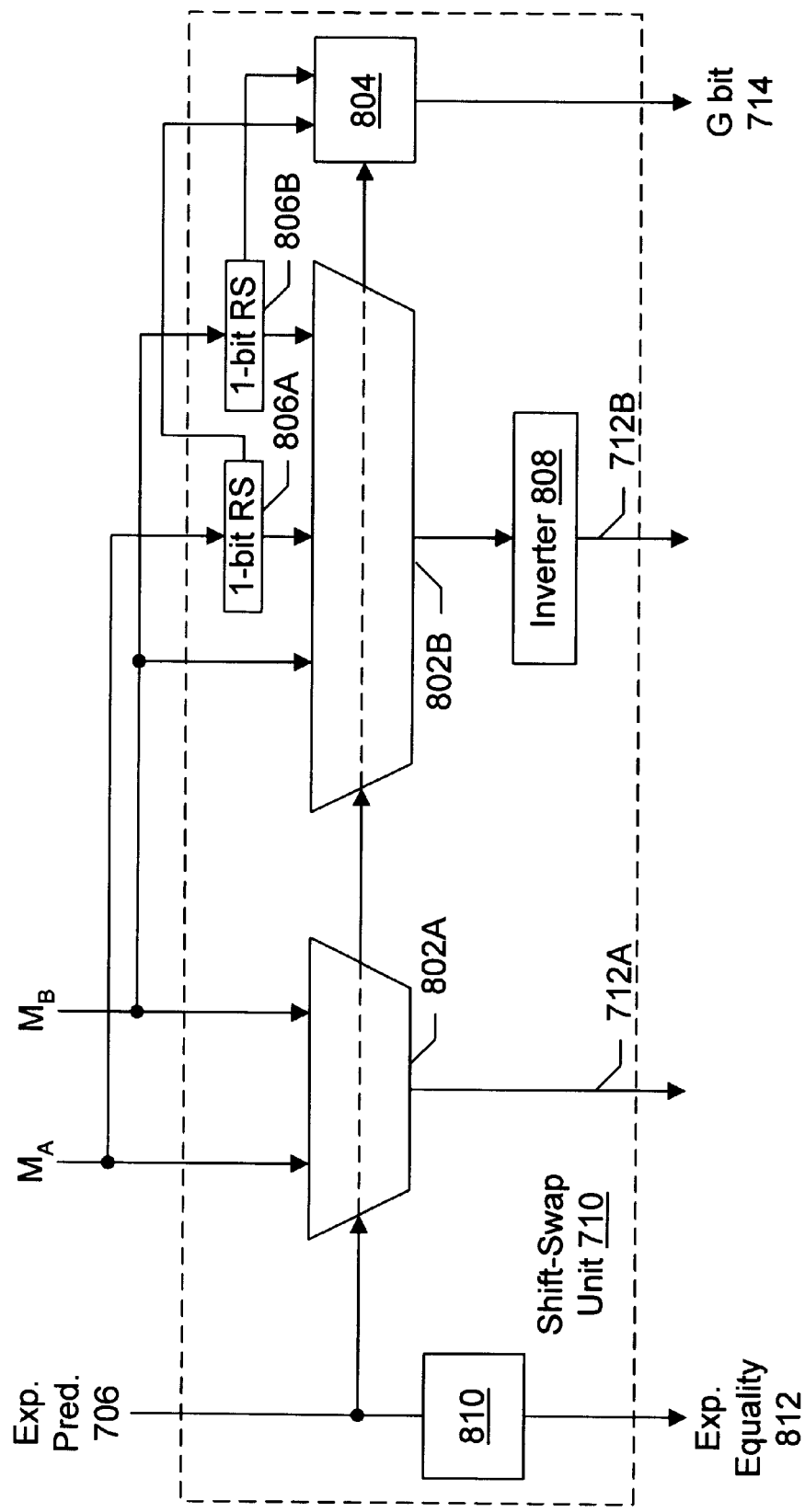
FIG. 13 is a block diagram of one embodiment of a shift-swap unit within the close data path of FIG. 12.

Turning now to FIG. 13, a block diagram of one embodiment of shift-swap unit 710 is shown. As shown, shift-swap unit 710 is coupled to receive exponent prediction value 706 from exponent prediction unit 704, as well as mantissa values $M_A$ and $M_B$ from input unit 210. Exponent prediction value 706 is conveyed to a pair of operand multiplexers 802A–B, as well as a guard bit generation unit 804.

Operand multiplexer 802A is coupled to receive unshifted versions of $M_A$ and $M_B$, while operand multiplexer 802B receives an unshifted version of $M_B$ and versions of $M_A$ and $M_B$ which are right shifted by one bit. These right shifted values are generated by a pair of right shift units 806. (In one embodiment, the shift units 806 simply route the bits of the input values one place rightward, appending a "0" as the MSB). If exponent prediction value 706 indicates that $E_A=E_B$, operand multiplexer 802A selects $M_A$ to be conveyed as shift output 712A and operand multiplexer 802B selects $M_B$ to be conveyed as shift output 712B. The output of guard bit generation unit 804, G bit 714, is not used (in one embodiment) in the equal exponent case. If exponent prediction 706 indicates that $E_A=E_B+1$, operand multiplexer 802A selects $M_A$ to be conveyed as shift output 712A, and operand multiplexer 802B selects a one-bit-right-shifted version of $M_B$ to be conveyed as shift output 712B. Additionally, the bit shifted out of $M_B$ is conveyed as guard bit 714. If exponent prediction 706 indicates that $E_B=E_A+1$, operand multiplexer 802A selects $M_B$ to be conveyed as a shift output 712A, while operand multiplexer 802B selects a one-bit-right-shifted version of $M_A$ to be conveyed as shift output 712B. Additionally, the bit shifted out Of $M_A$ is conveyed as guard bit 714. (If exponent prediction value 706 predicts the exponents are not valid close path values, the output of shift-swap unit 710 is undefined in one embodiment since the far path result is selected in such a case).

Since, in the embodiment shown, shift-swap unit 710 ensures that operand 712A is larger than operand 712B, the exponent difference for subsequent operations within close data path 240 is either 0 or 1 (−1 is no longer applicable). Accordingly, logic unit 810 is configured to receive exponent prediction value 706 and generate a corresponding exponent equality signal 812. As will be described below, exponent equality signal is utilized in selection unit 730 in order to generate close path select signal 732.

Because in the embodiment shown, close path 240 handles only subtraction operations, the output of multiplexer 802B, 712B, is inverted (one's complemented) before conveyance to adder unit 720.

Figure 14:
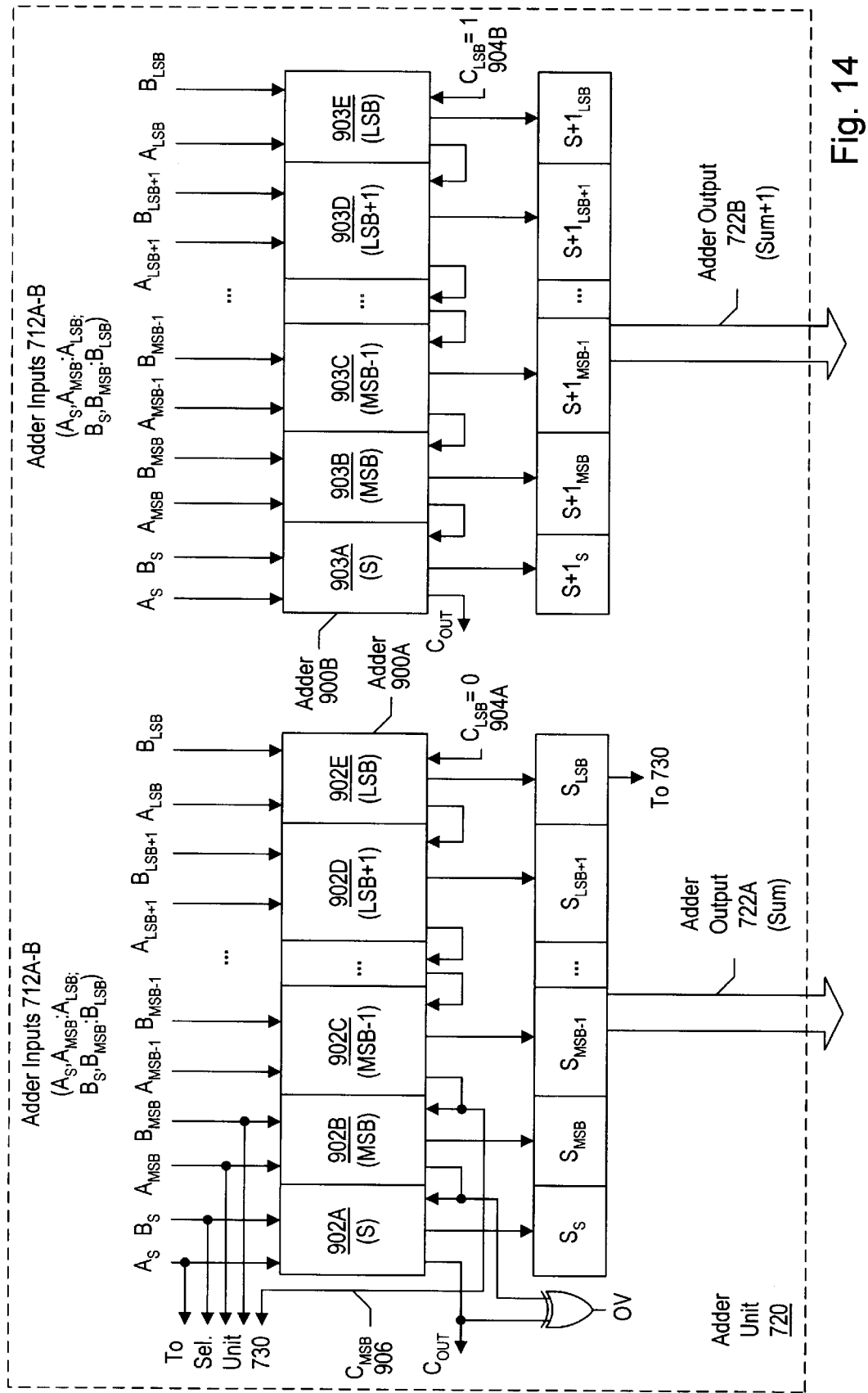
FIG. 14 is a block diagram of one embodiment of an adder unit within the close data path of FIG. 12.

Turning now to FIG. 14, a block diagram of one embodiment of adder unit 720 is depicted. As shown, adder unit 720 includes a pair of adders units, 900A–B. Adder unit 900A receives shift outputs/adder inputs 712A–B and carry in signal 904A, and generates an adder output 722A. Similarly, adder unit 900B receives shift outputs/adder inputs 712A–B and carry in signal 904B, and generates adder output 722B. Adder unit 720 generates outputs corresponding to sum and sum+1 by having carry in signal 904A at a logical zero and carry in signal 904B at a logical one.

As will be described below, selection unit 730 generates a signal which selects either adder output 722A or 722B based upon a number of input signals. Adder unit 720 conveys a number of signals to selection unit 730 which are used in this calculation. These signals include sign bits $A_S$ and $B_S$ of operands 204, most significant bits $A_{MSB}$ and $B_{MSB}$ of operands 204, carry in signal 906 to MSB adder block 902B, and least significant bit $S_{LSB}$ of result 722A. As with adders 400 described with reference to FIG. 8 above, adders 900A–B may be implemented as a single adder producing sum and sum+1.

Figure 15:
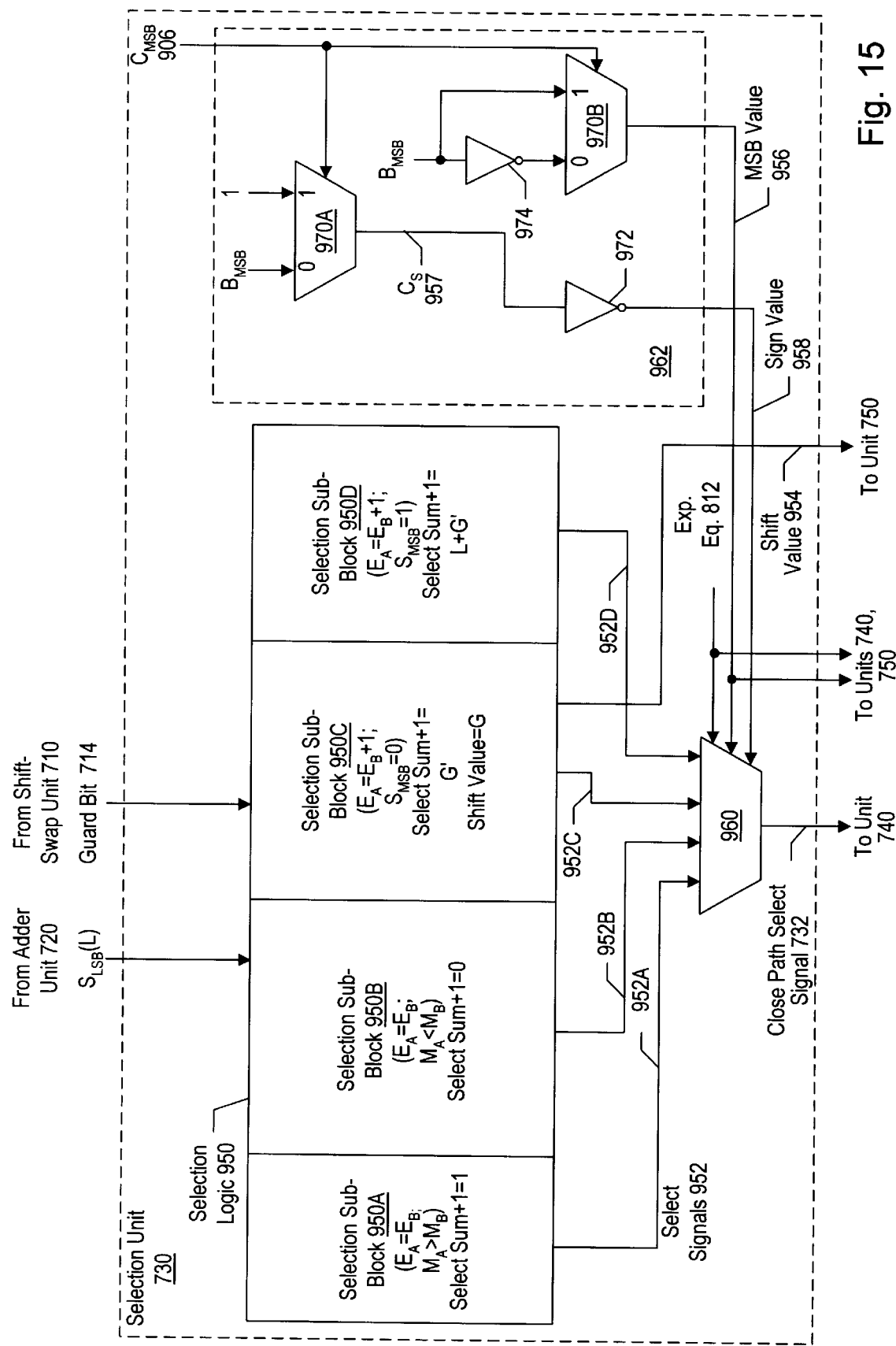
FIG. 15 is a block diagram of one embodiment of a selection unit 730 within the close data path of FIG. 12.

Turning now to FIG. 15, a block diagram of one embodiment of selection unit 730 is depicted. As shown, selection unit 730 receives a number of inputs in the embodiment shown, including least significant bit $S_{LSB}$ (L) from adder unit 720, guard bit (G) 714 from shift-swap unit 710, most significant bit $B_{MSB}$, $C_{MSB}$ 906, and exponent equality signal 812, indicating whether exponents $E_A$ and $E_B$ are equal or differ by one. Selection unit 730 includes a selection logic block 950, which includes a plurality of selection sub-blocks 950A–D. Each sub-block 950A–D generates a corresponding select signal 952. Selection sub-block 950D also generates a shift value 954, which is conveyed to left shift unit 750. Select signals 952A–D are conveyed to a close path result multiplexer 960, which also receives a plurality of control signals. These control signals include exponent equality signal 812, an MSB value 956, and a sign value 958.

In one embodiment, MSB value 956 and sign value 958 are generated by a prediction select unit 962. As shown, prediction select unit 962 includes two multiplexers 970A–B. Multiplexer 970A is coupled to receive $B_{MSB}$, and also has another input hardwired to receive a logic high signal. The output of multiplexer 970A, $C_S$ 957, is selected by $C_{MSB}$ 906. $C_S$ 957 is inverted by inverter 972 and conveyed as sign value 958, representing the sign of the output of adder unit 720. Multiplexer 970B, on the other hand, is configured to receive inverted and non-inverted versions of $B_{MSB}$. $C_{MSB}$ also provides selection for multiplexer 970B. The output of 970B is conveyed to multiplexer 960 as the MSB of the output of adder unit 720.

Because close data path 240 performs subtraction operations for a limited set of operands ($E_{diff} \leq 1$), only a small number of cases must be considered in order to perform prediction of selection values. In the embodiment shown, there are four cases (corresponding to four predicted select values 952) covered by selection logic 950. Selection sub-block 950A corresponds to the case in which the operand exponents are equal ($E_A=E_B$) and the subtraction result is positive ($M_A$>$M_B$). For this particular case, since there is no borrow from the guard bit position, the output of selection sub-block 950A (952A) always indicates a predicted selection of adder output 722B (sum+1). Selection sub-block 950B corresponds to the case in which the operand exponents are equal ($E_A$=$E_B$) and the subtraction result is negative ($M_A$<$M_B$). Since this case results in a negative number, the output of selection sub-block 950B (952B) always indicates a predicted selection of adder output 722A (sum). (As will be described below, this value is later inverted to return it to sign-magnitude form). Selection sub-block 950C corresponds to the case in which the exponent values differ by one ($E_A$=$E_B$+1) and adder output 722A (sum) is not normalized ($S_{MSB}$=0). It is noted that, in the embodiment shown, at this stage in the pipeline, the possible exponent difference is either 0 or 1 since the operands are swapped (if needed) in shift-swap unit 710. Thus, while an exponent difference of −1 may exist for operands entering close data path 240, the inputs to selection logic block 950 have an exponent difference of either 0 or 1. Selection sub-block 950C generates a predicted selection value (952C) equal to the complement of guard bit 714. If the guard bit is zero, there is no borrow from the LSB, and adder output 722B (sum+1) is indicated by selection value 952C. Furthermore, shift value 954 is zero. Conversely, if the guard bit is one, there is a borrow from the LSB. This effectively cancels out the need for correction of one's complement subtraction, accordingly, adder output 722A (sum) is selected (and guard bit 714 is conveyed as shift value 954). Lastly, selection sub-block 950D corresponds to the case in which the exponent values differ by one ($E_A$=$E_B$+1) and adder output 722A (sum) is normalized ($S_{MSB}$=1). Selection sub-block 950D generates a predicted selection value (952D) which is indicative of (sum+1) according to the equation L+G', where G' represents the complement of guard bit 714. (If G=0, there is no borrow from the LSB and sum+1 is selected. If L=0 and G=1, there is a borrow, so sum is selected. If L=1 and G=1, there is a borrow, but rounding occurs, so sum+1 is selected).

It is noted that in one embodiment, selection logic 730 includes a separate zero detect unit which is configured to recognize the case when the result of the close path subtraction is zero ($E_A$=$E_B$ and $M_A$=$M_B$). A separate zero detect unit may be utilized because in floating point representations such as IEEE standard 754, zero values are treated in a special fashion. A zero detect unit is not pictured in FIG. 15 for simplicity and clarity.

Select signals 952A–D are conveyed to close path result multiplexer 960. The control signals also received by multiplexer 960 are usable to convey one of select signals 952 as close path select signal 732. As described above, these control signals for multiplexer 960 include, in one embodiment, exponent equality value 812, MSB value 956, and sign value 958. Exponent equality signal 812 is usable to determine whether close path select signal is one of signals 952A–B (equal exponents) or 952C–D (unequal exponents). If exponent equality signal 812 is indicative of equal exponents, sign value 958 is usable to determine whether adder output 722A is positive or negative. Accordingly, either signal 952A or 952B may be selected. Alternately, if exponent equality signal 812 is indicative of unequal exponents, MSB value 956 may be utilized to determine whether adder output 722A is properly normalized, allowing for selection of either signal 952C or 952D.

Although sign and MSB values are generated by adder unit 720 and are included in adder output 722A, MSB value 956 and sign value 958 are generated in parallel by selection unit 730. This allows close path select signal to be determined more quickly and speed operation of close data path 240. In order to perform this parallel generation, $B_{MSB}$ and $C_{MSB}$ are conveyed from adder unit 900A. (It is noted that for the embodiment of close data path 240 depicted in FIG. 15, $A_{MSB}$=1, $A_S$=1, and $B_S$=1. This allows the logic of prediction unit 962 to be simplified).

MSB value 956 is generated by multiplexer 970B using $C_{MSB}$ 906, which is the carry in signal to the MSB of adder output 722A. Because it is known that $A_{MSB}$=1, $S_{MSB}$ is thus equal to $B_{MSB}$' if $C_{MSB}$=0, and $B_{MSB}$ if $C_{MSB}$=1. MSB value 956 may thus be quickly generated and conveyed to multiplexer 960.

Sign value 958 is generated by multiplexer 970A and inverter 972. Because $A_{MSB}$=1 for close data path 240, a carry out of the MSB of adder output 722A (referred to in FIG. 15 as $C_S$) is dependent upon $C_{MSB}$ 906. If $C_{MSB}$ 906 is 0, $C_S$ 957 is equal to $B_{MSB}$; otherwise, $C_S$ 957 is 1. With $A_S$=1 and $B_S$=0, the sum of the sign bit of adder output 722A is thus equal to the inverted value of $C_S$ 957. The output of inverter 972 is conveyed to multiplexer 960 as sign value 958.

Other embodiments of prediction selection unit 962 are also contemplated. For instance, $C_{MSB}$ signal 957 may be directly conveyed from adder unit 900A instead of being generated by prediction selection unit 960. Various other embodiments of unit 960 are also possible.

Figure 16A:
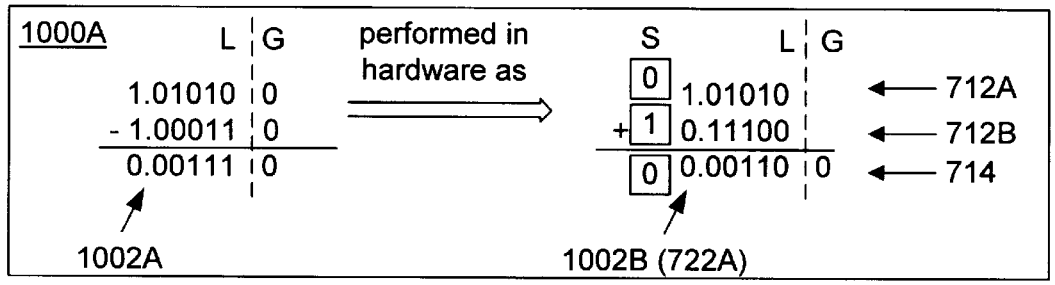
FIGS. 16A–G are examples of subtraction performed within the close data path of FIG. 12.

Turning now to FIG. 16A, an example 1000A of subtraction within close data path 240 is shown according to one embodiment of the invention. Example 1000A is representative of the close path case predicted by selection sub-block 950A, in which $E_A$=$E_B$ and $M_A$>$M_B$. Because guard bit 714 is zero in this case, no borrowing is performed and the correction for one's complement addition is always needed. (This can be seen in the difference between actual result 1002A and computed result 1002B, which corresponds to adder output 722A). As a result, adder output 722B, or sum+1, is indicated by select signal 952A.

Figure 16B:
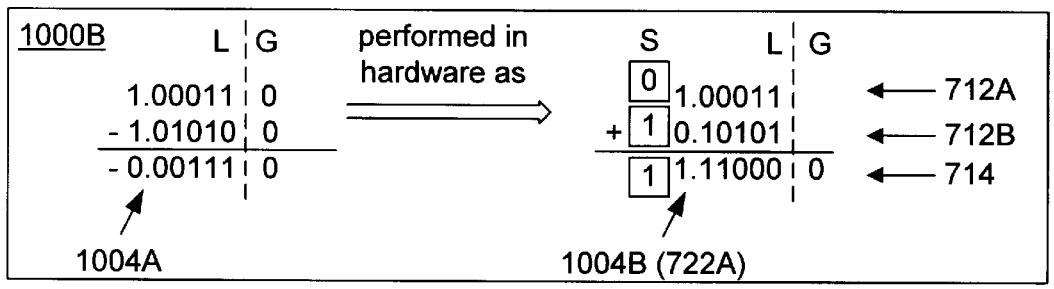

Turning now to FIG. 16B, an example 1000B of subtraction within close data path 240 is shown according to one embodiment of the invention. Example 1000B is representative of the close path case predicted by selection sub-block 950B, in which $E_A$=$E_B$ and $M_B$>$M_A$. As with example 1000A, guard bit 714 is zero in this case, so borrowing is not performed. Because $M_B$ is larger than $M_A$, however, the subtraction result is negative. It is noted that actual result 1004A is the bit-inverted (one's complement) of computed result 1004B, which corresponds to adder output 722A. Accordingly, actual result 1004A may be computed by selecting adder output 722A for this case, inverting the resultant mantissa, and setting the sign bit of the result to indicate a negative number. This relationship may be seen from the following formulas:

$$S = A + B'; \quad (4)$$

$$S = A + 1\text{'s comp}(B); \quad (5)$$

$$S' = 1\text{'s comp}(A + 1\text{'s comp}(B)); \quad (6)$$

$$S' = 2^N - (A + 2^N - B - 1) - 1; \quad (7)$$

$$S' = B - A. \quad (8)$$

Figure 16C:
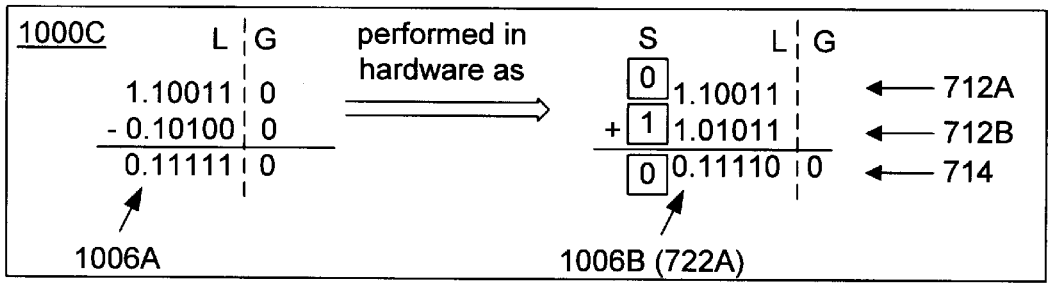

Turning now to FIG. 16C, an example 1000C of subtraction within close data path 240 is shown according to one embodiment of the invention. Example 1000C is representative of the close path case predicted by selection sub-block 950C, in which $E_A = E_B + 1$ and $S_{MSB} = 0$. As shown in FIG. 15, adder output 722B (sum+1) is indicated by select signal 952C according to the equation G'. As can be seen in example 1000C, the fact that G=0 results in no borrowing, and actual result 1006A is equal to computed result 1006B plus one. Accordingly, adder output 722B (sum+1) is selected.

Figure 16D:
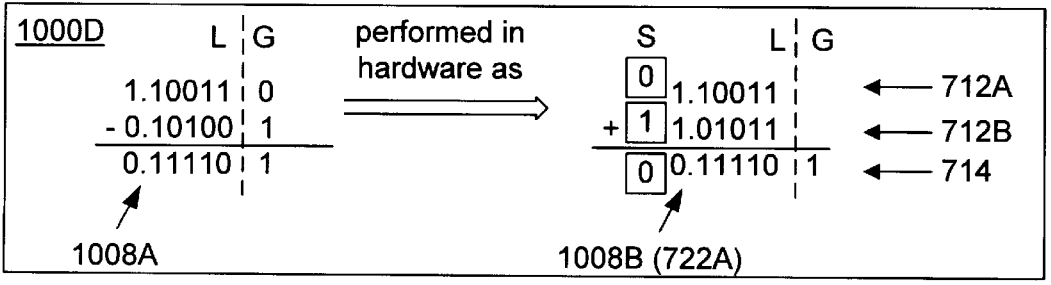

Turning now to FIG. 16D, an example 1000D of subtraction within close path 240 is shown for the case predicted by selection sub-block 950C in which G=1. In this case, there is a borrow from the LSB since guard bit 714 is set. Accordingly, select signal 952C is indicative of adder output 722A (sum). This can be seen from the fact that actual subtraction result 1008A is equal to computed subtraction result 1008B.

Figure 16E:
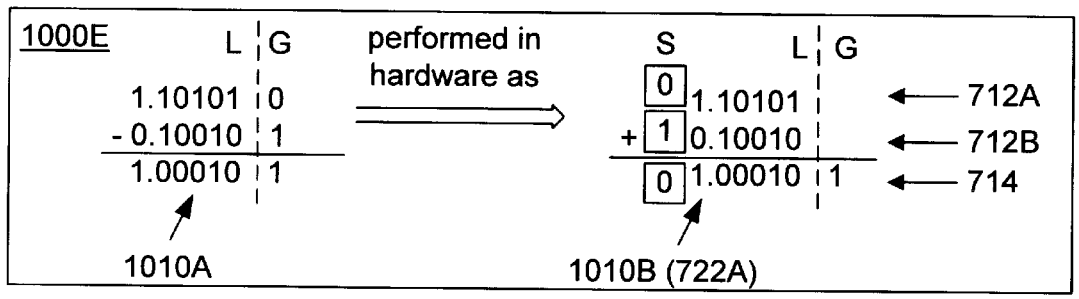

Turning now to FIG. 16E, an example 1000E of subtraction within close path 240 is shown for the case predicted by selection sub-block 950D in which L=0 and G=1. Example 1000E is representative of the close path case predicted by selection sub-block 950D, in which $E_A = E_B + 1$ and $S_{MSB} = 1$. As shown in FIG. 15, adder output 722B (sum+1) is indicated by select signal 952D according to the equation L+G'. In example 1000E, a borrow is performed, canceling out the need for the one's complement correction. Furthermore, no rounding is performed since L=0. Accordingly, adder output 722A (sum) is selected by select signal 952D. This can be seen from the fact that actual subtraction result 1010A in FIG. 16E is equal to computed subtraction result 1010B.

Figure 16F:
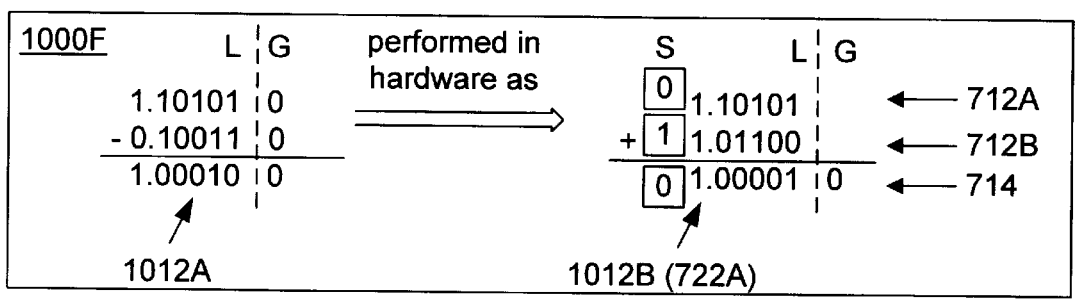

Turning now to FIG. 16F, an example 1000F of subtraction within close path 240 is shown for the case predicted by selection sub-block 950D in which L=1 and G=0. In contrast to example 1000E, no borrow is performed in example 1000F, necessitating a one's complement correction of +1. Accordingly, adder output 722B (sum+1) is selected by select signal 952D. This can be seen from the fact that actual subtraction result 1010A in FIG. 16E is equal to computed subtraction result 1010B plus one.

Figure 16G:
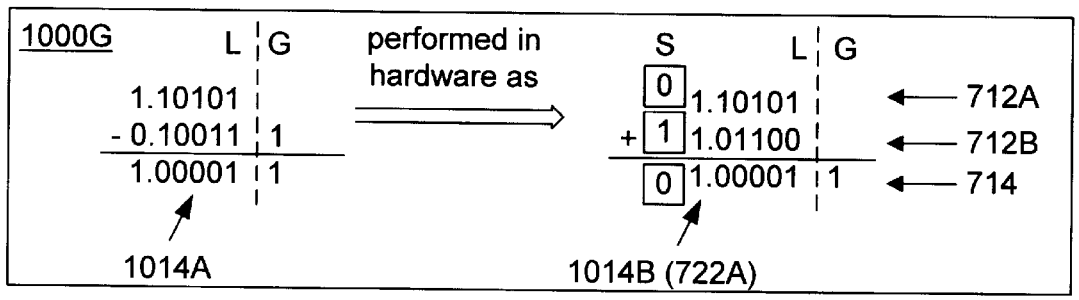

Turning now to FIG. 16G, an example 1000G of subtraction within close path 240 is shown for the case predicted by selection sub-block 950D in which L=1 and G=1. As with example 1000E, a borrow is performed from the LSB, cancelling the need for a one's complement correction of +1. Because both the LSB and guard bit are set in the result, however, the subtraction result is rounded up, according to an embodiment in which results are rounded to the nearest number (an even number in the case of a tie). Accordingly, even though actual subtraction result 1014A and computed subtraction result 1014B are equal, adder output 722B is selected, effectively rounding the difference value to the nearest number (which is chosen to be the even number since the computed subtraction result 1014B is halfway between two representable numbers).

Figure 17:
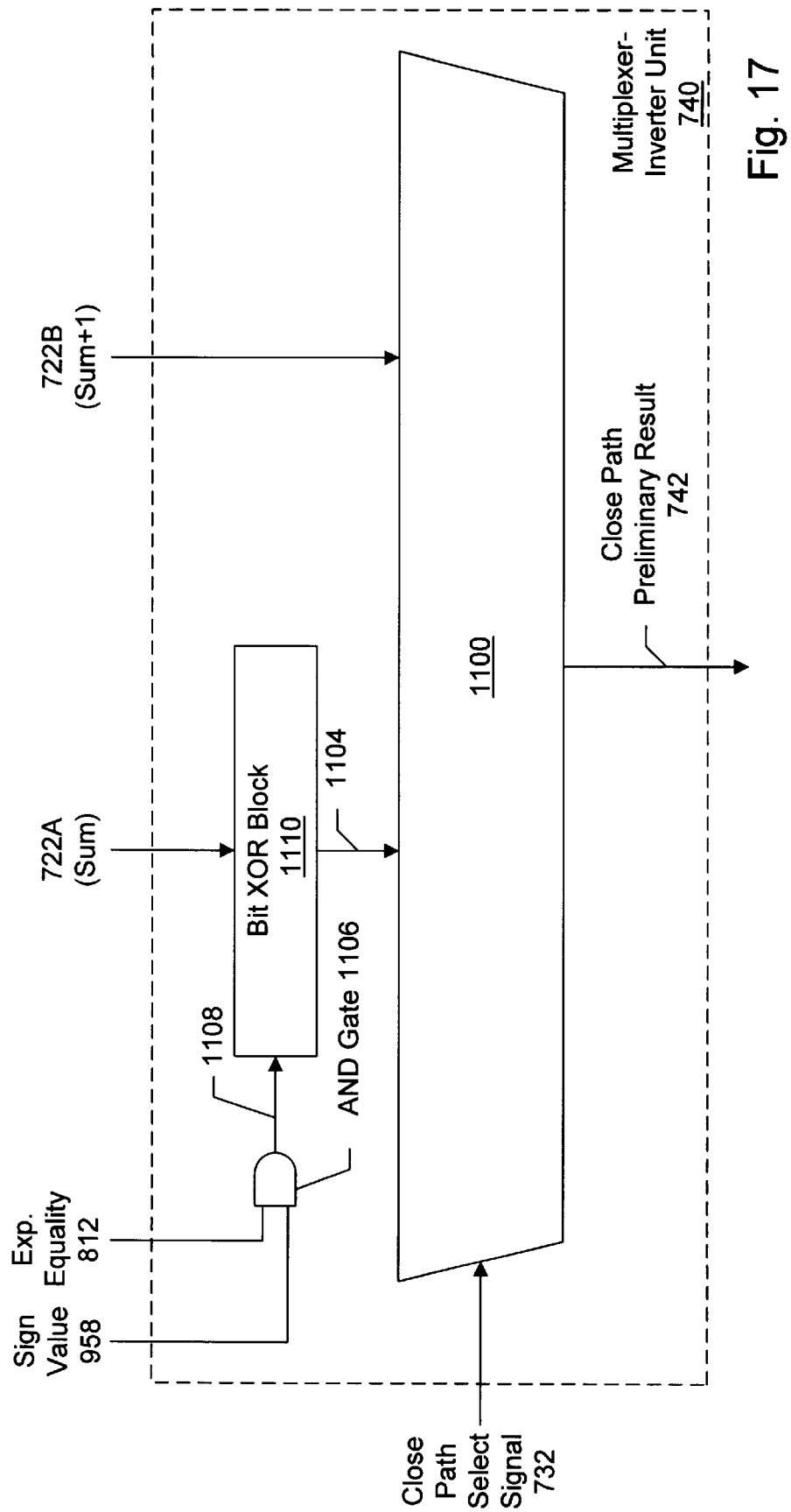
FIG. 17 is a block diagram of one embodiment of a multiplexer-inverter unit 740 within the close data path of FIG. 12.

Turning now to FIG. 17, a block diagram of one embodiment of multiplexer-inverter unit 740 is shown. Unit 740 is configured to select one of adder outputs 722 as close path preliminary result 742. Result 7412 is then conveyed to left shifter 750, described below with reference to FIG. 18.

Multiplexer-inverter unit includes an AND gate 1106, a bit XOR block 1110, and a close path result multiplexer 1100. Bit XOR block 1110 is coupled to receive adder output 722A, as well as XOR enable signal 1108 from AND gate 1106. XOR enable signal 1108 is asserted for the case (described above with reference to FIG. 16B) in which $E_A = E_B$ and $M_B > M_A$. Bit XOR block 1110, in one embodiment, includes a two-input XOR gate for each bit in adder output 722A. One input of each XOR gate is a corresponding bit of output 722A; the other bit is XOR enable signal 1108. If signal 1108 is de-asserted, then, XOR block output 1104 is identical to adder output 722A. If signal 1108 is asserted, however, XOR block output 1104 is equal to the one's complement of adder output 722A. Signal 1108 is only enabled for the case in which the result of the close path subtraction is negative.

In addition to receiving XOR block output 1104, close path result multiplexer 1100 also receives adder output 722B. Close path select signal 732, calculated in selection unit 730 as described above, is usable to select either output 1104 or 722B to be conveyed as close path preliminary result 742. Result 742 is then conveyed to left shift unit 750, described next with reference to FIG. 18.

Figure 18:
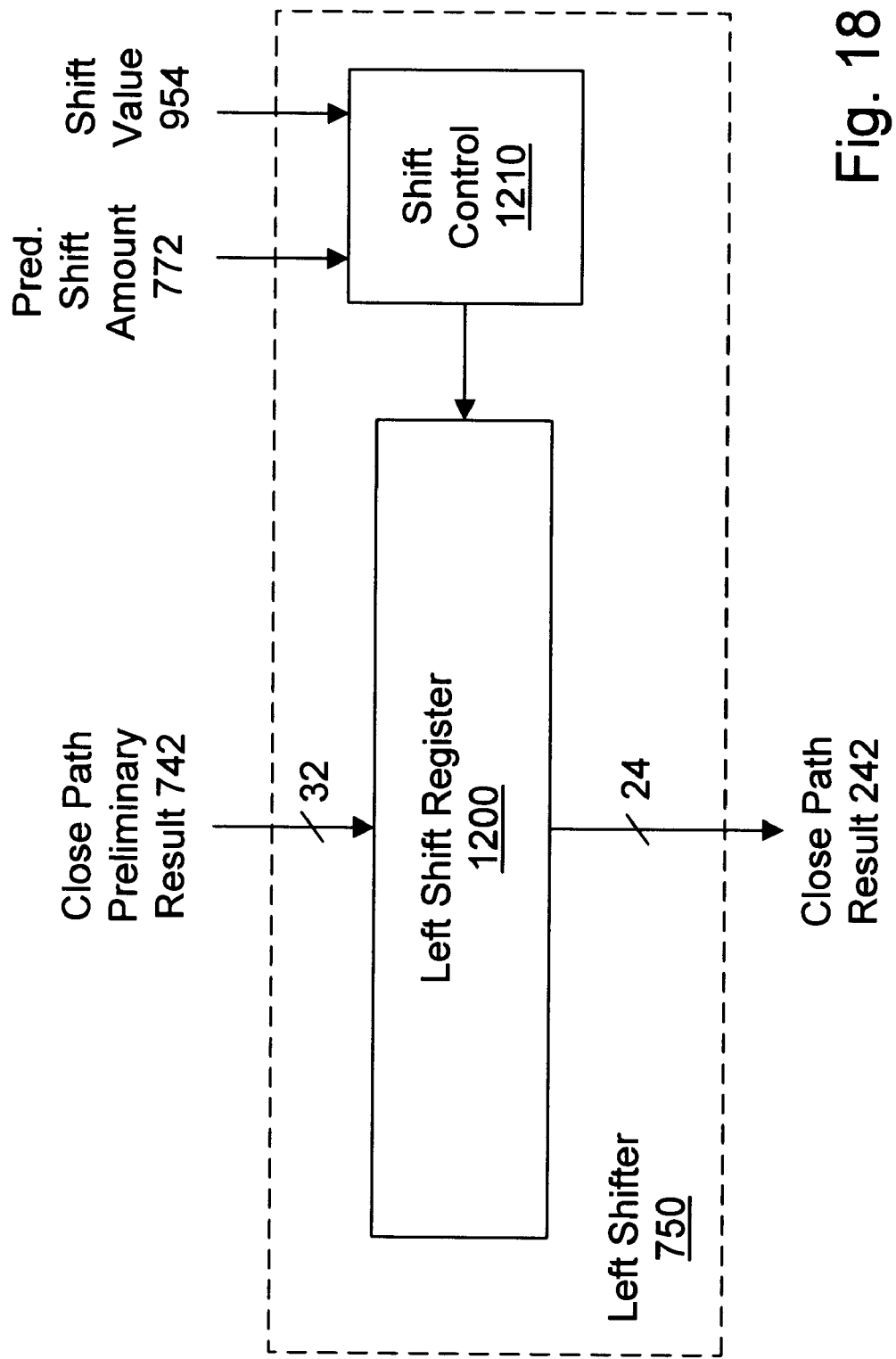
FIG. 18 is a block diagram of one embodiment of a left shift unit 750 within the close data path of FIG. 12.

By selecting sum or sum+1as preliminary result 742, multiplexer-inverter unit 740 is configured to quickly perform the IEEE round-to-nearest operation. By generating more than one close path result and selecting from between the results (according to various rounding equations), a result 742 is generated for forwarding to a normalization unit (left shifter). The value conveyed to the normalization unit of FIG. 18 is such that shifted output value is correctly rounded to the nearest number. This rounding apparatus advantageously eliminates the need to perform an add operation (subsequent to the add operation of adder unit 720) in order to perform rounding. Additionally, recomplementation is also achieved quickly since adder output 722A need only be inverted rather than having to perform a two's complement invert and add.

Turning to FIG. 18, a block diagram of one embodiment of left shifter unit 750 is shown. As depicted, left shift unit 750 includes a left shift register 1200 and a shift control unit 1210. Shift control unit 1210 receives predicted shift amount 772 from shift prediction unit 752 and shift value 954 from selection logic 950C. In response to these inputs, shift control unit 1210 controls the number of bits the value in register 1200 is shifted leftward. Shift control unit 1210 additionally controls what bit is shifted in at the LSB of register 1200 with each left shift. The result after shifting is conveyed as close path result 242.

For close path subtraction operations, preliminary result 742 is either normalized or requires one or more bits of left shift for normalization. Furthermore, since the loss of precision due to operand alignment is at most one bit, only one value need be generated to shift in at the LSB. This value (shift value 954 in the embodiment shown) is shifted in at the LSB for the first left shift (if needed). If more than a one bit left shift is required, zeroes are subsequently shifted in at the LSB. The output of register 1200 is conveyed as close path result 242.

Figure 19:
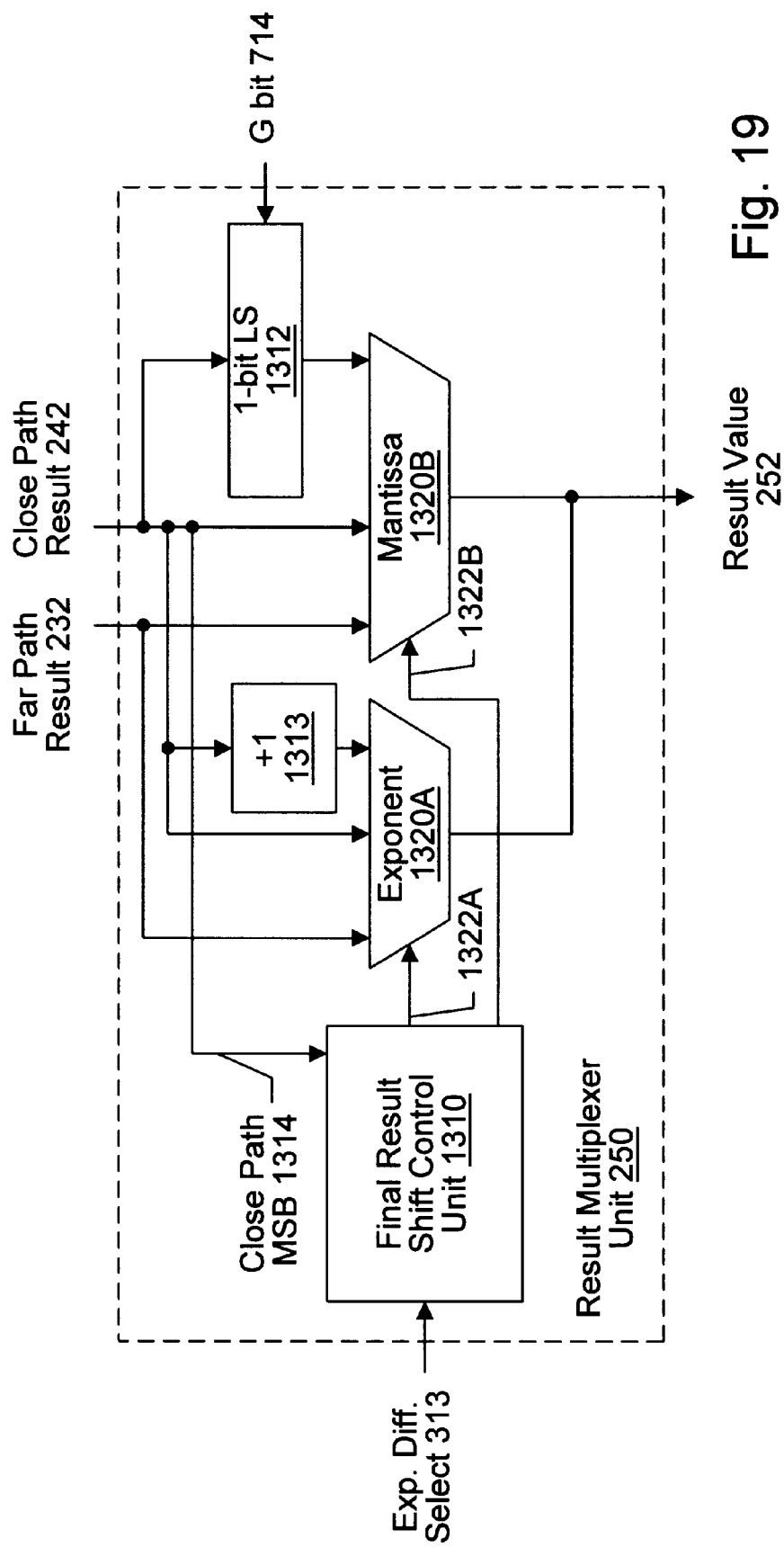
FIG. 19 is a block diagram of one embodiment of a result multiplexer unit 250 within the close data path of FIG. 12.

Turning now to FIG. 19, a block diagram of one embodiment of result multiplexer lo unit 250 is shown. As depicted, result multiplexer unit 250 includes a final result shift control unit 1310, a i-bit left shift unit 1312, a exponent correction adder 1313, and a pair of final multiplexers 1320. Final multiplexer 1320A selects to the exponent portion of result value 252, while final multiplexer 1320B selects the corresponding mantissa portion. Final multiplexer 1320A receives the exponent portions of both far path result 232 and close path result 242. Additionally, multiplexer 1320A receives the output of adder 1313, equal to the close path exponent plus one. As will be described below, in some cases predicted shift amount 772 is one less than the shift value needed to normalize the mantissa portion of close path 242. If this is the case, the close path exponent is one less than its true value. Accordingly, in addition the far and close path exponent values, the output of adder 1313 is also conveyed to multiplexer 1320A. Similarly, multiplexer 1320B receives far and close mantissa portions, along with a corrected close path mantissa value generated by shift unit 1312. The corrected close path mantissa value is generated for the case in which the mantissa of close path result 242 is not properly normalized. Guard bit 714 is shifted into the LSB in such a case.

Shift control unit 1310 utilized exponent difference select 313 and close path MSB 1314 in order to generate final select signals 1322A–B. As described above, the actual exponent difference (calculated in far path 230) indicates whether far path result 232 or close path result 242 is to be selected. Exponent difference select 313 is thus used (along with signal 1314) to select one of the inputs to each of multiplexers 1320. If signal 313 indicates that the exponent difference is greater than one, far path result 232 exponent and mantissa portions are selected as result value 252. On the other hand, if the absolute exponent difference is indicated to be 0 or 1, close path MSB 1314 selects whether the calculated or corrected versions of close path result 242 are conveyed as result value 252.

As described above, predicted shift amount 772 is generated by a shift prediction unit 752. In one embodiment of close path 240, shift prediction unit 752 includes three leading 0/1 prediction units 754. Prediction unit 754A is for the case in which $E_A=E_B+1$, unit 754B is for the case in which $E_A=E_B$, and unit 754C is for the case in which $E_B=E_A+1$. As will be described below, units 754A and 754C may be configured to provide improved speed and reduced space requirements.

Figure 20:
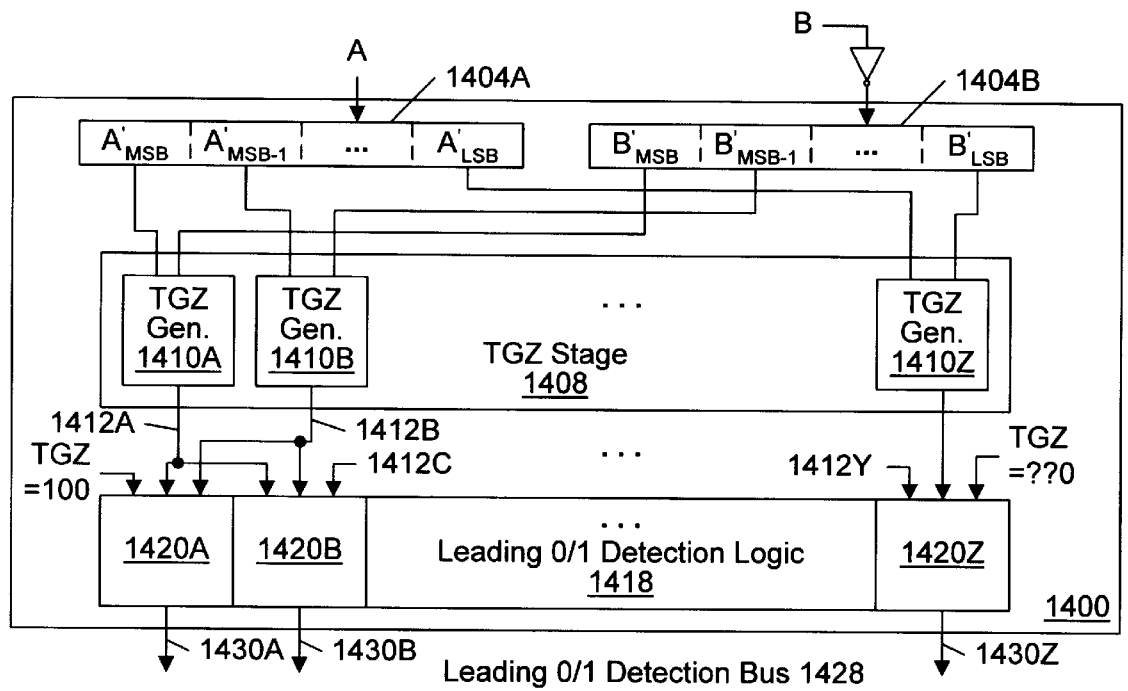
FIG. 20 is a block diagram of a prior art leading 0/1 prediction unit 1400.

Turning now to FIG. 20, a block diagram of a prior art leading 0/1 prediction unit 1400 is depicted. Prediction unit 1400 is configured to receive two operands and generate an indication of the location of the leading 0 (or 1) in the result value. As will be described below, the prediction generated by unit 1400 is accurate to within one bit position. The operation of prediction unit 1400 is described in order to provide a contrast to an improved leading 1 prediction unit described below with reference to FIG. 26.

As shown, prediction unit 1400 includes a pair of operand input registers 1404A–B. Operand register 1404A receives operand A, storing bits $A'_{MSB}$ to $A'_{LSB}$. Operand register 1404B receives a bit-inverted version of operand A, storing bits $B'_{MSB}$ to $B'_{LSB}$. The contents of register 1404A are denoted as A' (even though $A'_i=A_i$) for purposes of consistency since the inverted contents of register 1404B are denoted as B'. Prediction unit 1400 further includes a TGZ logic stage 1408, which includes TGZ generation units 1410A–1410Z. (The TGZ generation unit which is coupled to $A'_{LSB}$ and $B'_{LSB}$ is denoted as "1410Z" simply to show that this unit is the final sub-block with logic stage 1408. The number of TGZ generation units 1410 within logic stage 1408 corresponds to the length of operands A and B). Each TGZ generation unit 1410 receives a pair of corresponding bits from operands A and B and produces, in turn, outputs T, G, and Z on a corresponding TGZ bus 1412. TGZ generation unit 1410A, for example, produces T, G, and Z outputs on TGZ bus 1412A. Prediction unit 1400 further includes a leading 0/1 detection logic block 1418, which includes a plurality of sub-blocks 1420A–1420Z. Logic block 1418 typically includes either n or n+1 sub-blocks, where n is the number of bits in each of operands 1404. Each sub-block 1420 receives three TGZ bus 1412 inputs. Within prediction unit 1400, a given logic sub-block 1420 has a corresponding TGZ generation unit 1410. TGZ generation unit 1410B, for example, corresponds to logic sub-block 1420B. Generally speaking, then, a given logic sub-block 1420 receives TGZ bus values from its corresponding TGZ generation unit, from the TGZ generation unit corresponding to the next most significant sub-block 1420, and from the TGZ generation unit corresponding to the next least significant sub-block 1420. (As shown, logic sub-block 1420B receives TGZ bus 1412B from unit 1410B, TGZ bus 1412A from unit 1410A, and TGZ bus 1412C from unit 1410C. Unit 1410C is not pictured in FIG. 20). The first and last sub-blocks 1420 receive predefined TGZ values in one embodiment in order to handle the boundary cases. Each logic sub-block 1420 generates a prediction bit value 1430. Each value 1430 is usable to indicate the presence of leading 0 or 1 bits in its corresponding bit position. Collectively, values 1430A–Z make up leading 0/1 detection bus 1428. As will be described below, prediction unit 1400 may be optimized to reduce space requirements and increase performance. Such an improved prediction unit is described below with reference to FIG. 26. This prediction unit is particularly useful for speeding leading 1 predictions performed in close path 240 of add/subtract pipeline 220.

Figure 21:
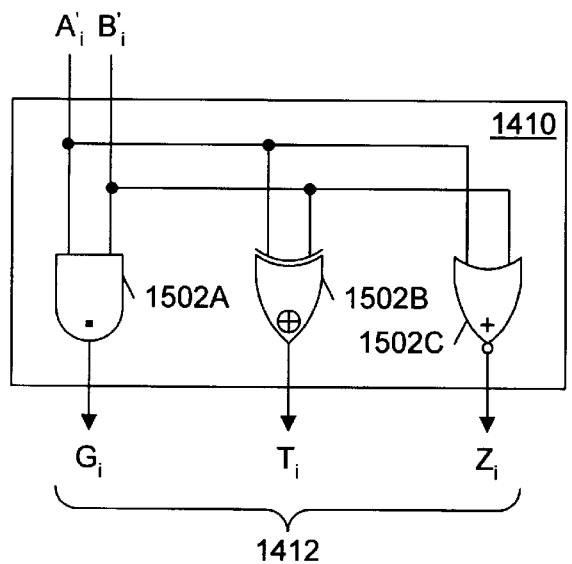
FIG. 21 is a block diagram of a prior art TGZ generation unit within prediction unit 1400 of FIG. 20.

Turning now to FIG. 21, a logic diagram of prior art TGZ generation unit 1410 is depicted. Unit 1410 shown in FIG. 21 is representative of units 1410A–Z shown in FIG. 20. As shown, unit 1410 includes logic gates 1502A, 1502B, and 1502C, each of which receives inputs $A'_i$ and $B'_i$, where i indicates a corresponding bit position within A and B. In one embodiment, logic gate 1502A is an AND gate which generates an asserted value $G_i$ when both $A'_i$ and $B'_i$ are both true. Logic gate 1502B is an exclusive-OR gate which generates an asserted $T_i$ value if one of $A'_i$ and $B'_i$ is true. Finally, logic gate 1502C is a NOR gate which generates an asserted $Z_i$ value if $A'_i$ and $B'_i$ are both zero. The values $G_i$, $T_i$, and $Z_i$ make up TGZ bus 1412 for bit position i.

For the configuration of logic gates shown in FIG. 21, one (and only one) of signals T, G, and Z is asserted for each bit position in the result of A'+B'. Thus, for a given set of operands, the output of logic stage 1408 may be represented by a string of T's, G's, and Z's. It is known that a leading 1 may be predicted by matching the string T*GZ*, where the "*" may be read as "0 or more occurrences of". Conversely, a leading 0 may be predicted by matching the string T*ZG*. As stated above, predictions generated by using these strings may be subject to a 1-bit correction.

Figure 22A:
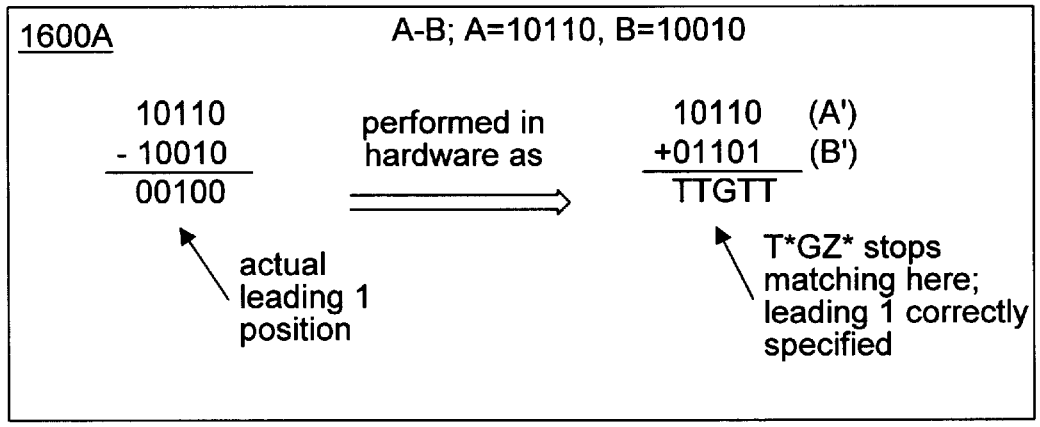
FIGS. 22A–C are examples of how T-G-Z prediction strings may be utilized to perform leading 0/1 prediction.
Figure 22B:
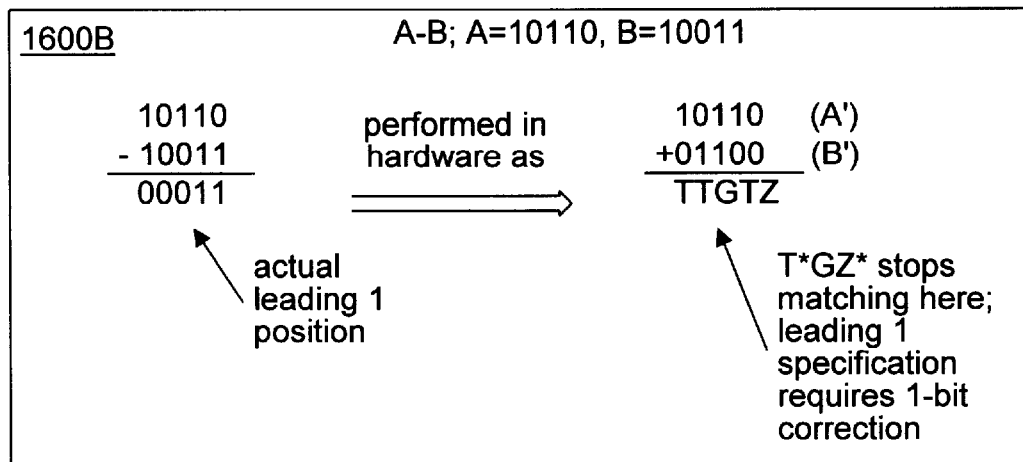
Figure 22C:
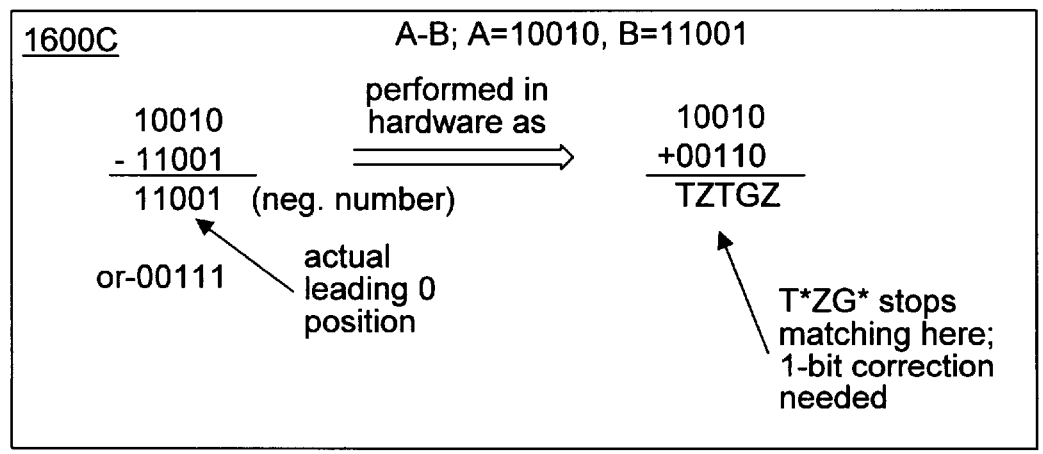

Turning now to FIGS. 22A–C, examples of leading 0/1 prediction using T-G-Z strings are shown. FIG. 22A depicts an example 1600A of leading 1 prediction for the case of A−B, where A=10110b and B=10010b. As shown, the actual leading 1 position is found in the third most significant bit position of the subtraction result. This operation is performed in hardware as A'+B', where A' is equal to A and B' is the inverted version of B. For this set of input operands, the resulting T-G-Z string is shown as TTGTT. This string stops matching the regular expression T*GZ* in the fourth most significant bit position. The leading 1 is thus indicated as being in the last bit position which matches the target string (the third most significant bit), which happens for this case to be the correct prediction.

Turning now to FIG. 22B, another example of leading 1 prediction is shown. Example 1600B depicts the case of A−B, where A=10110b and B=10011b. For these operands, the actual leading 1 position is in the fourth most significant bit. When the subtraction is performed in hardware as A'+B', the resulting T-G-Z string is TTGTZ. As with example 1600A, this string stops matching in the third most significant bit. This results in a leading 1 prediction which is off by one bit position. In one embodiment, final result multiplexer 250 may be configured to correct this one-bit position error as described above.

Turning now to FIG. 22C, an example of leading 0 prediction is shown. Example 1600C depicts the case of A−B, where A=10010b and B=11001b. For this set of operands, the leading 0 is found in the third most significant bit position. When this subtraction is performed in hardware as A'+B', the resulting T-G-Z string is TZTGZ. This string stops matching the target string T*ZG* after the second bit position. This results in a leading 0 prediction which is off by one bit position.

Figure 23:
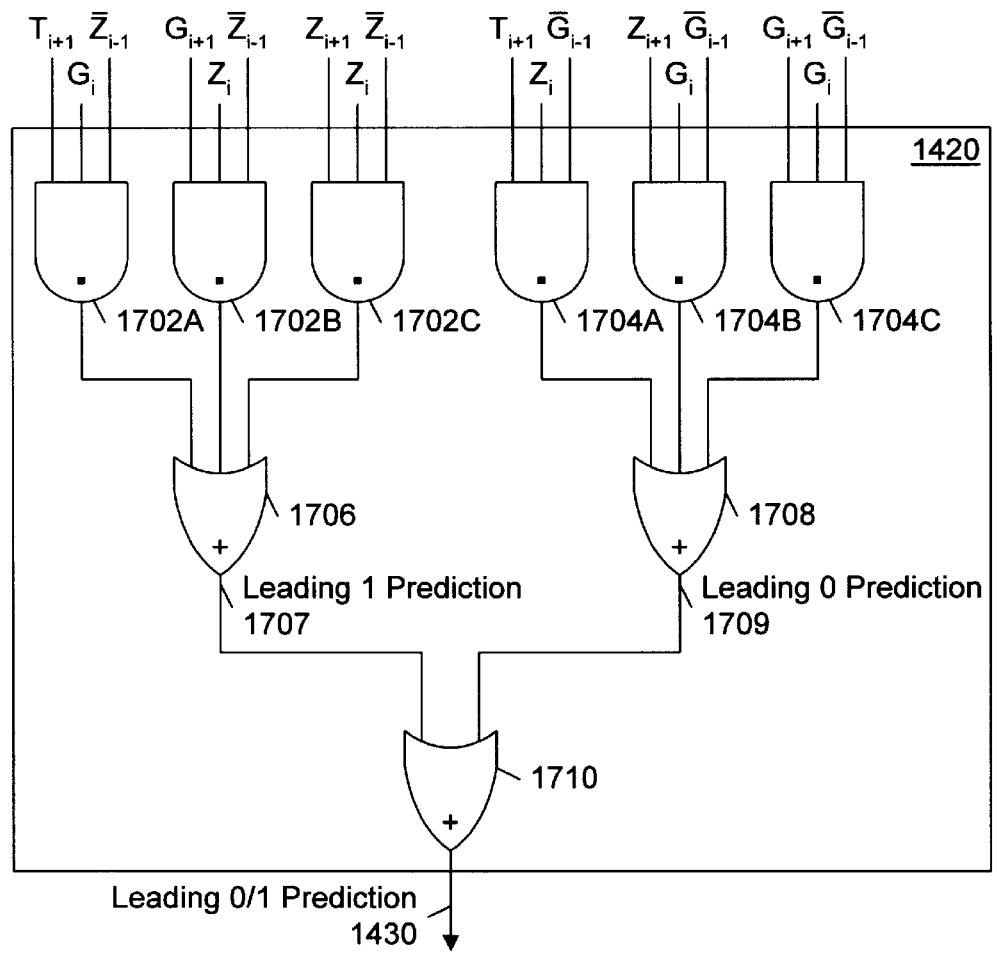
FIG. 23 is a logic diagram of a prediction unit configured to form both leading 0 and 1 prediction strings.

Turning now to FIG. 23, a logic diagram is shown for leading 0/1 detection sub-block 1420 (representative of sub-blocks 1420A–Z in FIG. 20). As shown, sub-block 1420 includes logic gate 1702A–C, 1704A–C, 1706, 1708, and 1710. An asserted prediction bit value 1430 indicates that either a leading 0 or leading 1 is present in this bit position.

In one embodiment, when a leading I value is predicted, the output of one of AND gates 1702 is asserted. Each of AND gates 1702 receives values from the current bit position, the previous bit position, and the next bit position. An assertion of one of gates 1702 indicates that the T-G-Z string produced by logic stage 1408 stops matching the target string T*GZ* in the next bit position. Each logic sub-block 1420 includes these gates 1702 in order to correspond to each of the possible ways a string match may end. It is noted that only one of the outputs of AND gates 1702 may be asserted at a given time. An assertion of one of the outputs of gates 1702 causes the output of gate 1706, leading 1 prediction 1707, to also be asserted.

Conversely, AND gates 1704A–C correspond to leading 0 detection in one embodiment. Each of these gates also receives TGZ values from the current bit position, the previous bit position, and the next bit position. An assertion of one of gates 1704 indicates that the T-G-Z string produced by logic stage 1408 stops matching the target string T*ZG* in the next bit position. Each of sub-blocks 1420 includes three gates in order to correspond to each of the possible ways a string match may end. It is noted that only one of the outputs of AND gates 1704 may be asserted at a given time. An assertion of any of the outputs of gates 1704 causes the output of OR gate 1708, leading 0 prediction 1709, to also be asserted. OR gate 1710 asserts signal 1430 if either of signals 1707 or 1709 is asserted. The most significant position within result bus 1430A–Z which is asserted indicates the position of the leading 0 or 1.

The configuration of sub-block 1420 is typically used when both leading 0 and 1 determination is to be performed. As such, this configuration is used in prediction unit 754B. Prediction unit 754B corresponds to the indeterminate case in which $E_A=E_B$, and it is not known whether the subtraction operation A−B will produce a positive or negative result (leading 1 and leading 0 determination, respectively). As will be shown with reference to FIG. 24, prediction unit 1400 may be configured differently if more information is known regarding operands A and B.

Figure 24:
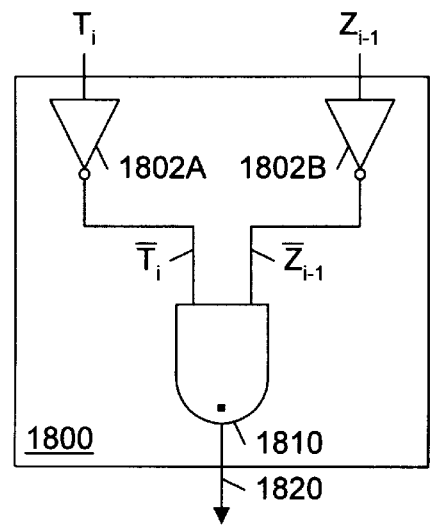
FIG. 24 is a prior art simplification of a TGZ generation unit for operands A and B, where A>B.

Turning now to FIG. 24, a logic diagram of a prior art prediction unit sub-block 1800 is shown. Sub-block 1800 is another embodiment of logic sub-block 1420 shown in FIG. 20. Sub-block 1800 is usable for operands with the restriction A>B. Sub-block 1800 receives T and Z values for each bit position in the sum of A'+B'. The T and Z values are coupled to inverters 1802A and 1802B, respectively. The outputs of inverters 1802, $\overline{T}_i$ and $\overline{Z}_i$, are coupled to an AND gate 1810, which conveys result bus 1820 as an output.

Sub-block 1800 illustrates an improved method for generating leading 1 prediction when A>B. (Leading 0 prediction is not relevant since the result of subtraction is positive for A>B). The configuration of sub-block 1800 is accomplished noting that the leading 1 target string T*GZ* stops matching when the current bit position is not a T and the next bit position is not a Z. A prediction unit which includes sub-block 1800 for each bit may omit logic for generating G on a bit-by-bit basis, since this signal is not utilized in order to generate result bus 1820. Although logic sub-block 1800 provides improved performance over logic sub-block 1420, the operation of a prediction unit may be further improved for the case of $E_A=E_B+1$, which is particularly important for the operation of close data path 240.

Figure 25:
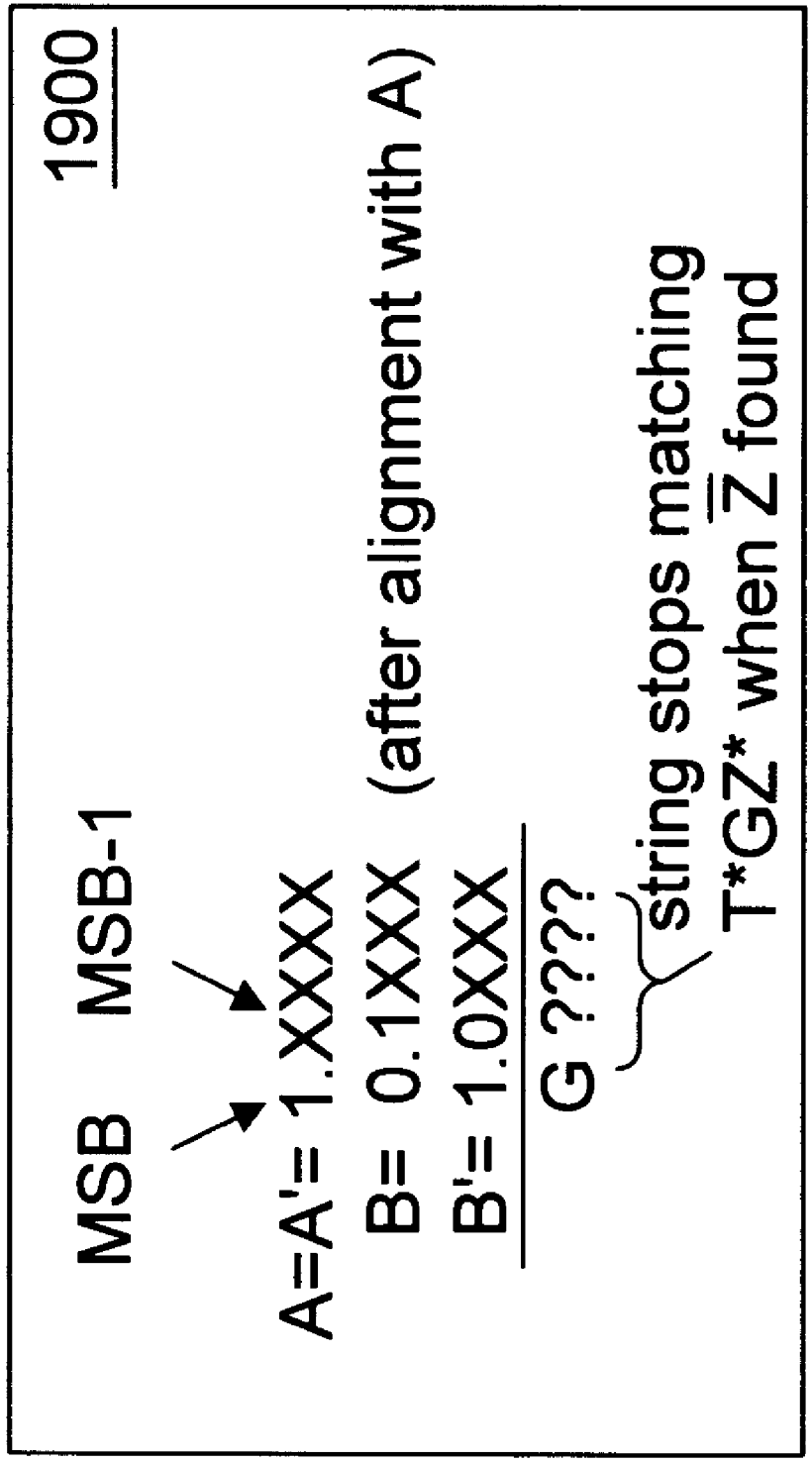
FIG. 25 illustrates the derivation of a simplified leading 1 prediction units in which exponent $E_A$ of a first operand is one greater than exponent $E_B$ of a second operand.

Turning now to FIG. 25, an illustration 1900 is shown depicting the derivation of an improved prediction unit 754A/C for close data path 240. As described above, operands in close data path 240 have an exponent difference $E_{diff}$ of either 0, +1, or −1. Prediction unit 754B handles the $E_{diff}=0$ case, while units 754 and 754C handle the +1 and −1 cases, respectively. The example shown in illustration 1900 corresponds to the case in which $E_A=E_B+1$ (unit 754A), although it is equally applicable to the case in which $E_B=E_A+1$ (unit 754C) with a few minor modifications.

Illustration 1900 depicts operands A and B after operand B (the smaller operand in this case) is aligned with operand A. Because operand A is the larger operand, the MSB of A is a 1. Furthermore, since it is predicted that $E_A=E_B+1$, the MSB of B (after alignment) is a 0. Accordingly, the MSB of B' (the inverted version of B) is a 1. This combination of bits in the MSB results in a G value for the T-G-Z string corresponding to the result of A'+B'. The T-G-Z value of the subsequent bits in the result of A'+B' is not known. It may be ascertained however, that the next bit position which equals $\overline{Z}$ indicates that the target string T*ZG* stopped matching in the previous bit position. A prediction unit 754 which utilizes this detection technique is described with reference to FIG. 26.

Figure 26:
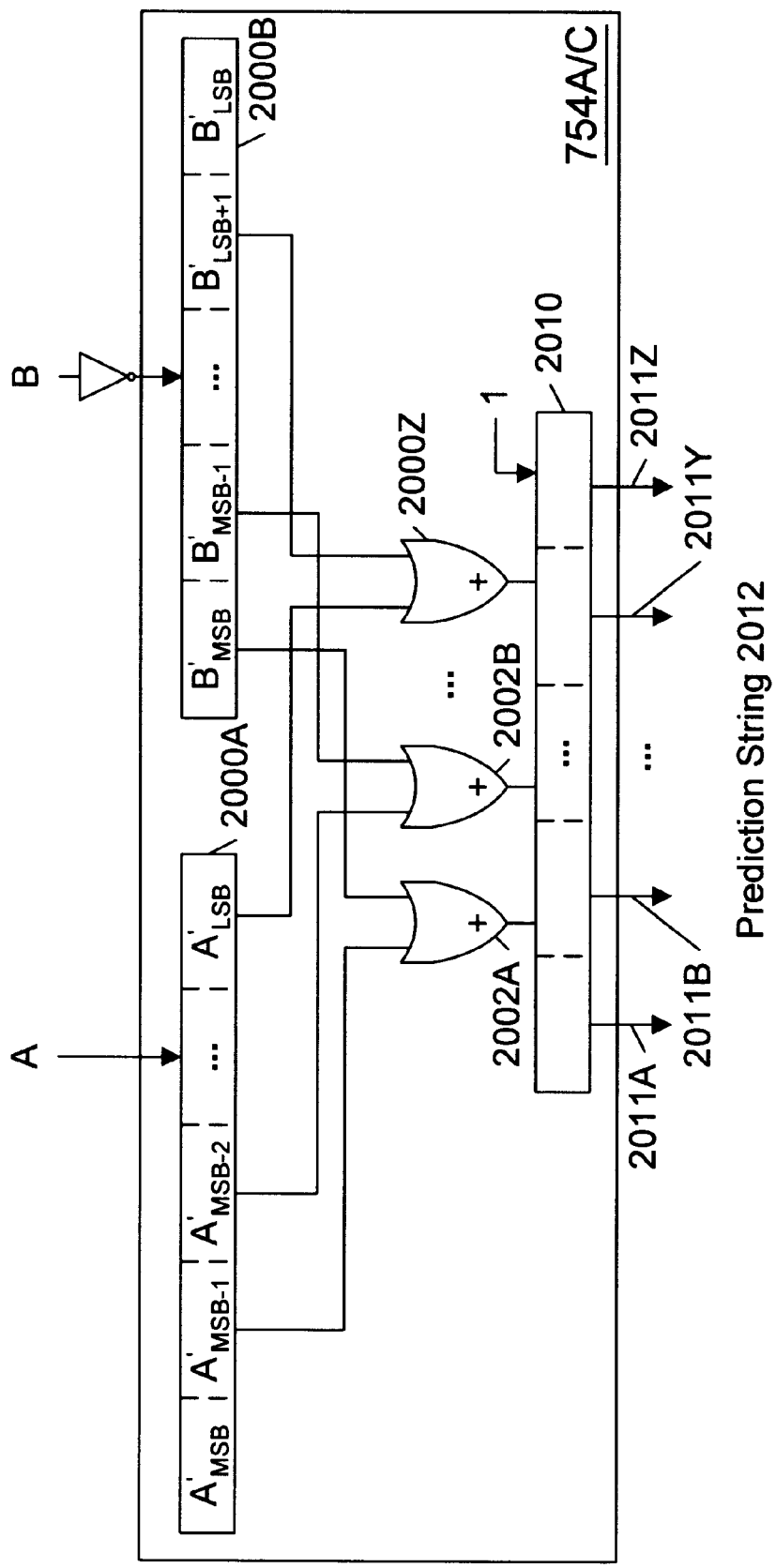
FIG. 26 is a block diagram of one embodiment of an improved leading 1 prediction unit for which $E_A=E_B+1$.

Turning now to FIG. 26, a block diagram of one embodiment of prediction unit 754A/C is shown. As described above, unit 754A/C is optimized for the case in which $E_A=E_B+1$ (or $E_B=E_A+1$). Accordingly, the prediction unit shown in FIG. 26 is indicated as corresponding to unit 754A or 754C as shown in FIG. 12. Unit 754A/C includes input registers 2000A–B. Input register 2000A receives operand A, storing bits $A'_{MSB}$ through $A'_{LSB}$, while input register 2000B receives a bit-inverted version of operand B, storing bits $B'_{MSB}$ through $B'_{LSB}$. Prediction unit 754A/C further includes a plurality of OR gates 2002A–Z, each coupled to receive a pair of input values from input registers 2000. The outputs of OR gates 2002 are conveyed to output register 2010. The collective output of register 2010 (prediction bit values 2011A–Z) forms prediction string 2012. In one embodiment, prediction bit value 2011Z is hardwired to a logic high value in order to produce a default leading 1 value.

The prediction string 2012 generated by unit 754A/C is conveyed to shift prediction multiplexer 760. Multiplexer 760 receives prediction strings from each of prediction units 754, and is configured to choose a prediction string based on exponent prediction value 706. For example, if exponent prediction value 706 indicates that $E_A=E_B$, the prediction string conveyed by prediction unit 754B is selected by multiplexer 760. This string is then conveyed to priority encoder 770, which converts the string into predicted shift amount 772.

As described above, given the restriction that $E_A=E_B+1$, the contents of output register 2010 may be performed by using a single OR gate for each bit position. As shown in FIG. 25, the first T-G-Z value of the result A'+B' is a G. (This results from A having an MSB of 1 and the inverted version of B, B', also having an MSB of 1). Given a starting string value of G, the result stops matching the target string of T*GZ* when $\overline{Z}$ is encountered in a bit position. Therefore, when the first $\overline{Z}$ value is detected at a particular bit position i, the prediction bit value 2011 for bit position i+1 (where i+1 is one bit more significant than position i) should indicate that a leading one value is present.

Such a configuration is shown in FIG. 26. Prediction bit value 2011A is asserted if either the second most significant bit of A' or the most significant bit of B' is set. (It is noted that the bit values conveyed to OR gates 2002 from operand B' have a 1-bit relative bit position to those bit values conveyed from operand A'. This routing effectively performs the functionality of aligning A' and B'. In another embodiment, B' may be shifted prior to conveyance to register 2000B. In such a case, the bit values routed to a particular gate 2002 would have common relative bit positions within input registers 2000). If either of these bits is set the second T-G-Z value in the result string is either G or T, but not Z. Accordingly, the strings stops matching in the second most significant bit position. This corresponds to a leading one being present in the most significant bit position. Hence, prediction bit value 2011A is asserted. The remaining prediction bit values 2011 are formed similarly. The final prediction bit value 2011Z is hardwired to a logical one (as a default in case none of the other bits are set). It is noted that although many bit values within prediction string 2012 may be asserted, typically only the most significant asserted position is utilized in determining the leading 1 position.

Prediction unit 754A/C achieves an optimal implementation of leading 1 prediction for the case in which $E_A - E_B = \pm 1$. This case is particularly useful in close data path 240. Prediction unit 754A/C represents a considerable space savings relative to designs such as that shown in FIG. 24. For FIG. 24, each bit position includes an XOR gate (to generate $T_i$), a NOR gate (to generate $Z_i$), two inverters, and a final AND gate. Prediction unit 754A/C includes just a single OR gate for each bit position. Furthermore, each value within prediction string 2010 is generated using bit values from only a single bit position (two bits) in the input operands. This is in contrast to prior art designs in which prediction values are generated using bit values from at least two positions (for a total of four input bits). Such a prediction unit may provide considerable space savings (up to 75% relative to prior art designs). The speed of such a prediction unit is also correspondingly increased due to fewer gate delays.

As described above, the use of far data path 230 and close data path 240 provides an efficient implementation of add/subtract pipeline 220 by eliminating operations not needed for each path. The versatility of add/subtract pipeline 220 may also be increased by expanding the pipeline to handle additional operations. FIGS. 27–30 describe an embodiment of far data path 230 which is configured to perform floating point-to-integer conversions. Similarly, FIGS. 31–99 describe an embodiment of close data path 240 which is configured to perform integer-to-floating point conversions. As will be shown below, this additional functionality may be achieved with only a minimal number of hardware changes.

Figure 27A:
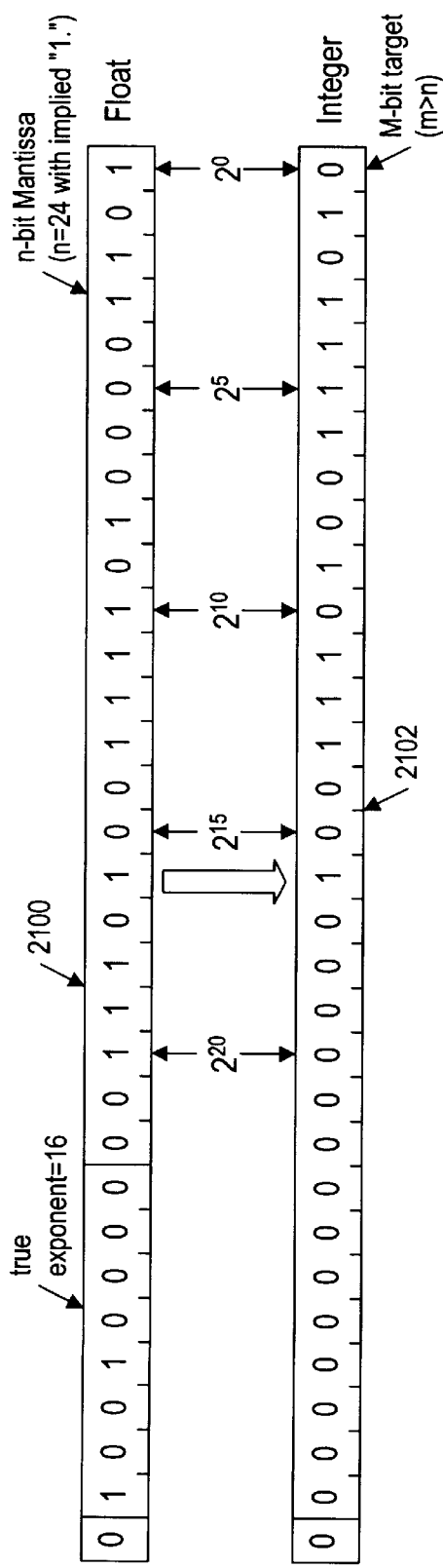
FIGS. 27A–B depict floating point numbers and converted integer equivalents according to one embodiment of the present invention.

Turning now to FIG. 27A, a floating point number 2100 is shown (in single-precision IEEE format) along with its corresponding integer equivalent, integer number 2102. As shown, number 2100 is equal to $1.0011010011110100000101 \times 2^{16}$. (The exponent field in number 2100 includes a bias value of +128). Integer number 2102 represents the integer equivalent of floating point number 2102, assuming a 32-bit integer format (with one bit designated as the sign bit). Accordingly, to convert floating point number 2100 to its integer equivalent, the floating point mantissa is shifted such that the most significant bit of the mantissa (in one embodiment, a leading "1" bit) ends up in the bit position representing the floating point exponent (16) in the integer format. As shown, depending on the value of the floating point exponent, not all bits of the floating point mantissa portion may be included in the integer representation.

Figure 27B:
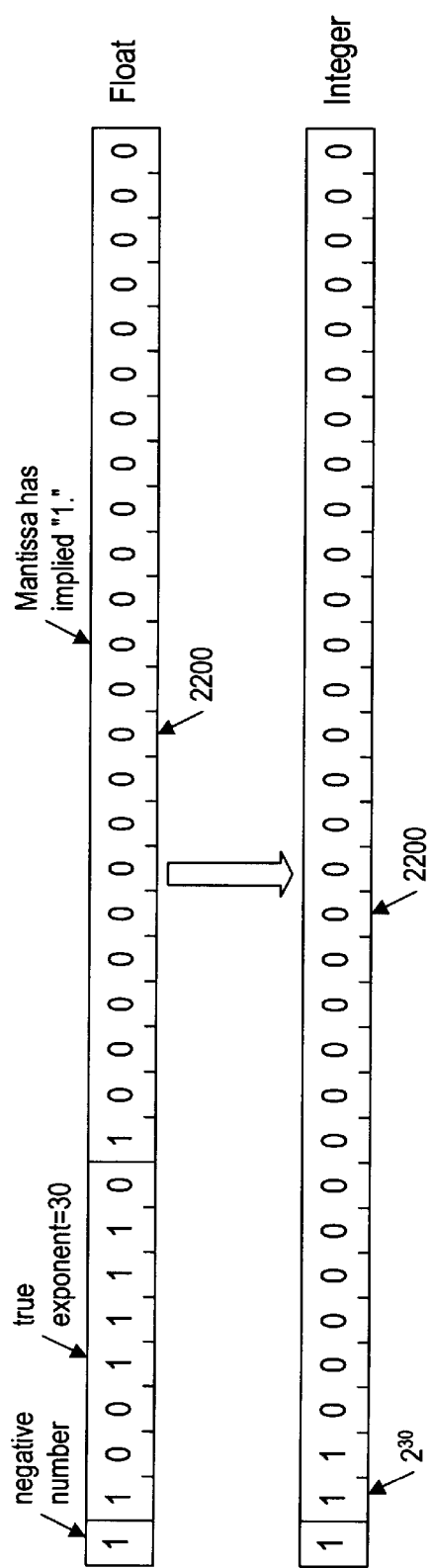

Turning now to FIG. 27B, a floating point number 2200 is shown along with corresponding integer representation, integer number 2202. As shown, number 2200 is equal to $-1.1 \times 2^{30}$, with an implied leading "1" bit. Because the true exponent of floating point number 2200 (30) is greater than the number of mantissa bits (23+hidden 1), integer number 2202 includes all mantissa bits of the original number.

Figure 28:
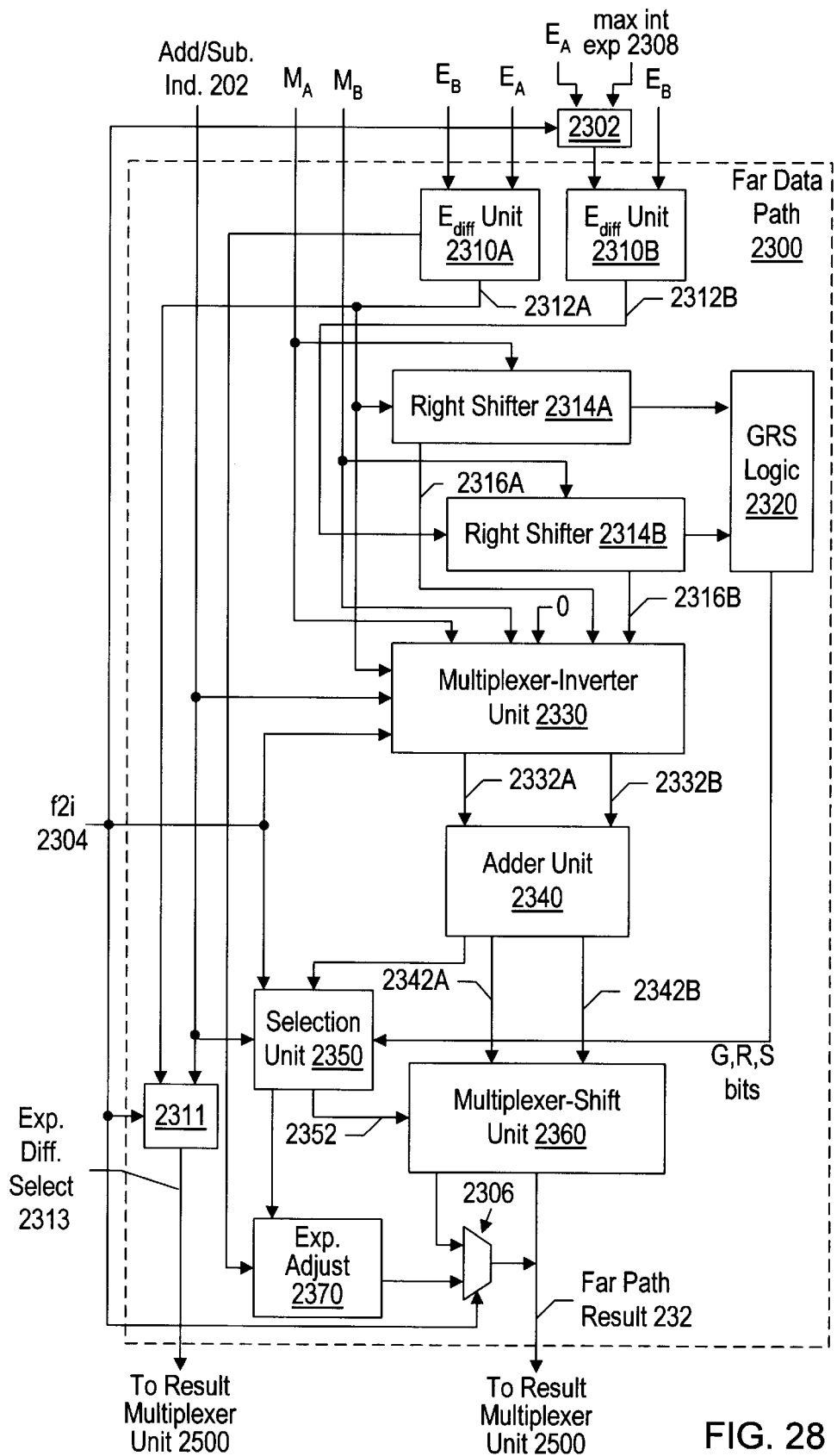
FIG. 28 is a block diagram of one embodiment of a far data path 2300 which is configured to perform floating point to integer (f2i) conversions.

Turning now to FIG. 28, a block diagram of one embodiment of far data path 2300 is shown. Far data path 2300 is similar to far data path 230 described above with reference to FIG. 6; however, far data path 2300 is modified in order to perform floating point-to-integer (f2i) conversions. The components of far data path 2300 are numbered similarly to the components of far data path 230 in order to denote similar functionality.

Exponent difference unit 2310A receives exponent values $E_B$ and $E_A$ as in far data path 230. Exponent difference unit 2310B, however, receives the output of a multiplexer 2302 and exponent value $E_B$, where $E_B$ corresponds to the floating point value which is to be converted to integer format. Multiplexer 2302 receives an exponent value $E_A$ and a maximum integer exponent constant, and selects between these two values based on an $f_2i$ signal 2304. In one embodiment, signal 2304 is generated from the opcode of an float-to-integer conversion instruction. In the case of standard far path addition/subtraction, f2i signal 2304 is inactive, and $E_A$ is conveyed to exponent difference unit 2310B. If signal 2304 is active, however, this indicates that a floating point-to-integer conversion is being performed on the floating point number represented by $E_B$ and $M_B$. In this case, multiplexer 2302 conveys the maximum integer exponent constant to exponent difference unit 2310B.

The maximum integer exponent is indicative of the exponent of largest possible floating point value which may be converted to an integer (without clamping) by far data path 2300. If far data path 2300 is configured to handle the 32-bit signed integer format shown in FIGS. 27A–B, the value 31 is used as the maximum integer exponent constant. In one embodiment, far data path 2300 may be configured to convert floating point numbers to different size integer formats. In such a case, a plurality of maximum exponent values may be multiplexed (selected by a size select signal) to provide the second input to multiplexer 2302.

For standard addition/subtraction in far data path 2300, exponent difference units 2310A–B operate as described above. For f2i conversions, however, only the shift amount 2312B generated by unit 2310B is utilized. As will described below, shift amount 2312A is effectively discarded since the "A" operand is set to zero in one embodiment of the f2i instruction. Shift amount 2312B, on the other hand, represents the amount that $M_B$ has to be shifted in order to provide the proper integer representation. For a floating point input of $1.0 \times 2^{30}$, shift amount 2312B would be computed as 31−30=1.

To allow far data path 2300 to accommodate f2i conversions, the entire data path is configured to handle max (m, n) bits, where m is the number of bits in mantissa values $M_A$ and $M_B$, and n is the number of bits in the target integer format. In other words, far data path 2300 is wide enough to handle the largest possible data type for its defined operations. In order to perform f2i conversion for 32-bit integers, then, right shift units 314 are 32 bits wide. Shift units 314A–B receive mantissa values $M_A$ and $M_B$, respectively, each of which is left aligned. Shift outputs 2316A–B are then conveyed to multiplexer-inverter unit 2330.

Multiplexer-inverter unit 2330 receives shift outputs 2316, along with $M_A$, $M_B$, and an operand which is set to zero. (It is also noted that in another embodiment, mantissa value $M_A$ may itself be set to zero before conveyance to far data path 2300). Unit 2330, in response to receiving f2i signal 2304, is configured to convey the zero operand as adder input 2332A and the shifted version of $M_B$ as adder input 2332B. By setting add/subtract indication 202 to specify addition for the f2i conversion function, adder output 2342A is equal to adder input 2332B (MB). Selection unit 2350 is thus configured to select adder output 2342A (sum) to perform the f2i operation.

Adder unit 2340, as described above, produces sum and sum+1 outputs in response to the adder inputs. For f2i conversions, however, since one operand is zero, adder output 2342A is equal to adder input 2332B. Accordingly, selection unit 2350, in response to receiving f2i signal 2232, selects adder output 2342A (sum) within multiplexer-shift unit 2360.

A multiplexer 2306 coupled between exponent adjust unit 2370 and multiplexer-shift unit 2360 is configured to provide the proper upper order bits for one embodiment of far path result 232. For standard far path operation (add and subtract operations), 24 bits (in one embodiment) of mantissa value are conveyed as the 24 least significant bits of result 232. Sign and exponent portions are conveyed as the upper order bits. Hence, when f2i signal 2304 is inactive, the output of exponent adjust unit 2370 and a sign bit (not shown) is conveyed as the upper order bits of far path result 232. On the other hand, when signal 2304 is active, the upper order bits of adder output 2342A are conveyed as the upper order bits of far path result 232. For one embodiment of f2i conversions, far path result 232 includes one sign bit followed by 31 integer bits. As will be described below, floating point values above or below the maximum/minimum integer values are clamped to predetermined values. In one embodiment of a 32-bit representation, these maximum and minimum integer values are $2^{31}-1$ and $-2^{31}$, respectively.

Figure 29:
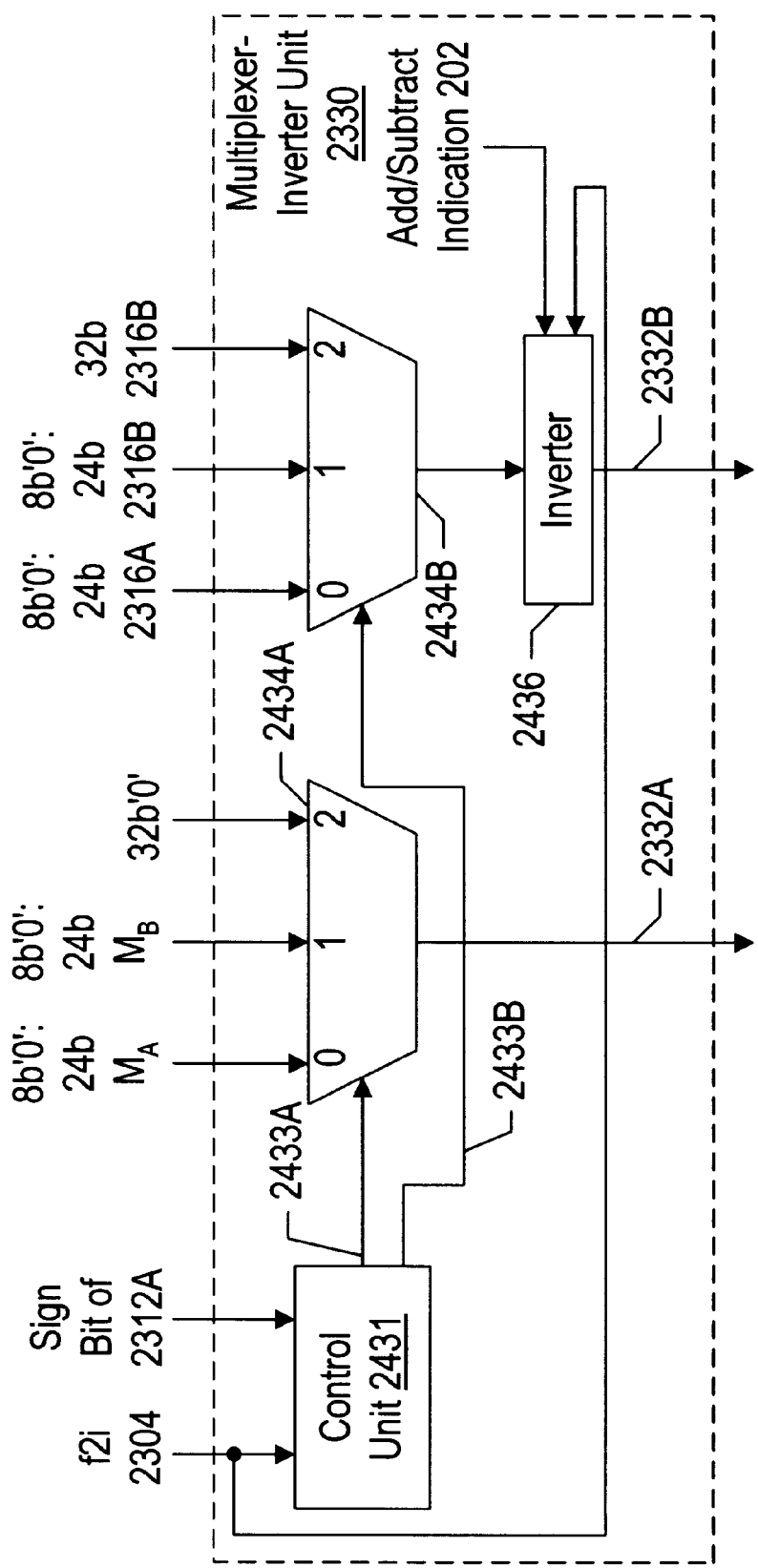
FIG. 29 is a block diagram of one embodiment of a multiplexer inverter unit 2330 within far data path 2300 of FIG. 28.

Turning now to FIG. 29, a block diagram of one embodiment of multiplexer-inverter unit 2330 is depicted. Unit 2330 is modified slightly from multiplexer-inverter unit 330 described above with reference to FIG. 7 in order to handle floating point-to-integer conversions.

As shown, multiplexer-inverter unit 2330 includes control unit 2431, input multiplexers 2434A–B, and inverter 2436. Input multiplexer 2434A receives three inputs: $M_A$, $M_B$, and an zero operand set to zero, while input multiplexer 2434B receives the outputs 2316A–B of shift units 2314. Multiplexer 2434B receives another version of shift output 2316B as described below.

During standard operation of far data path 2300, two 24-bit floating point mantissas are added by adder unit 2340. In order to accommodate 32-bit integer values, however, adder unit 2340 (and other elements of data path 2300) are 32 bits wide. Accordingly, the 24-bit $M_A$ and $M_B$ values are routed to the least significant 24 bits of the adder (with the upper order bits padded with zeroes) in order to perform addition and subtraction. For the case in which $E_A > E_B$, control unit 2431 generates select signals 2433 such that multiplexer 2434A selects $M_A$ and multiplexer 2434B selects the 24-bit version of $M_B$ (shift output 316B). Conversely, for the case in which $E_B > E_A$, select signals 2433 are generated such that multiplexer 2434A selects $M_B$ and multiplexer 2434B selects the 24-bit version of $M_A$ (shift output 2316A).

In one embodiment, far data path 2300 performs the f2i function by adding zero to an appropriately shifted version of operand B, using the sum as the integer result. If f2i signal 2304 is active, control unit 2431 generates select signals 2433A–B so that the zero operand is selected by multiplexer 2434A as adder input 2332A and that the 32-bit version of shift output 2316B is selected by multiplexer 2434B. For the f2i instruction/function, inverter 2436 is inactive in one embodiment. Hence, the output of multiplexer 2434B is conveyed as adder input 2332B.

For floating point-to-integer conversions, the exponent value of the floating point number may often exceed the maximum representable integer value. In one embodiment, if an overflow (or underflow) occurs, the converted integer may be clamped at the maximum (or minimum) representable value to provide a usable result for subsequent operations. An example of result clamping for the f2i instruction is described below with reference to FIG. 30.

Figure 30:
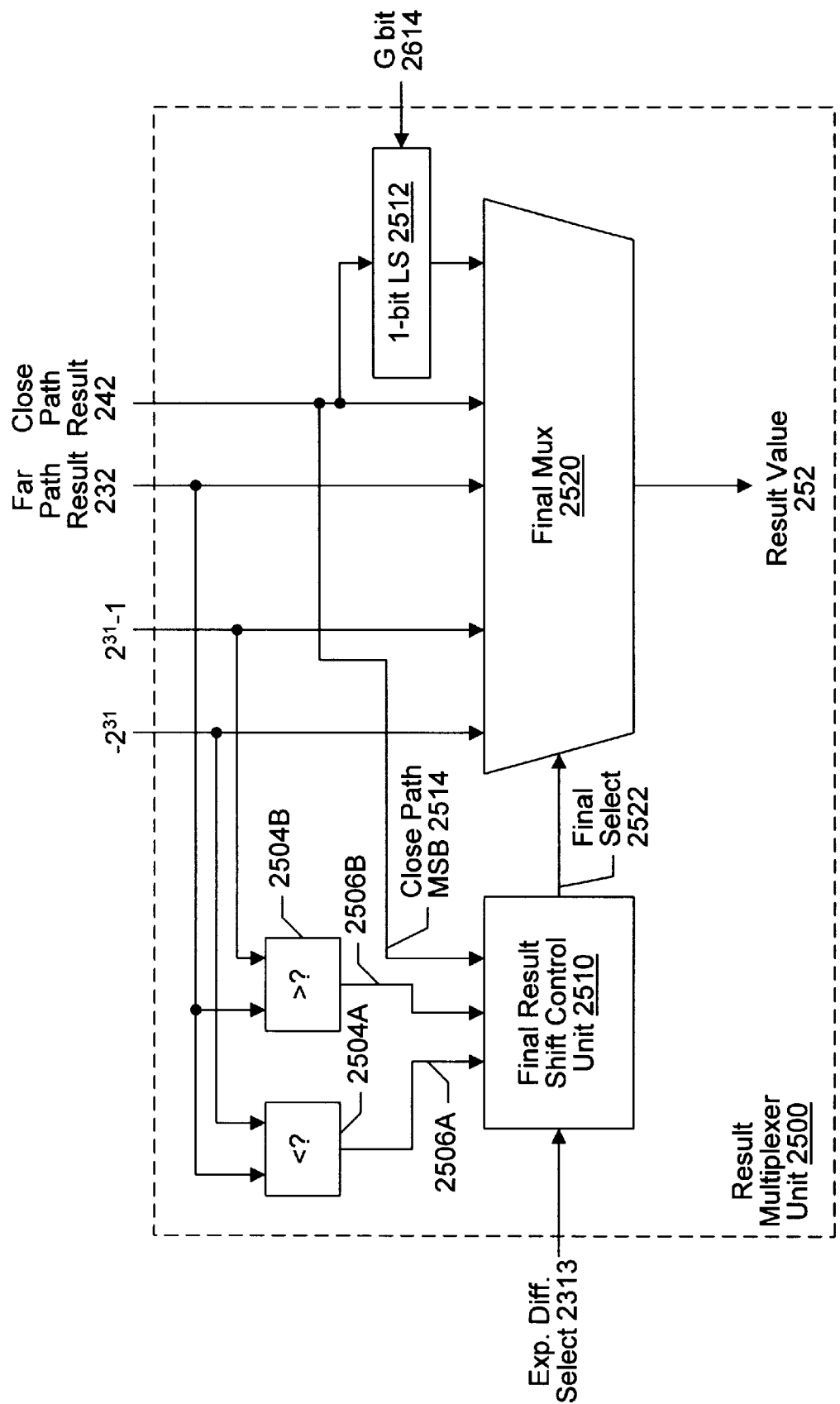
FIG. 30 is a block diagram of one embodiment of a result multiplexer unit 2500 within far data path 2300 of FIG. 28, FIGS. 31 A–B depict integer numbers and converted floating point equivalents according to one embodiment of the present invention.

Turning now to FIG. 30, a block diagram of one embodiment of result multiplexer unit 2500 is depicted. Unit 2500 is similar to multiplexer unit 250 depicted in FIG. 19, with additional hardware added to perform clamping of f2i conversion results. As shown, result multiplexer unit 2500 includes comparators 2504A–B, a shift control unit 2510, a left shift unit 2512, and a final multiplexer 2520.

Like final multiplexer 1320, multiplexer 2520 is configured to select result value 252 from a plurality of inputs according to a final select signal 2522 generated by shift control unit 2510. Control unit 2510 generates select signal 2522 from exponent difference select 2313, comparator outputs 2504A–B, and the most significant bit of close path result 242 (denoted in FIG. 30 as numeral 2514). Exponent difference signal 2313 is indicative of either far path result 232 or close path result 242, with an additional indication of whether far path result 232 is an f2i result. If signal 2313 does indicate that far path result is an f2i result, comparator outputs 2506 indicate whether the f2i result should be clamped. Comparator 2504A indicates an overflow if $E_B$ (the original floating point exponent of operand B) is greater than or equal to 31, since the maximum positive integer for the embodiment shown is $2^{31}-1$. Similarly, comparator 2504B indicates an underflow if $E_B$ is greater than 31 or $E_B=31$ and $M_B$ is greater than 1.0. If exponent difference select signal 2313 is indicative of close path result 242, either result 242 or its one-bit left shifted version (the output of shifter 2512) is chosen, depending on the whether result 242 is properly normalized.

As described above, far data path 2300 is similar to far data path 230, but with the additional f2i functionality. Because minimal hardware is needed to handle this extra instruction, the versatility of data path 2300 is increased with relativity little overhead. This provides an effective implementation of f2i conversion instructions through re-use of existing hardware. Similarly, integer-to-floating point conversion (i2f) may also be performed within add/subtract pipeline 220. One embodiment of pipeline 220 is described below with reference to FIGS. 31–35 in which i2f conversions are performed in close data path 240.

Turning now to FIG. 31A, a 32-bit integer number 2550 is shown along with its corresponding IEEE single-precision equivalent 2552. The quantity represented by both numbers is $1.1 \times 2^{30}$. Because the number of significant bits (2) in number 2550 is less than the number of mantissa bits in number 2552, no precision is lost. It is noted that in the embodiment shown, the mantissa portion of floating point number 2552 has a hidden 1 bit.

Turning now to FIG. 31B, a 32-bit integer number 2560 is shown along with its corresponding single-precision EEE floating point equivalent 2562. Unlike integer 2550, integer 2560 includes more significant bits than are available in the mantissa portion of floating point number 2562. Accordingly, these extra bits are lost in the conversion process. It is noted that if the target floating point format includes a larger number of bits than are in the source integer format, no precision is lost during integer-to-float conversions.

Figure 32:
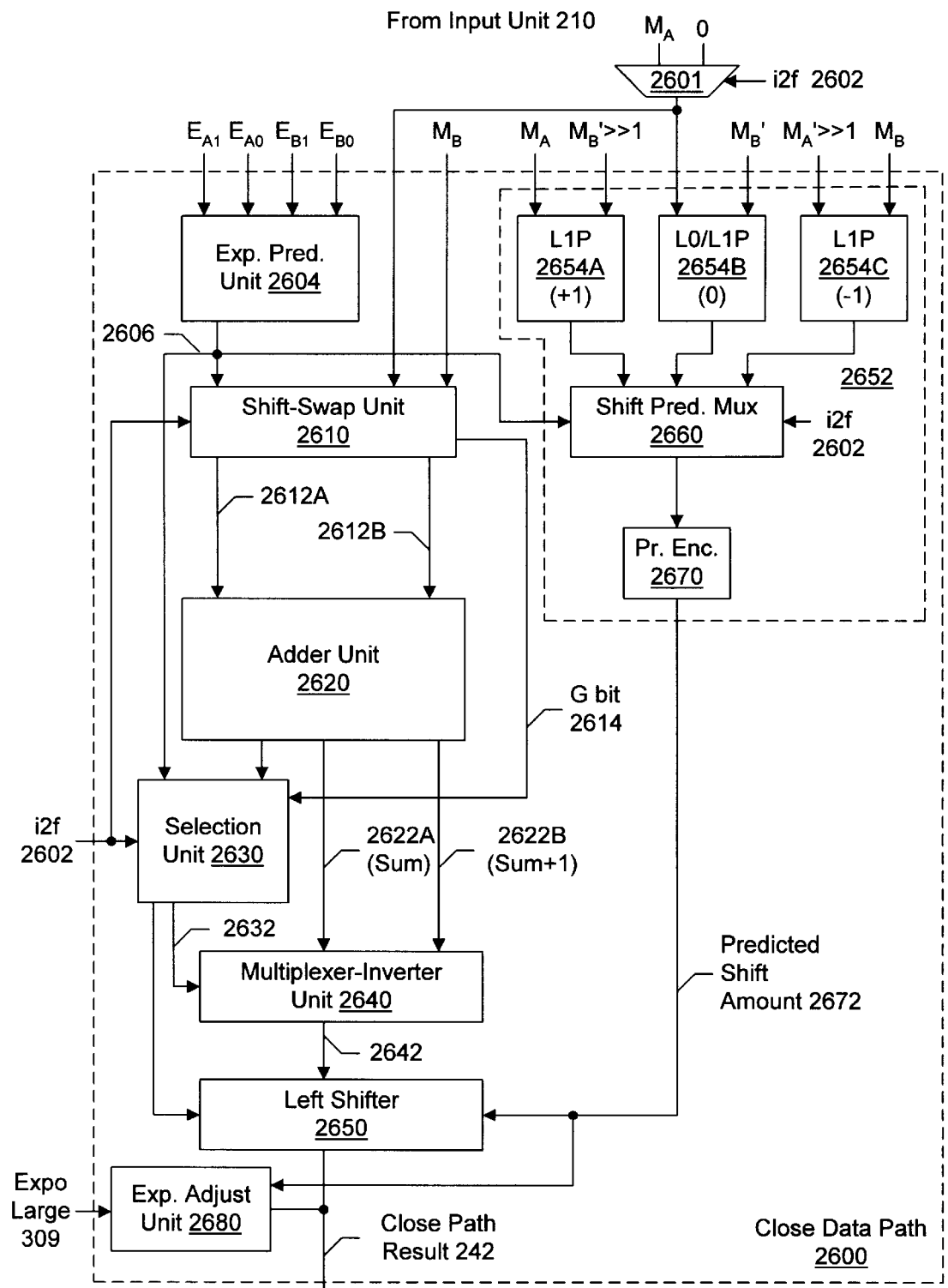
FIG. 32 is a block diagram of one embodiment of a close data path 2600 which is configured to perform integer-to-floating point (i2f) conversions.

Turning now to FIG. 32, a block diagram of one embodiment of close data path 2600 is depicted. Close data path 2600 has a similar structure to that of close data path 240 described above with reference to FIG. 12, but data path 2600 is additionally configured to perform i2f conversions. The differences in functionality between data path 240 and data path 2600 are described below. Other embodiments are possible in which the leading 1 bit is explicit.

In one embodiment, i2f conversions are performed by setting operand A to zero. Accordingly, multiplexer 2601 receives both mantissa value $M_A$ and an operand set to zero. An i2f signal 2602 is utilized to select one of these input values to be conveyed as the output of multiplexer 2601. If i2f signal 2602 is inactive, mantissa value $M_A$ is conveyed to both shift-swap unit 2610 and prediction 2654B, in which case close data path 2600 operates identically to close data path 240. If i2f signal 2602 is active, however, the zero operand is conveyed to both units 2610 and 2654B. Shift-swap unit 2610, in response to receiving i2f signal 2602, selects 0 and $M_B$ to be conveyed as adder inputs 2620. In one embodiment, close data path 2600 is only configured to perform subtraction. In such an embodiment, a positive integer input to close data path 2600 produces a negative result from adder unit 2620 (since the integer is effectively subtracted from zero). In this case, as with close data path 240, the "sum" output of adder 2620 may be inverted in order to produce the correct result. Conversely, a negative integer input (in 2's complement form) to close data path 2600 produces a positive result from adder unit 2620. As will be described below, the 2's complement integer input is negated in shift-swap unit 2610 by taking the 1's complement. This results in an adder input having a magnitude which is one less than the original negative number. Accordingly, the correct output of adder unit 2620 is obtained by selecting the "sum+1" output, which corrects for the one's complement addition.

Restating, selection unit 2630 selects the output of adder unit 2620 based on the sign of operand B if i2f signal 2602 is active. If an i2f instruction is being performed, adder output 2622A (sum) is chosen (and subsequently inverted) if the sign of operand B is 0 (indicating a positive number). On the other hand, adder output 2622B (sum+1) is chosen if the sign of operand B is 1 (indicating a negative number). Multiplexer-inverter unit 2640, in response to receiving close path select signal 2632, conveys the selected adder output 2622 as close path preliminary result 2642.

Close path preliminary result 2642 is then normalized in left shift unit 2650 according to predicted shift amount 2672. If i2f signal 2602 is active, prediction unit 2654B receives a zero operand and a negated version of $M_B$ as inputs. The prediction string generated by unit 2654B is then selected by shift prediction multiplexer 2660 in response to signal 2602. Priority encoder 2670 then generates a predicted shift amount 2672 which is usable to left-align close path preliminary result within left shift unit 2650.

In one embodiment, left shift unit 2650 is an n+1 bit shifter, where n is the width of close data path 2600 (32 bits in one embodiment). The shifter is configured to be n+1 bits in order to account for the one bit position prediction error which may occur using the T-G-Z methodology for leading 0/1 detection. All n+1 bits may thus be conveyed to final multiplexer unit 2500. If the most significant bit is set (indicating proper normalization), the most significant n bits of the n+1 bits conveyed to unit 250 are selected as the mantissa portion of result value 252. Conversely, if the most significant bit is not set, the least significant n bits of the n+1 bits conveyed to unit 2500 are selected as the mantissa portion of result value 252.

The exponent portion of close path result 242 is calculated by an exponent adjustment unit 2680 using either exponent large input 309 or the maximum exponent value for the given integer representation. For the 32-bit integer format described above, the maximum exponent value is 31 in one embodiment. This corresponds to the largest exponent possible for an integer value within the given format. The operation of adjustment unit 2680 is described below with reference to FIG. 35.

Figure 33:
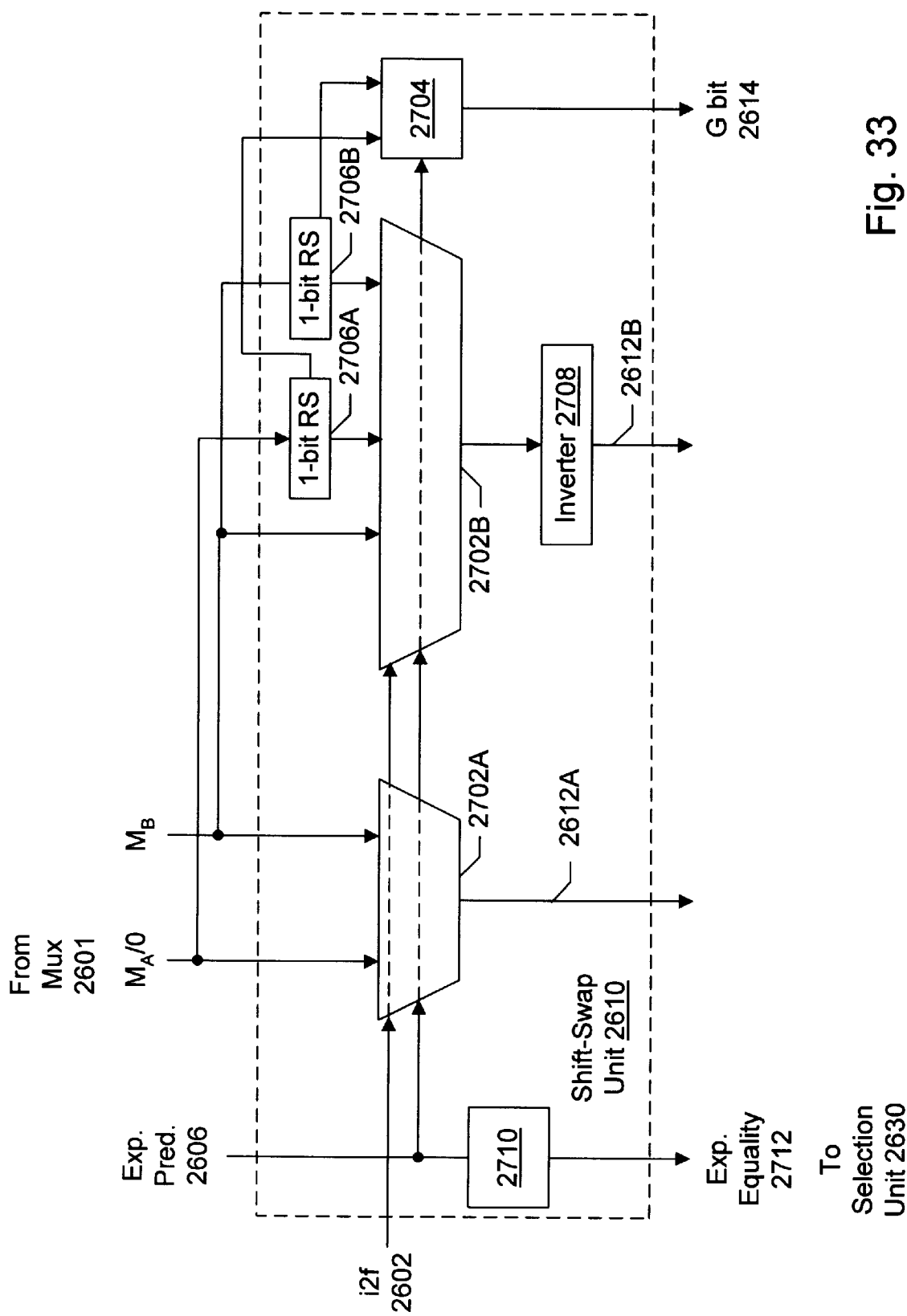
FIG. 33 is a block diagram of one embodiment of a shift-swap unit 2610 within close data path 2600 of FIG. 32.

Turning now to FIG. 33, a block diagram of one embodiment of shift-swap unit 2610 is depicted. Shift-swap unit 2610 is similar to unit 710 described above with reference to FIG. 13. Unit 2610 is additionally configured, however, to select the proper operands for the i2f operation. As shown, unit 2610 is coupled to receive i2f signal 2602. In response to signal 2602 being asserted, input multiplexers 2702A is configured to output the zero operand (conveyed as the output of multiplexer 2601) as adder input 2612A, while input multiplexer 2702B is configured to output operand $M_B$. Operand $M_B$ is then negated by inverter 2708 and conveyed as adder input 2612B.

Figure 34:
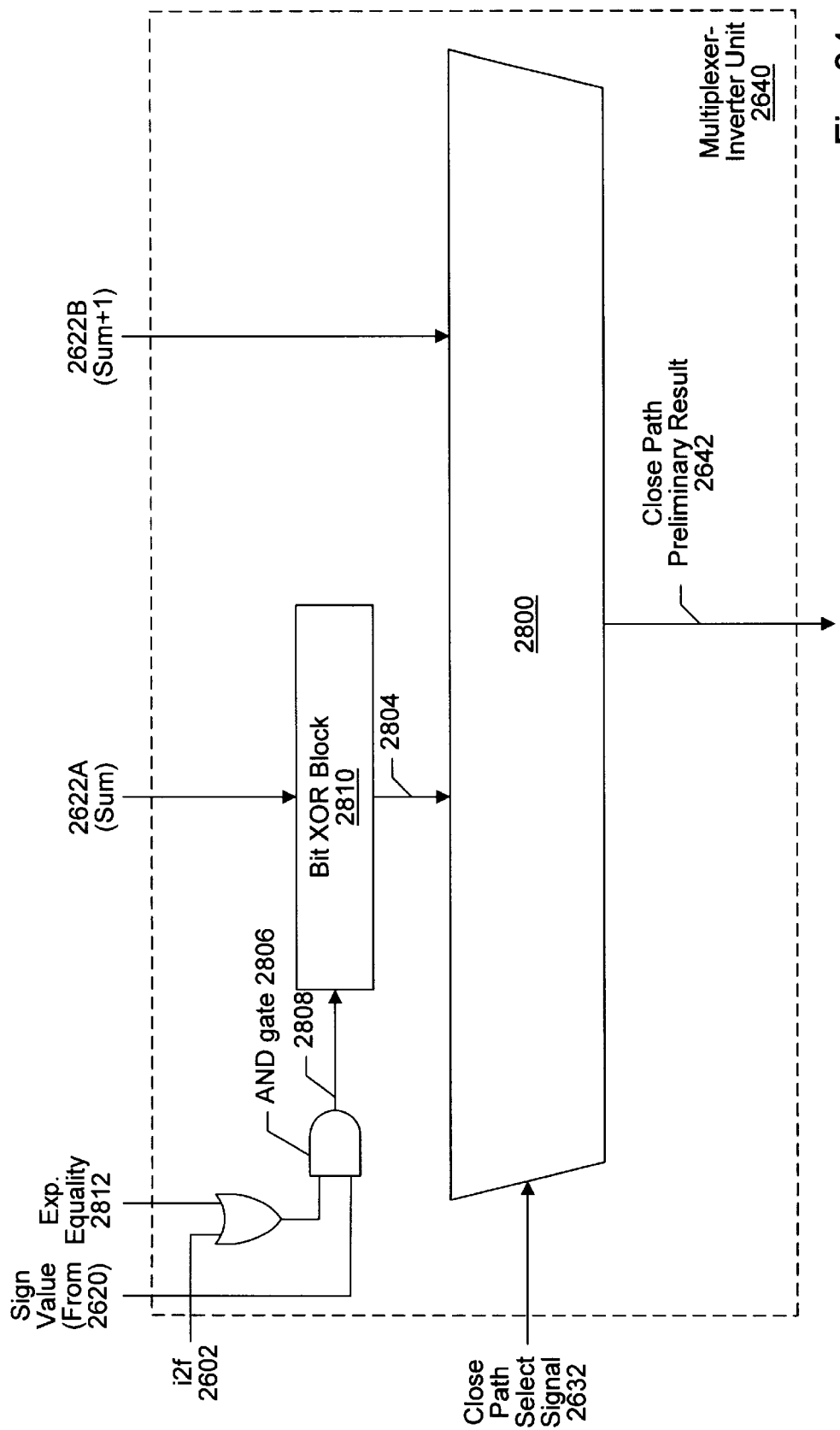
FIG. 34 is a block diagram of one embodiment of a multiplexer-inverter unit 2640 within close data path 2600 of FIG. 32.

Turning now to FIG. 34, a block diagram of one embodiment of multiplexer-inverter unit 2640 is depicted. Unit 2640 is similar in structure to unit 740 described above with reference to FIG. 17. Unit 2640 is additionally configured to provide proper selection for i2f conversions in addition to standard close path subtraction.

As shown, unit 2640 is coupled to receive adder outputs 2622A–B. For standard close path subtraction, close path select signal 2632 selects of one of the adder inputs to be conveyed as close path preliminary result 2642. Adder input 2622A may be inverted before selection by multiplexer 2800 for the case in which $E_A = E_B$ and the output of adder unit 2620 is negative.

The selection process for i2f conversion is similar. In one embodiment, selection unit 2630 generates close path select signal according to the sign of the integer input number is i2f signal 2602 is active. If the i2f input is a positive number, close path select signal 2632 is generated to be indicative of adder output 2622A (sum). Because a positive i2f input in close path 2600 produces a negative output from adder 2620 in one embodiment, proper recomplementation is provided by inverting adder output 2622A in XOR block 2810. This produces a result of the correct magnitude which may be conveyed as close preliminary result 2642. If, on the other hand, the i2f input is a negative number (expressed in two's complement form), selection of adder output 2622B by select signal 2632 produces a result of the correct magnitude. Sign bit logic (not shown) is also included in close data path 2600 to ensure that the target floating point number has the same sign as the input integer number.

Figure 35:
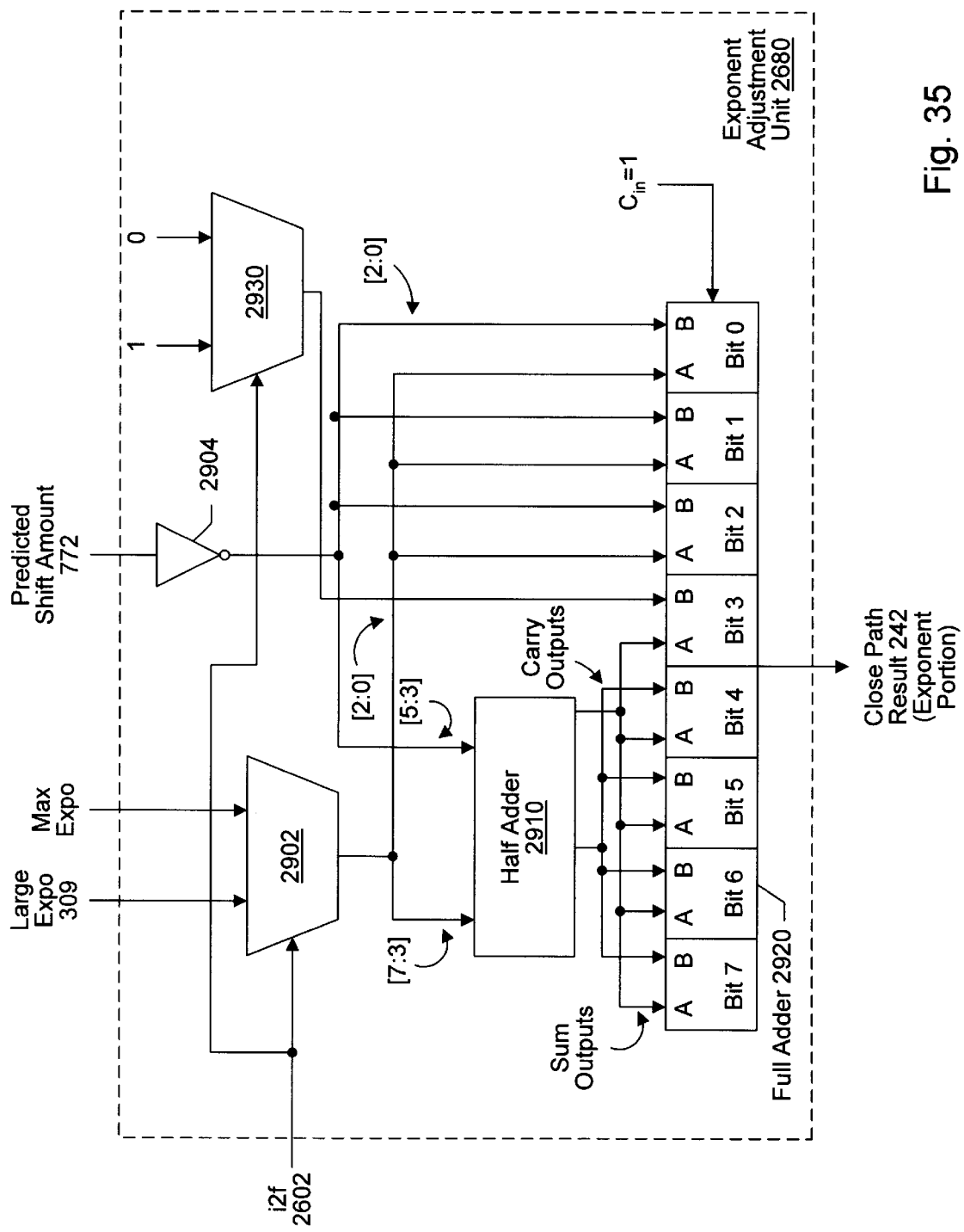
FIG. 35 is a block diagram of one embodiment of an exponent within close data path 2600 of FIG. 32.

Turning now to FIG. 35, a block diagram of one embodiment of exponent adjustment unit 2680 is depicted. As shown, unit 2680 includes an exponent multiplexer 2902, an inverter 2904, a shift count adjustment multiplexer 29030, a half adder 2910, and a full adder 2920. Exponent adjustment unit 2680 is configured to subtract the predicted shift amount from an initial exponent in order to generate the exponent portion of close path result 242. In the case of standard close path subtraction (non-i2f operations), a correction factor is added back into the exponent to account for the difference in width between the integer and floating point formats. This function is described in greater detail below.

Consider an embodiment of close data path 2600 which is configured to handle a 32-bit integer format and a floating point format with a 24-bit mantissa portion. For standard close path subtraction, large exponent 309 is calculated within far data path 230 and conveyed to multiplexer 2902. Concurrently, predicted shift amount 2672 is calculated by shift prediction unit 2652 and conveyed to inverter 2904. The negated shift amount and large exponent 309 may then be added using half adder 2910 and full adder 2920. This adder configuration allows a correction constant conveyed from multiplexer 2930 to be added in as the second operand at bit 3 of full adder 2920. For standard close path operation, this constant is 1 (which is equivalent adding the value $2^3=8$ as a third operand to exponent adjustment calculation). The exponent adjustment calculation for standard close path subtraction becomes:

$$\text{adjusted\_exponent\_value=expo\_large-(shift\_count-8)} \qquad (9);$$

$$\text{adjusted\_exponent\_value =expo\_large-shift\_count+8} \qquad (10).$$

This correction constant is used since standard close path subtractions are over-shifted by 8 bits by left shift unit 2650. Because shift prediction unit 2652 is configured to generate predicted shift amounts for both integer and floating point values within data path 2600, the shift amounts are based on left-aligning both sets of values with the larger format, which in this embodiment is the 32-bit integer format. Stated another way, normalizing the floating point values produced by close path subtraction only requires the MSB of the subtraction result to be left aligned with a 24-bit field. In order to accommodate 32-bit integers, however, all close path results are left-aligned with a 32-bit field. Accordingly, the predicted shift amount minus 8 is subtracted from large exponent 309 in order to produce the adjusted exponent. The carry in to bit 0 of full adder 2920 is set in order to compensate for the one's complement addition of shift amount 2672.

For i2f conversions, the exponent adjustment calculation is similar to that performed for standard close path subtraction. If i2f signal 2602 is active, however, the output of multiplexer 2902 is 31 and the correction constant conveyed from multiplexer 2930 is 0. Consider an i2f conversion in which the most significant bit of the adder output is located in bit 28 out of bits [31:0]. The floating point number resulting from this integer is $1.xxxx \times 2^{28}$. The floating point exponent may thus be calculated by subtracting the shift amount (3) from the predetermined maximum integer exponent (31) without using a correction constant.

Although exponent adjustment unit 2680 is shown in FIG. 35 as being implemented with half adder 2910 and full adder 2920, various other adder configurations are also possible to produce the exponent portion of close path result 242.

As with the inclusion of floating point-to-integer conversion capability in far data path 2300, the expansion of close data path 2600 to handle integer-to-floating point conversion also provides extra versatility to add/subtract pipeline 220. The additional functionality is included within data path 2600 with a minimum number of changes. Accordingly, i2f conversion capability is achieved with an efficient hardware implementation.

The embodiments shown above depict a single add/subtract pipeline 220 within each of execution units 136C and 136D. These embodiments allow concurrent execution of floating point add and subtract instructions, advantageously increasingly floating point performance. By configuring pipelines 220 to handle integer-to-float and float-to-integer conversions as described above, execution units 136C–D may concurrently perform these operations as well.

Performance may further be increased by configuring each of execution units 136C–D to include a plurality of add/subtract pipelines 220. As will be described below, this allows each of execution units 136C–D to perform vector operations (the ability the concurrently perform the same arithmetic/logical operations on more than one set of operands). This configuration also allows a number of other operations to be efficiently implemented by pipelines 220 at a small additional hardware cost. These instructions are particularly useful for the types of operations typically performed by units 136C–D.

Turning now to FIG. 36, a block diagram of one embodiment of execution unit 136C/D is depicted. As shown, execution unit 136C/D is coupled to receive operands 204A–D and an instruction indication 3002, and includes input unit 3010 and add/subtract pipelines 220A–B. Each of pipelines 220 includes a far and close data path which is configured to operate as described above. The outputs of each pipeline 220 is selected by one of result multiplexers 250. The outputs of multiplexers 250 are conveyed as result values 3008A–B for storage in output register 3006.

Instruction indication 3002 specifies which operation is performed concurrently in each pipeline 220. For example, if indication 3002 specifies an add operation, both pipelines 220 concurrently execute an add operation on operands 204. Pipeline 220A may add operands 204A and 204C, for instance, while pipeline 220B adds operands 204B and 204D. This operation is described in greater detail below. In one embodiment, indication 3002 may specify any of the instructions described below with reference to FIGS. 37–49. Additional operand instruction information specifies the input values by referencing one or more storage locations (registers, memory, etc.).

As described above, add, subtract, float-to-integer, and integer-to-float conversion instruction may be performed in add/subtract pipeline 220 using far data path 230 and close data path 240. Vectored versions of these instructions for one embodiment of pipeline 220 are described below with reference to FIGS. 37–42. The configuration of FIG. 36 with a plurality of pipelines 220 may additionally be expanded to handle a number of other vectored instructions such as reverse subtract, accumulate, compares, and extreme value instructions. Specific embodiments of such instructions are described with reference to FIGS. 43–49. (Other embodiments of these instructions are also possible).

Turning now to FIG. 37A, the format of a vectored floating point add instruction ("PFADD") 3100 is shown according to one embodiment of microprocessor 100. As depicted, PFADD instruction 3100 includes an opcode value 3101 and two operand fields, first operand field 3102A and second operand field 3102B. The value specified by first operand field 3102A is shown as being "mmreg1", which, in one embodiment, maps to one of the registers on the stack of floating point execution unit 136E. In another embodiment, mmreg1 specifies a storage location within execution unit 136C or 136D or a location in main memory.

The value specified by second operand field 3102B is shown in one embodiment as either being another of the floating point stack registers or a memory location ("mmreg2/mem64"). Similarly, mmreg2 may also specify a register within execution unit 136C or 136D in another embodiment. As used in the embodiment shown in FIG. 36, operand fields 3102A–B each specify a pair of floating point values having a sign value, an exponent value, and a mantissa portion.

Turning now to FIG. 37B, pseudocode 3104 illustrating operation of PFADD instruction 3100 is given. As shown, upon execution of PFADD instruction 3100, a first vector portion (such as input value 204A in FIG. 36) of the value specified by first operand field 3102A is added to a first vector portion (e.g., 204C) of the input value specified by second operand field 3102B. As described above, this sum is computed within far path 230A of pipeline 220A. In the embodiment shown, this sum is then written back to the upper portion of operand 3102A (mmreg1[63:32]). In another embodiment of the instruction, a destination storage location may be specified which is different than either of the source operands.

PFADD instruction 3100 also specifies that a second vector portion of the input value specified by first operand field 3102A (e.g., 204B) is added to a second vector portion (e.g., 204D) of the input value specified by second operand field 3102B. This sum is computed in far data path 230B of add/subtract pipeline 220B. This sum is then written, in one embodiment, to the lower portion of the location specified by operand 3102A (mmreg1[31:0]), although an alternate destination location may be specified in another embodiment. In one embodiment, the two add operations specified by instruction 3100 are performed concurrently to improve performance.

Turning now to FIG. 38A, the format of a floating-point vectored subtract instruction ("PFSUB") 3110 is shown according to one embodiment of microprocessor 100. The format of PFSUB instruction 3110 is similar to that described above for PFADD instruction 3100. As depicted, PFSUB instruction 3110 includes an opcode value 3111 and two operands, first operand field 3112A and second operand field 3112B. The value specified by first operand field 3112A is shown as being "mmreg1", which, in one embodiment, maps to one of the registers on the stack of floating point execution unit 136E. In another embodiment, mmreg1 specifies a register or storage location within execution unit 136C/D. The value specified by second operand field 3112B is shown, in one embodiment, as either being another of the floating point stack registers or a memory location ("mmreg2/mem64"). Similarly, mmreg2 may also specify a register within execution unit 136C/D in another embodiment. As with PFADD instruction 3100, the values specified by operand fields 3112A–B for PFSUB instruction 3110 each specify a pair of floating point numbers each having a sign value, an exponent value, and a mantissa portion.

Turning now to FIG. 38B, pseudocode 3114 illustrating operation of PFSUB instruction 3110 is given. As shown, upon execution of PFSUB instruction 3110, a first vector portion (such as input value 204C shown in FIG. 36) of the input value specified by second operand field 3112B is subtracted from a first vector portion of the value (e.g., value 204A) specified by first operand field 3112A. As described above, this difference may be computed in either far path 230A or close path 240A of pipeline 220A depending on the exponent difference value between the operands. In the embodiment shown, this difference value is written back to the upper portion of the value specified by first operand field 3112A (mmreg1[63:32]), although an alternate destination may be specified in other embodiments.

PFSUB instruction 3110 also specifies that a second vector portion (such as value 204D) of the value specified by second operand field 3112B be subtracted from a second vector portion (e.g., 204B) of the input value specified by first operand field 3112A. This difference is written to the lower portion of operand 3112B (mmreg1[31:0]) in one embodiment, but may be written to another location in other embodiments. In a configuration such as that shown in FIG. 36, both difference calculations are performed concurrently in respective add/subtract pipelines 220 to improve performance.

Turning now to FIG. 39A, the format of a vectored floating point-to-integer conversion instruction ("PF2ID") 3120 is shown according to one embodiment of microprocessor 100. The format of PF2ID instruction 3120 is similar to those described above. As depicted, PF2ID instruction 3120 includes an opcode value 3121 and two operand fields, first operand field 3122A and second operand field 3122B. The value specified by first operand field 3122A is shown as being "mmreg1", which, in one embodiment, maps to one of the registers on the stack of floating point execution unit 136E. In another embodiment, mmreg1 specifies a register or storage location within one of execution units 136C–D. As will be described below, mmreg1 specifies a destination location for the result of instruction 3120. The value specified by second operand field 3122B is shown as either being another of the floating point stack registers or a memory location ("mmreg2/mem64"). (Operand field 3122B may also specify a register or storage location within one of execution units 136C–D). Operand field 3122B specifies a pair of floating point numbers having a sign value, an exponent value, and a mantissa portion. It is noted that instruction 3120 produces a pair of 32-bit signed integer values in the embodiment shown. A floating point-to-integer instruction which produces a pair of 16-bit signed integers is described below with reference to FIGS. 40A–C.

Turning now to FIG. 39B, pseudocode 3124 for PF2ID instruction 3120 is given. In the embodiment described by pseudocode 3124, PF2ID instruction 3120 operates separately on the first and second floating point numbers specified by second operand field 3122B. If the first floating point number specified by operand 3122B is outside the allowable conversion range, the corresponding output value is clamped at either the maximum or minimum value. If the first floating point input value is within the allowable input range, a float-to-integer conversion is performed in far data path 220A as described above. In one embodiment, the resulting integer is written to the upper portion of the storage location specified by operand field 3122A. This storage location may map to a floating point register within execution unit 136E, or may alternately be located within execution unit 136C/D or in main memory.

Pseudocode 3124 also specifies a similar conversion process for the second floating point input value specified by operand field 3122B. This floating point number is converted to a signed 32-bit integer and written to the upper half of the storage location specified by operand field 3122A in one embodiment. If microprocessor 100 is configured to include a plurality of add/subtract pipelines 220, the second f2i conversion may be performed in add/subtract pipeline 220B concurrently with the first conversion to improve performance.

Turning now to FIG. 39C, a table 3128 is given illustrating the integer output values resulting from various floating point input values. It is noted that the f2i conversion process truncates floating point numbers, such that the source operand is rounded toward zero in this embodiment.

Turning now to FIGS. 40A–C, the format and operation of another floating point-to-integer ("PF2IW") instruction 3130 is shown. PF2IW instruction 3130 includes an opcode 3131 and a pair of operands fields 3132A–B. FIG. 40-B gives pseudocode 3134 which describes the operation of PF2IW instruction 3130. Instruction 3130 operates in a similar fashion to instruction 3120 except that the target integers are signed 16-bit integers rather than signed 32-bit integers. The maximum and minimum values for instruction 3130 reflect this change. The f2i conversions are performed in far data paths 230A–B in the configuration of execution unit 136C/D shown in FIG. 36. Table 3138 shown in FIG. 40C illustrates the output values of instruction 3130 for various ranges of input values.

Turning now to FIG. 41A, the format of an integer-to-floating point ("PI2FD") instruction 3140 is given. Instruction 3140 includes an opcode value 3141 and a pair of operand fields 3142A–B. In the embodiment shown, instruction 3140 is usable to convert a pair of signed 32-bit integers (specified by operand field 3142B) to a pair of corresponding floating point numbers (specified by operand field 3142A). In other embodiments, instruction 3140 may be used to convert floating point numbers of other sizes.

Turning now to FIG. 41B, pseudocode 3144 illustrating operation of instruction 3140 is given. As shown, instruction 3140 performs integer-to-float conversions on each of the values specified by operand field 3142B. Using the execution unit 136C/D shown in FIG. 36, each of the conversions may be performed concurrently within close data paths 240A–B of add/subtract pipelines 220A–B.

Turning now to FIGS. 42A–B, the format and operation of another integer-to-floating point ("PI2FW") instruction 3150 is shown. As depicted, instruction 3150 includes an opcode value 3151, and a pair of operand fields 3152A–B. In the embodiment shown, the source values are a pair of floating point numbers specified by operand field 3152B. Pseudocode 3154 given in FIG. 42B illustrates the operation of instruction 3150. Instruction 3150 operates similarly to PI2FD instruction 3140 described above with reference to FIGS. 41A–B, but instruction 3150 converts a pair of 16-bit signed integers to corresponding floating point values. In one embodiment, these floating point output values are written to respective portions of the storage location specified by operand field 3152A.

Execution unit 136C/D shown in FIG. 36 is configured to handle vectored add, subtract, f2i, and i2f instructions as described above. As will be shown below, pipelines 220A–B may be enhanced to handle additional vectored instructions as well. These instructions include, but are not limited to, additional arithmetic instructions, comparison instructions, and extreme value (min/max) instructions. These instructions may be realized within pipelines 220 with relatively little additional hardware, yielding an efficient implementation. Specific embodiments of such instructions are described below with reference to FIGS. 43–49, although other instruction formats are possible in other embodiments.

Turning now to FIG. 43A, the format of a floating point accumulate instruction ("PFACC") 3160 is shown according to one embodiment of the invention. As depicted, PFACC instruction 3160 includes an opcode value 3161 and two operand fields, first operand field 3162A and first operand field 3162B. First operand field 3162A ("mmreg1") specifies a first pair of floating point input values in one embodiment. Operand field 3162A may specify a location which maps to one of the registers on the stack of floating point execution unit 136E. In another embodiment, operand field 3162A specifies a register or storage location within execution unit 136C/D. Second operand field 3162B ("mmreg2") specifies a second pair of floating point input values. These input values may be located on the floating point stack of unit 136E or within a storage location in execution unit 136C/D.

Turning now to FIG. 43B, pseudocode 3164 illustrating operation of instruction 3160 is shown. Accumulate instruction 3160 is slightly different than other floating point vector operations described above (such as PFADD instruction 3100 and PFSUB lo instruction 3110). In the embodiments described above, instructions 3100 and 3110 operate on corresponding parts of two different register values to produce an output value. For example, PFADD instruction 3100 forms a first portion of a vector output value by adding a first vector portion of a first input register to a first vector portion of a second input register. In contrast, PFACC instruction 3160 adds the component values of each floating point input register separately. As shown in FIG. 43B, the first portion of the vector output value produced by instruction 3160 is equal to the sum of the pair of floating point input values within the storage location specified by first operand field 3162A. This addition operation is performed within far data path 230A of add/subtract pipeline 220A. The second portion of the vector output value for instruction 3160 is produced similarly within far data path 230B of add/subtract pipeline 220B.

Because PFACC instruction 3160 operates on vectored components of a single input storage location, this instruction is particularly advantageous in matrix multiply operations. Matrix multiply operations may be effectuated by performing vector multiply operations, then summing the resulting values to obtain a sum of products. It is noted that PFACC instruction 3160 provides an advantageous means for summing the result of these vector multiply operations, particularly if these results reside in a single vector register. Because matrix multiply operations are quite prevalent in 3-D graphics operations, the use of instruction 3160 may significantly increase the graphics processing capabilities (particularly with regard to front-end geometry processing) of a system which includes microprocessor 100.

Turning now to FIG. 44A, the format of a floating-point vectored reverse subtract instruction ("PFSUBR") 3170 is shown according to one embodiment of microprocessor 100. The format of PFSUBR instruction 3170 is similar to that described above for PFSUB instruction 3110. As depicted, PFSUBR instruction 3110 includes an opcode value 3171 and two operands, first operand field 3172A and second operand field 3172B. In a similar fashion to operands for instructions described above, the floating point input values specified by operand fields 3172A–B may map to the stack of floating point unit 136E in one embodiment. These values may additionally be located within a register or storage location within execution unit 136C/D.

It is noted that in the embodiment shown, the only difference between PFSUIBR instruction 3170 and PFSUB instruction 3110 is the "direction" of the subtraction. In PFSUB instruction 3110, portions of the values specified by operand field 3112B are subtracted from corresponding portions of the values specified by operand field 3112A. Conversely, in PFSUBR instruction 3170, portions of the values specified by operand field 3172A are subtracted from the corresponding portions of the values specified by operand field 3172B.

Turning now to FIG. 44B, pseudocode 3174 illustrating operation of PFSUBR instruction 3170 is given. As shown, upon execution of PFSUBR instruction 3170, a first vector portion (such as input value 204A) of the value specified by first operand field 3172A is subtracted from a first vector portion (e.g., 204C) of the value specified by second operand field 3172B. This subtraction operation may either be performed within far data path 230A or close data path 240A depending upon the exponent difference value of the operands. In the embodiment shown, this difference value is written back to the upper portion of operand 3172A (mmreg1[63:32]). In other embodiments, the difference value may be written back to a different destination storage location. Concurrently, a second vector portion of the value specified by first operand field 302A is subtracted from a second vector portion of the value specified by second operand field 302B. This difference is written, in one embodiment, to the lower portion of the location specified by operand 302A (mmreg1[31:0]). In the configuration of execution unit 136C/D shown in FIG. 36, this second reverse subtract operation is performed either in far data path 230B or close data path 230B of add/subtract pipeline 220B.

The vectored floating point instructions described above are particularly useful in the geometry processing stages of a 3-D graphics pipeline. Another class of functions commonly utilized in graphics processing are extreme value functions. As used herein, "extreme value functions" are those functions which return as a result either a maximum or minimum value selected among a plurality of values. In typical multimedia systems, a minimum value or a maximum value is obtained through the execution of several sequentially executed instructions. For example, a compare instruction may first be executed to determine the relative magnitudes of a pair of operand values, and subsequently a conditional branch instruction may be executed to determine whether a move operation must be performed to move the extreme value to a destination register or other storage location. These sequences of commands commonly occur in multimedia applications, such as in clipping algorithms for graphics rendering systems. Since extreme value functions are implemented through the execution of multiple instructions, however, a relatively large amount of processing time may be consumed by such operations. Graphics processing efficiency may be advantageously increased by dedicated extreme value instructions as described below with reference to FIGS. 45–46.

Turning now to FIG. 45A, the format of a floating point maximum value instruction ("PFMAX") 3180 is shown according to one embodiment of the invention. As depicted, PFMAX instruction 3180 includes an opcode value 3181 and two operands, first operand field 3182A and first operand field 3182B. The value specified by first operand field 3182A is shown as being "mmreg1", which, in one embodiment, is one of the registers on the stack of floating point execution unit 136E. As with operands described above for other instructions, the storage locations specified by operand field 3182A may be located in alternate locations such as execution unit 136C/D. Similarly, the values specified by second operand field 3182B, mmreg2, may also specify the floating point stack registers, a memory location, or a register within unit 136C/D. In another embodiment, second operand field 3182B specifies an immediate value.

Turning now to FIG. 45B, pseudocode illustrating operation of PFMAX instruction 3180 is given. As shown, upon execution of PFMAX instruction 3180, a comparison of a first vector portion (such as value 204A) of the value specified by first operand field 3182A and a first vector portion of the value specified by second operand 3182B (e.g., 204C) is performed. Concurrently, a comparison of a second vector portion (such as value 204B) of the value specified by first operand field 3182A and a second vector portion of the value specified by second operand field 3182B (e.g., 204D) is also performed.

If the first vector portion of the value specified by first operand field 3182A is found to be greater than the first vector portion of the value specified by second operand field 3182B, the value of the first vector portion of the value specified by first operand field 3182A is conveyed as a first portion of a result of instruction 3180. Otherwise, the value of the first vector portion of value specified by second operand field 3182B is conveyed as the first vector portion of the result of instruction 3180. The second vector portion of the result of the PFMAX instruction is calculated in a similar fashion using the second vector portions of the values specified by operands fields 3182A–B.

Turning now to FIG. 45C, a table 3188 is shown which depicts the output of instruction 3180 for various inputs. Table 3188 includes cases in which operands 3182 are set to zero or in unsupported formats.

Turning now to FIGS. 46A–C, the format and operation of a vectored floating point ("PFMIN") instruction 3190 is shown. As depicted, instruction 3190 includes an opcode value 3191, and a pair of operands fields 3192A–B. Operation of PFMIN instruction 3190 is similar to that of PFMAX instruction 3180, although instruction 3190 performs a minimum value function instead of a maximum value function. The operation of instruction 3190 is given by pseudocode 3194 in FIG. 45B. FIG. 45C includes a table 3198 which illustrates outputs of PFMIN instruction 3190 for various input values, including zero values and unsupported formats.

As described above, vectored extreme value functions such as PFMAX instruction 3180 and PFMIN instruction 3190 are particularly useful for performing certain graphics processing functions such as clipping. Because the operands in extreme value functions are compared in order to produce a result value, vectored comparison instructions may also be realized within an execution unit 136C/D which is configured to perform extreme value instructions 3180 and 3190. Three such comparison instructions are described below with reference to FIGS. 47–49.

Turning now to FIG. 47A, the format of a floating point equality compare instruction ("PFCMPEQ") 3200 is shown according to one embodiment of microprocessor 100. As depicted, PFCMPEQ instruction 3200 includes an opcode value 3201 and two operands, first operand field 3202A and first operand field 3202B. The value specified by first operand field 3202A is shown as being "mmreg1", which, in one embodiment, is one of the registers on the stack of floating point execution unit 136E. First operand field 3202A may also specify a register or storage location within execution unit 136C/D. The value specified by second operand field 3202B, "mmreg2", is shown as either being another of the floating point stack registers or a memory location. In another embodiment, second operand field 3202B specifies an immediate value or a register/storage location within unit 136C/D.

Turning now to FIG. 47B, pseudocode 3204 illustrating operation of PFCMPEQ instruction 3200 is given. As shown, upon execution of PFCMPEQ instruction 3200, a comparison of a first vector portion (such as value 204A) of the value specified by first operand field 3202A and a first vector portion of the value second operand 3202B (e.g., 204C) is performed. Concurrently, a comparison of a second vector portion (e.g., 204B) of the value specified by first operand field 3202A and a second vector portion of the value specified by second operand field 3202B (204D) is also performed.

If the first vector portion of the value specified by first operand field 3202A is found to be equal to the first vector portion of the value specified by second operand field 3202B, a first mask constant is conveyed as a first portion of a result of instruction 3200. In the embodiment shown, this first mask constant is all 1's (FFFF_FFFFh), but may be different in other embodiments. Otherwise, a second mask constant (0000_0000h in one embodiment) is conveyed as the first vector portion of the result of instruction 3200. Similarly, if the second vector portion of the value specified by first operand field 3202A is found to be equal to the second vector portion of the value specified by second operand field 302B, the first mask constant is conveyed as a second portion of a result of instruction 3200. Otherwise, the second vector portion of the result of instruction 3200 is conveyed as the second mask constant. FIG. 47C is a table which shows the output of instruction 3200 given various inputs, including cases in which operands 3202 are zero or in unsupported formats.

The result (both the first and second vector portions) of instruction 3200 is subsequently written to the storage location specified by operand field 3202A. In another embodiment of instruction 3200, the result value may be stored to mmreg2, a memory location, or a third register specified by an additional operand. It is noted that in other embodiments of operands 3202, these values may include additional vector values beyond the two vector values shown in FIG. 47A.

Turning now to FIGS. 48A–C, the format and operation of a vectored floating point greater than compare operation ("PFCMPGT") instruction 3210 is shown. As depicted, instruction 3210 includes an opcode value 3211, and a pair of operand fields 3212A–B. Instruction 3210 is performed in a similar fashion to instruction 3200, although a greater than comparison test is performed instead of an equality test. The operation of PFCMPGT instruction 3210 is given by pseudocode listing 3214 in FIG. 48B. FIG. 48C includes a table 3218 which gives outputs for various input values of instruction 3210.

Turning now to FIGS. 49A–C, the format and operation of a vectored floating point greater than or equal compare operation ("PFCMPGE") instruction 3220 is shown. As depicted, instruction 3220 includes an opcode value 3221, and a pair of operand fields 3222A–B. Instruction 3220 is performed in a similar fashion to instructions 3200 and 3210, although instruction 3220 effectuates a greater than or equal to comparison test. The operation of PFCMPGE instruction 3220 is given by pseudocode listing 3224 in FIG. 49B. FIG. 49C includes a table 3228 which gives outputs for various input values of instruction 3220.

Figure 50:
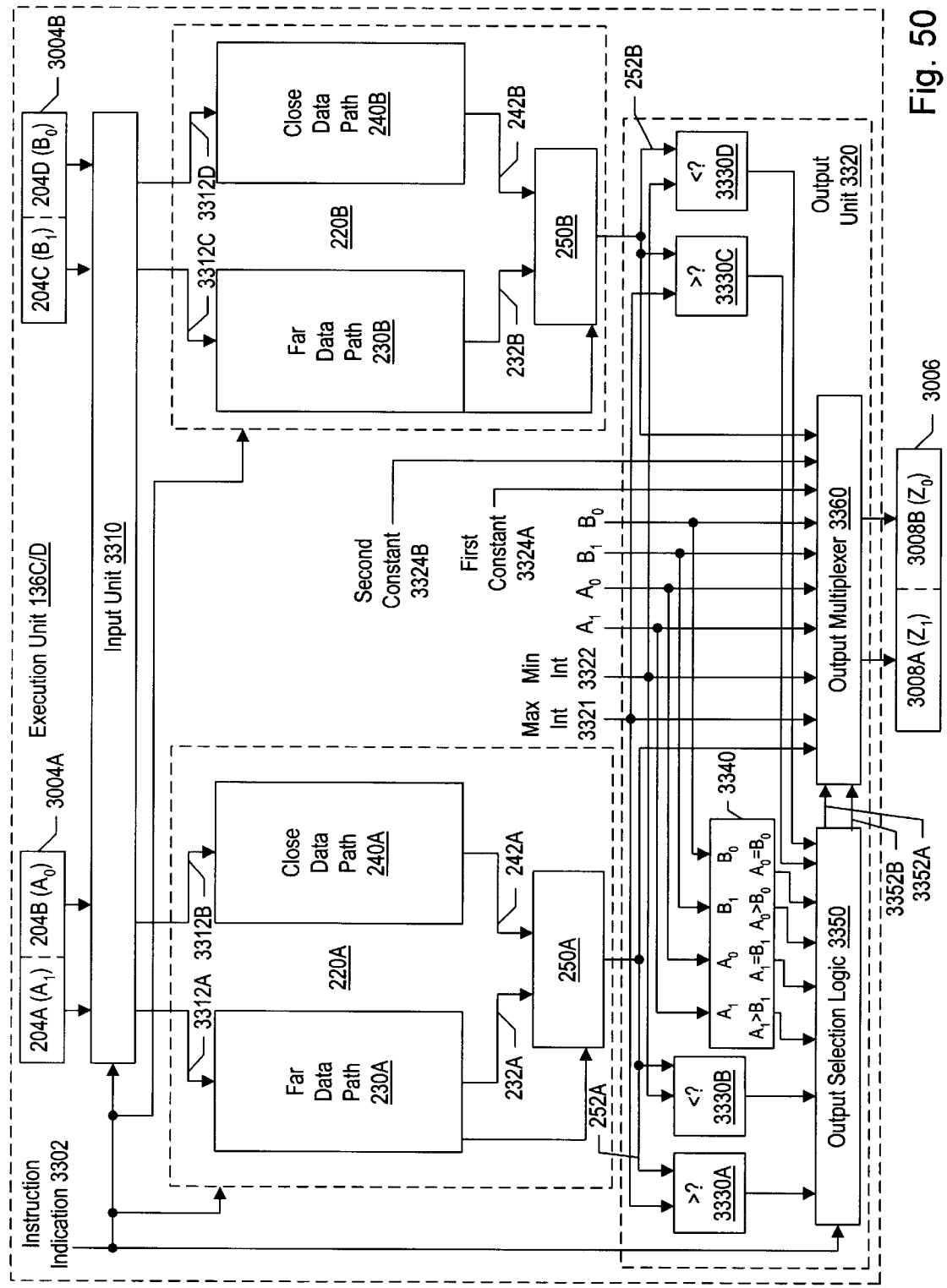
FIG. 50 is a block diagram of one embodiment of an execution unit 136C/D according to one embodiment of the invention which is configured to executed the instructions of FIGS. 37–49.

Turning now to FIG. 50, a block diagram of another embodiment of execution unit 136C/D is shown. Like the embodiment shown in FIG. 36, execution unit 136C/D includes a pair of add/subtract pipelines 220A–B with respective far and close data paths for performing add, subtract, f2i, and i2f instructions as described above. The embodiment of execution unit 136C/D shown in FIG. 50, however, additionally includes an input unit 3310 and an output unit 3320 which allow implementation of a number of other instructions, particularly those described above with reference to FIGS. 37–49.

As depicted, execution unit 136C/D is coupled to receive inputs into a pair of input registers 3304A–B. In one embodiment, each register 3304 is configured to store a first vector value and a second vector value. For example, input register 3304A is configured to store first vector portion 204A and second vector portion 204B. Similarly, input register 3304B is configured to store first vector portion 204C and second vector portion 204D. As described above, these registers may include either integer or floating point values depending upon the type of operation being performed.

The type of operation to be performed by execution unit 136C/D is conveyed by instruction indication 3302. Instruction indication 3302 may specify any number of operations, including those described above (add/subtract, accumulate, f2i, i2f, extreme value, compare). For the embodiment of execution unit 136C/D shown in FIG. 50, all of the instructions described above are performed. In alternate embodiments, a unit 136C/D may only execute a subset of these instructions. In still other embodiments, execution unit 136C/D may also execute additional instructions to those described above (a vectored floating point instruction which performs a less than comparison test, for example).

In response to receiving instruction indication 3302, input unit 3310 is configured to route the appropriate combination of operand values 204 to add/subtract pipelines 220A–B via operand buses 3012A–D. Each data path within each of pipelines 220A–B receives an "A" operand value and a "B" operand value, even if one or more of these values is not utilized within a particular data path. For example, an f2i instruction is performed in the far data path 230A of pipeline 220A in one embodiment. Accordingly, the values conveyed to close data path 230B in pipeline 220A are not utilized for that particular instruction. Furthermore, different portions of the A and B operands may be conveyed to data paths 230 and 240. As described above, in one embodiment, far data paths 230A–B receive full exponent values, while close data paths 240A–B receive only the two least significant bits of each exponent for performing leading 0/1 prediction.

With appropriate routing by input unit 3310, a number of similar arithmetic instructions may be performed within execution unit 136C/D with minimal additional overhead. Table 2 given below shows the routing of operands for various values of instruction indication 3302. It is noted that instruction indication 3302 may indicate an effective operation (e.g., effective addition or subtraction) rather than an explicit operation denoted by an opcode.

TABLE 2

|  | Add/Subtract Pipeline 220A | | Add/Subtract Pipeline 220B | |
| --- | --- | --- | --- | --- |
|  | Op A | Op B | Op A | Op B |
| PFADD | $A_1$ | $B_1$ | $A_0$ | $B_0$ |
| PFSUB | $A_1$ | $B_1$ | $A_0$ | $B_0$ |
| PFSUBR | $A_0$ | $B_0$ | $A_1$ | $B_1$ |
| PFACC | $A_1$ | $A_0$ | $B_1$ | $B_0$ |
| PF2ID,PF2IW | — | $B_1$ | — | $B_0$ |
| PI2FD, PI2FW | — | $B_1$ | — | $B_0$ |

With operands 204 appropriately routed to pipelines 220, far data paths 230A–B and close data paths 240A–B operate substantially as described above. Far data paths 230A–B perform effective addition, as well as effective subtraction for operands with $E_{diff}>1$. Conversely, close data paths 240A–B perform effective subtraction on operands with $E_{diff} \leq 1$. Each pipeline 220 selects its corresponding far path result 232 or close path result 242 to be conveyed as result value 252. Pipeline 220A generates result value 252A, while pipeline 220B generates result value 252B. Result values 252A–B are conveyed to output unit 3320 and utilized as described below to generate output values 3008A–B.

In addition to receiving result values 252A–B, output unit 3320 is coupled to receive a maximum integer value 3321, a minimum integer value 3322, first and second mask constants 3324A–B, and operands 204A–D ($A_1$, $A_0$, $B_1$, and $B_0$). Output unit 3320 includes clamping comparators 3030A–D, extreme value comparator 3340, output selection logic 3350, and output multiplexer 3360. Output multiplexer 3360 is configured to convey output values 3008A–B to output register 3006.

The values conveyed to the input of output multiplexer 3360 represent the possible outputs for all of the instructions described above with reference to FIGS. 37–49. Result values 252A–B convey output values for add, subtract, f2i, i2f, and accumulate instructions. Maximum integer value 3321 and minimum integer value 3322 are used for clamping f2i instruction results if needed. Operand values 204A–D are used to generate the output of the extreme value (min/max) instructions. First and second mask constants 3324A–B are used as outputs of the comparison instructions such as the equality compare, greater than compare, and greater than or equal to compare instructions described above.

With the outputs for each of the instructions described above conveyed to output multiplexer 3360, output selection logic 3350 may be used to select the appropriate multiplexer 3360 inputs to be conveyed as output values 3308A–B. It is noted that because of the vector nature of the input and output registers of execution unit 136C/D, output multiplexer 3360 accordingly selects a pair of output values. Accordingly, multiplexer 3360 is shown in FIG. 50 as having sub-portion 3360A (configured to convey output 3308A) and sub-portion 3360B (configured to convey output 3308B). Output selection logic 3350 generates a pair of corresponding select signals, 3352A–B, to control each of these multiplexer sub-portions.

Output selection logic receives instruction indication 3302, the outputs of clamping comparators 3030A–D, and the output of extreme value comparator 3340. If instruction indication 3302 specifies that an arithmetic instruction is being performed, result values 252A–B are conveyed as output values 3008A–B to output register 3006.

If a floating point-to-integer instruction is specified by indication 3302, result values 252A and 252B (calculated in far data paths 230A–B, respectively) are conveyed as output values 3008A–B unless one or both values exceed maximum integer value 3321 or minimum integer value 3322. Overflow and underflow conditions are detected by clamping comparators 3330A–D and conveyed to output selection logic 3350. In one embodiment, the maximum and minimum integer values are conveyed as output values 3008 in place of the values which caused the overflow/underflow condition. The f2i instruction specified by indication 3302 may generate integers of a variety of sizes as described above.

If an integer-to-floating point instruction is specified by instruction indication 3302, result values 252A and 252B (calculated in close data paths 240A–B, respectively) are conveyed as output values 3008A–B. It is noted that in the embodiment shown, the dynamic range of the floating point format exceeds the maximum and minimum integer values, so overflow/underflow detection logic is not used for the i2f instruction. The i2f instruction may specify conversion of integers of a variety of sizes as described above.

If an extreme value instruction is indicated by instruction indication 3302, extreme value comparator 3350 generates a plurality of outputs usable to determine the maximum and minimum values from each input pair. For example, if instruction indication 3302 specifies a maximum value instruction, comparator 3350 tests whether operand 204A is greater than operand 204C. If operand 204A is greater, it is conveyed as output value 3008A. Otherwise, operand 204C is conveyed.

The outputs generated by comparator 3350 are also usable to implement the comparison instructions described above. If a comparison instruction is specified by indication 3302, comparator outputs 3350 determine whether first or second mask constant 3324 is conveyed for each output value 3008. It is noted that different mask constants may be generated for each portion of output register 3006 depending upon the particular input values in question.

The embodiments of execution units 136C/D shown above provide an efficient means for performing floating point arithmetic operations such as add and subtract. The improved selection logic implemented in one embodiment of close path 240 results in an add/subtract pipeline 220 with only one full add and one full shift in each of data paths 230 and 240. Still further, data paths 230 and 240 may additionally be configured to perform floating point-to-integer and integer-to-floating point conversions with little additional hardware. Such a capability is particularly important for an embodiment of execution unit 136C/D which handles both integer and floating point data (which may or may not be vectored).

By including a plurality of add/subtract pipelines in execution units 136C and D, vectored floating point instructions may be performed. This capability is advantageous in applications such as geometry processing for graphics primitives, in which identical operations are performed repetitively on large sets of data. By configuring each of units 136C–D with a pair of add/subtract pipelines 220, up to four vectored floating point operations may be performed concurrently in microprocessor 100. By proper input multiplexing of input operands, execution unit 136C/D may be expanded to handle additional arithmetic operations such as reverse subtract and accumulate functions. Finally, proper output multiplexing allows execution unit 136C/D to accommodate additional instruction such as extreme value and comparison instructions.

Figure 51:
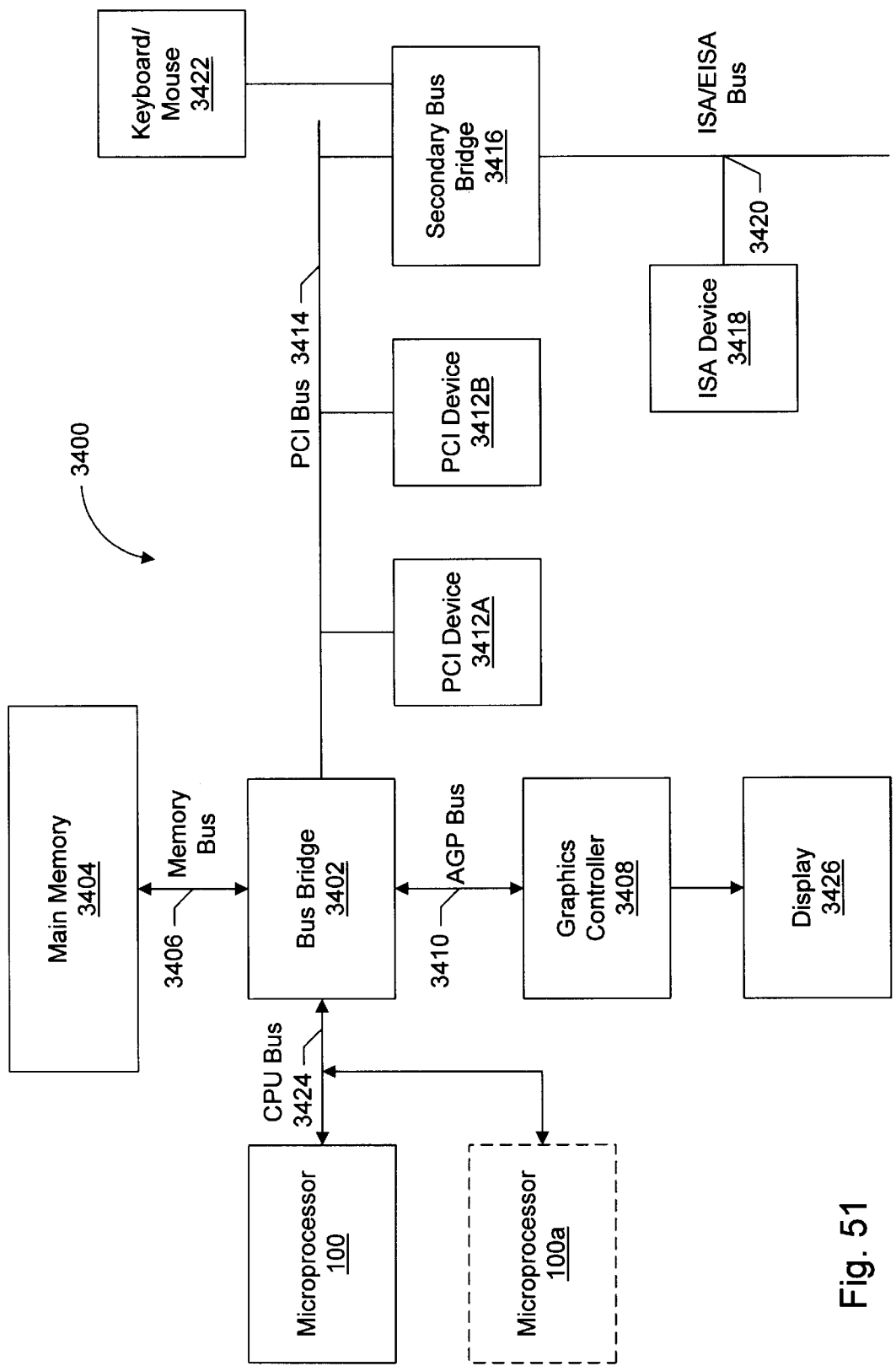
FIG. 51 is a block diagram of one embodiment of a computer system which includes microprocessor 100.

Turning now to FIG. 51, a block diagram of one embodiment of a computer system 3400 including microprocessor 100 coupled to a variety of system components through a bus bridge 3402 is shown. Other embodiments are possible and contemplated. In the depicted system, a main memory 3404 is coupled to bus bridge 3402 through a memory bus 3406, and a graphics controller 3408 is coupled to bus bridge 3402 through an AGP bus 3410. Finally, a plurality of PCI devices 3412A–3412B are coupled to bus bridge 3402 through a PCI bus 3414. A secondary bus bridge 3416 may further be provided to accommodate an electrical interface to one or more EISA or ISA devices 3418 through an EISA/ISA bus 3420. Microprocessor 100 is coupled to bus bridge 3402 through a CPU bus 3424.

Bus bridge 3402 provides an interface between microprocessor 100, main memory 3404, graphics controller 3408, and devices attached to PCI bus 3414. When an operation is received from one of the devices connected to bus bridge 3402, bus bridge 3402 identifies the target of the operation (e.g. a particular device or, in the case of PCI bus 3414, that the target is on PCI bus 3414). Bus bridge 3402 routes the operation to the targeted device. Bus bridge 3402 generally translates an operation from the protocol used by the source device or bus to the protocol used by the target device or bus.

In addition to providing an interface to an ISA/EISA bus for PCI bus 3414, secondary bus bridge 3416 may further incorporate additional functionality, as desired. For example, in one embodiment, secondary bus bridge 3416 includes a master PCI arbiter (not shown) for arbitrating ownership of PCI bus 3414. An input/output controller (not shown), either external from or integrated with secondary bus bridge 3416, may also be included within computer system 3400 to provide operational support for a keyboard and mouse 3422 and for various serial and parallel ports, as desired. An external cache unit (not shown) may further be coupled to CPU bus 3424 between microprocessor 100 and bus bridge 3402 in other embodiments. Alternatively, the external cache may be coupled to bus bridge 3402 and cache control logic for the external cache may be integrated into bus bridge 3402.

Main memory 3404 is a memory in which application programs are stored and from which microprocessor 100 primarily executes. A suitable main memory 3404 comprises DRAM (Dynamic Random Access Memory), and preferably a plurality of banks of SDRAM (Synchronous DRAM).

PCI devices 3412A–3412B are illustrative of a variety of peripheral devices such as, for example, network interface cards, video accelerators, audio cards, hard or floppy disk drives or drive controllers, SCSI (Small Computer Systems Interface) adapters and telephony cards. Similarly, ISA device 3418 is illustrative of various types of peripheral devices, such as a modem, a sound card, and a variety of data acquisition cards such as GPIB or field bus interface cards.

Graphics controller 3408 is provided to control the rendering of text and images on a display 3426. Graphics controller 3408 may embody a typical graphics accelerator generally known in the art to render three-dimensional data structures which can be effectively shifted into and from main memory 3404. Graphics controller 3408 may therefore be a master of AGP bus 3410 in that it can request and receive access to a target interface within bus bridge 3402 to thereby obtain access to main memory 3404. A dedicated graphics bus accommodates rapid retrieval of data from main memory 3404. For certain operations, graphics controller 3408 may further be configured to generate PCI protocol transactions on AGP bus 3410. The AGP interface of bus bridge 3402 may thus include functionality to support both AGP protocol transactions as well as PCI protocol target and initiator transactions. Display 3426 is any electronic display upon which an image or text can be presented. A suitable display 3426 includes a cathode ray tube ("CRT"), a liquid crystal display ("LCD"), etc.

It is noted that, while the AGP, PCI, and ISA or EISA buses have been used as examples in the above description, any bus architectures may be substituted as desired. It is further noted that computer system 3400 may be a multi-processing computer system including additional microprocessors (e.g. microprocessor 100a shown as an optional component of computer system 3400). Microprocessor 100a may be similar to microprocessor 100. More particularly, microprocessor 100a may be an identical copy of microprocessor 100. Microprocessor 100a may share CPU bus 3424 with microprocessor 100 (as shown in FIG. 51) or may be connected to bus bridge 3402 via an independent bus.

Numerous variations and modifications will become apparent to those skilled in the art once the above disclosure is fully appreciated. It is intended that the following claims be interpreted to embrace all such variations and modifications.

What is claimed is:

1. A microprocessor, comprising:
a leading one prediction unit configured to predict a position of a leading one value within a result mantissa value corresponding to a first floating point subtraction operation performed upon a first floating point number and a second floating point number, wherein said leading one prediction unit is coupled to receive a first operand corresponding to said first floating point number and a second operand corresponding to said second floating point number, wherein said leading one prediction unit is configured to generate a prediction string including a prediction value for each bit position within said result mantissa value, wherein each prediction value within said prediction string is generated by utilizing values from a second bit position within said first operand and from a first bit position within said second operand, wherein an indication of said position of said leading one value within said result mantissa value is given by a bit position of a most significant asserted prediction value within said prediction string;
wherein said prediction string is generated according to a prediction that said first floating point number includes a first exponent value that is one greater than a second exponent value included in said second floating point number.

2. The microprocessor of claim 1, wherein said first operand is a mantissa value of said first floating point number, wherein a most significant bit of said first operand is set.

3. The microprocessor of claim 2, wherein said second operand corresponds to a mantissa value of said second floating point number which has been right shifted by one bit and negated.

4. The microprocessor of claim 3, wherein a most significant bit of said second operand is set.

5. The microprocessor of claim 4, wherein said next most significant bit of said operand is not set.

6. The microprocessor of claim 4, wherein said prediction string has a first bit position including a first prediction value.

7. The microprocessor of claim 6, wherein said first operand and said second operand also include said second bit position and said first bit position respectively, wherein said second bit position within said first operand is one bit position less than a first bit position within said first operand, wherein said second bit position within said first operand and said first bit position within said second operand have a same relative position as said first bit position within said prediction string.

8. The microprocessor of claim 6, wherein said first prediction value is generated using only values from said second bit position of said first operand and said first bit position of said second operand.

9. The microprocessor of claim 8, wherein said first prediction value is asserted if either said second bit position of said first operand or said first bit position of said second operand is set.

10. The microprocessor of claim 1, wherein said prediction string includes a first prediction value corresponding to a most significant bit position of said prediction string, wherein said first prediction value is generated using only values from a second most significant bit position of said first operand and from a most significant bit position of said second operand.

11. The microprocessor of claim 10, wherein said first prediction value is asserted if either a second most significant bit is set within said first operand or a first most significant bit is set within said second operand.

12. The microprocessor of claim 1, wherein a least significant bit of said prediction string is hardwired to be asserted.

13. The microprocessor of claim 1, further comprising a first input register coupled to receive said first operand, wherein said first operand is equivalent to a first floating point mantissa value included in said first floating point number, wherein said first floating point mantissa value is normalized.

14. The microprocessor of claim 13, further comprising a second input register coupled to receive said a negated version of a second floating point mantissa value included in said second floating point number, wherein said second operand corresponds to a one-bit right-shifted version of said negated version of said second floating point mantissa value.

15. The microprocessor of claim 14, further comprising a prediction string output register configured to store prediction values for each bit position within said prediction string.

16. The microprocessor of claim 15, further comprising a prediction value generation unit coupled to said first input register, said second input register, and said prediction string output register, wherein said prediction value generation unit is configured to generate a prediction value for each bit position within said prediction string.

17. The microprocessor of claim 16, wherein said prediction value generation unit includes a plurality of logic gates, wherein an output of each of said plurality of logic gates corresponds to a prediction value within said prediction string.

18. The microprocessor of claim 17, wherein said plurality of logic gates includes a first logic gate corresponding to a first prediction value in a most significant bit position of said prediction string, wherein said first logic gate is coupled to receive as inputs a second most significant bit of said first input register and a most significant bit of said second input register.

19. The microprocessor of claim 18, wherein said first logic gate is an OR gate.

20. An execution unit within a microprocessor, wherein said execution unit comprises:
an add/subtract pipeline, including:
a close data path configured to perform effective subtraction upon operands having an absolute exponent difference less than or equal to one, wherein said close data path includes:
an arithmetic unit configured to generate a result mantissa value produced from a first floating point subtraction operation performed on a first floating point number and a second floating point number;
a shift prediction unit configured to generate a predicted shift amount for normalizing said result mantissa value, wherein said shift prediction unit includes:
a first leading one prediction unit configured to predict a position of a leading one value within said result mantissa value, wherein said first leading one prediction unit is coupled to receive a first operand corresponding to said first floating point number and a second operand corresponding to said second floating point number, wherein said first leading one prediction unit is configured to generate a first prediction string including a prediction value for each bit position within said result mantissa value, wherein each prediction value within said first prediction string is generated by utilizing values from a second bit position within said first operand and from a first bit position within said second operand, wherein said position of said leading one value within said result mantissa value is indicated by a bit position of a most significant asserted prediction value within said first prediction string;

wherein said first prediction string is generated according to a prediction that a first floating point exponent value included in said first floating point number is one greater than a second floating point exponent value included in said second floating point number.

21. The microprocessor of claim 20, wherein said first operand is a first floating point mantissa value included in said first floating point number, wherein a most significant bit of said first operand is set.

22. The microprocessor of claim 21, wherein said second operand corresponds to a version of a second floating point mantissa value which has been right-shifted by one bit and negated, wherein said second floating point mantissa value is included in said second floating point number.

23. The microprocessor of claim 22, wherein a most significant bit of said second operand is set.

24. The microprocessor of claim 23, wherein said first prediction string has a first bit position including a first prediction value.

25. The microprocessor of claim 24, wherein said first operand and said second operand also include said second bit position and said first bit position respectively, wherein said second bit position within said first operand is one bit position less than a first bit position within said first operand, wherein said second bit position within said first operand and said first bit position within said second operand have a same relative position as said first bit position within said first prediction string.

26. The microprocessor of claim 25, wherein said first prediction value is generated using only values from said second bit position of said first operand and said first bit position of said second operand.

27. The microprocessor of claim 26, wherein said first prediction value is asserted if either said second bit position of said first operand or said first bit position of said second operand is set.

28. The microprocessor of claim 20, wherein said shift prediction unit further includes a second leading one prediction unit configured to predict said position of said leading one value within said result mantissa value, wherein said first leading one prediction unit is coupled to receive a third operand corresponding to said first floating point number and a fourth operand corresponding to said second floating point number, wherein said second leading one prediction unit is configured to generate a second prediction string including a prediction value for each bit position within said result mantissa value, wherein each prediction value within said second prediction string is generated by utilizing values from a second bit position within said third operand and from a first bit position within said fourth operand, wherein said position of said leading one value within said result mantissa value is predicted by a bit position of a most significant asserted prediction value within said second prediction string;

wherein said second leading one prediction unit is configured to generate said second prediction string according to a prediction that a first floating point exponent value included in said first floating point number is one less than a second floating point exponent value included in said second floating point number.

29. The microprocessor of claim 28, wherein said third operand corresponds to a version of said first floating point mantissa value which has been right-shifted by one bit and negated, wherein a most significant bit of said third operand is set.

30. The microprocessor of claim 29, wherein said fourth operand is a mantissa value of said second floating number.

31. The microprocessor of claim 30, wherein said shift prediction unit still further includes a leading zero/one prediction unit configured to determine a leading 0/1 position within said result mantissa value according to a prediction that a first floating point exponent value included in said first floating point number is equal to a second floating point exponent value included in said second floating point number.

32. A method for detecting a position of a leading one value in a result mantissa value corresponding to a first floating point subtract operation performed upon a first floating point number and a second floating point number, said method comprising:

receiving a first operand corresponding to said first floating point number;

receiving a second operand corresponding to said second floating point number;

forming a prediction string by generating a prediction value for each bit position within said result mantissa value, wherein each prediction value within said prediction string is generated using values of a second bit position within said first operand and of a first bit position within said second operand;

determining a position of said leading one value within said result mantissa value by locating a most significant asserted bit position within said prediction string;

wherein said prediction string is generated according to a prediction that a first floating point exponent value included in said first floating point number is one greater than a second floating point exponent value included in said second floating point number.

33. The method of claim 32, wherein said first operand is a mantissa value of said first floating point number, wherein a most significant bit of said first operand is set.

34. The method of claim 33, wherein said second operand corresponds to a mantissa value of said second floating point number which has been right shifted by one bit and negated.

35. The method of claim 34, wherein said most significant bit of said second operand is set.

36. The method of claim 35, wherein said prediction string has a first bit position including a first prediction value.

37. The method of claim 36, wherein said first operand and said second operand also include said second bit position and said first bit position having a same relative position as said first bit position within said prediction string, wherein said second bit position within said first operand is one bit position less significant than a first bit position within said first operand.

38. The method of claim 37, wherein said first prediction value is generated using only values from said second bit position of said first operand and said first bit position of said second operand.

39. The method of claim 38, wherein said first prediction value is asserted if either said second bit position of said first operand or said first bit position of said second operand is set.

40. A microprocessor, comprising:

a cache configured to store instructions; and a floating point addition/subtraction execution unit configured to add or subtract two floating point operands to generate floating point results, wherein said execution unit comprises:

a leading one prediction unit configured to predict positions of leading one values for mantissa portions of said results, wherein said leading one prediction unit is configured to generate a prediction string comprising at least one prediction value for each bit position within said mantissa portions, wherein each prediction value is generated by said prediction unit as a function of selected bit positions within said two floating point operands, wherein said bit positions comprise a second most significant bit position within the mantissa portion of the first of said two floating point operands and a first bit position within the mantissa portion of the second of said two floating point operands.

41. The microprocessor of claim 40, wherein said prediction string is generated assuming that said first floating point operand exponent portion is exactly one greater than said second floating point operand exponent portion.

* * * * *